(12) United States Patent  
Motoike et al.

(10) Patent No.: US 8,257,904 B2  
(45) Date of Patent: Sep. 4, 2012

(54) RESIST COMPOSITION AND METHOD OF FORMING RESIST PATTERN

(75) Inventors: Naoto Motoike, Kawasaki (JP); Yasuhiko Kakinoya, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 287 days.

(21) Appl. No.: 12/615,924

(22) Filed: Nov. 10, 2009

(65) Prior Publication Data

US 2010/0136480 A1 Jun. 3, 2010

(30) Foreign Application Priority Data

Nov. 12, 2008 (JP) .............................. P2008-289603
Apr. 10, 2009 (JP) .............................. P2009-096378
Oct. 28, 2009 (JP) .............................. P2009-248211

(51) Int. Cl.
*G03F 7/039* (2006.01)
*G03F 7/038* (2006.01)
*G03F 7/20* (2006.01)
*G03F 7/30* (2006.01)

(52) U.S. Cl. .................... 430/270.1; 430/311; 430/326; 430/910

(58) Field of Classification Search .................... None
See application file for complete search history.

(56) References Cited

U.S. PATENT DOCUMENTS

| | | | |
|---|---|---|---|
| 4,458,001 A | 7/1984 | Taylor | |
| 5,945,517 A | 8/1999 | Nitta et al. | |
| 6,153,733 A | 11/2000 | Yukawa et al. | |
| 7,074,543 B2 | 7/2006 | Iwai et al. | |
| 7,078,562 B2 | 7/2006 | Furukawa et al. | |
| 2002/0012874 A1 | 1/2002 | Namba | |
| 2003/0031950 A1 | 2/2003 | Uenishi et al. | |
| 2003/0203309 A1 | 10/2003 | Nishimura et al. | |
| 2007/0149702 A1 | 6/2007 | Ando et al. | |
| 2009/0226842 A1* | 9/2009 | Shimizu et al. ............ 430/281.1 | |
| 2010/0062364 A1 | 3/2010 | Dazai et al. | |
| 2010/0086873 A1 | 4/2010 | Seshimo et al. | |
| 2010/0178609 A1 | 7/2010 | Dazai et al. | |
| 2010/0183981 A1 | 7/2010 | Matsumiya et al. | |
| 2010/0196821 A1 | 8/2010 | Dazai et al. | |
| 2010/0209848 A1 | 8/2010 | Dazai et al. | |
| 2010/0233623 A1 | 9/2010 | Kurosawa et al. | |
| 2010/0233624 A1 | 9/2010 | Kakinoya et al. | |
| 2010/0233625 A1 | 9/2010 | Hirano et al. | |
| 2010/0233626 A1 | 9/2010 | Shimizu et al. | |
| 2010/0323296 A1 | 12/2010 | Ichikawa et al. | |
| 2011/0236824 A1 | 9/2011 | Hirano et al. | |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | A-2003-337419 | 11/2003 |
| JP | 2005-037888 | 2/2005 |
| JP | A-2006-016379 | 1/2006 |
| JP | A-2007-031355 | 2/2007 |
| KR | 10-2002-0077275 A | 10/2002 |
| KR | 10-2007-0069068 A | 7/2007 |
| WO | WO 2004/074242 | 9/2004 |

OTHER PUBLICATIONS

Office Action in U.S. Appl. No. 12/461,687 mailed Sep. 12, 2011.
Office Action in U.S. Appl. No. 12/461,688 mailed Sep. 12, 2011.
Notice of Allowance issued in U.S. Appl. No. 12/461,687 on Jan. 25, 2012.
Notice of Allowance issued in U.S. Appl. No. 12/461,688 on Jan. 25, 2012.
Office Action issued in U.S. Appl. No. 12/717,870 on Sep. 14, 2011.
Office Action issued in U.S. Appl. No. 12/717,870 on Jan. 26, 2012.

* cited by examiner

*Primary Examiner* — Sin J. Lee
(74) *Attorney, Agent, or Firm* — Knobbe Martens Olson & Bear LLP

(57) ABSTRACT

A resist composition including: a base component (A) which exhibits changed solubility in an alkali developing solution under action of an acid; an acid generator component (B) which generates an acid upon exposure; and an organic solvent (S), wherein the base component (A) includes a polymeric compound (A1) which contains a structural unit (a0) represented by the general formula (a0-1) shown below:

[Chemical Formula 1]

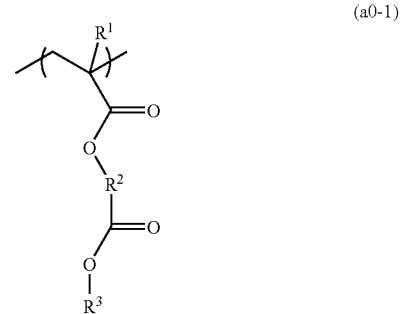

(a0-1)

(in the formula, $R^1$ represents a hydrogen atom, a lower alkyl group, or a halogenated lower alkyl group; $R^2$ represents a bivalent linking group; and $R^3$ represents a cyclic group which has $—SO_2—$ within the ring skeleton), and the organic solvent (S) includes a cyclic ketone having a 5 to 7-membered ring or an ether represented by the general formula (S-1) shown below:

[Chemical Formula 2]

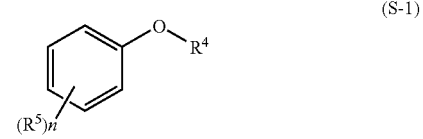

(S-1)

(in the formula, $R^4$ represents an alkyl group of 1 to 5 carbon atoms; $R^5$ represents an alkyl group of 1 to 3 carbon atoms; and n represents an integer of 0 to 2).

12 Claims, 1 Drawing Sheet

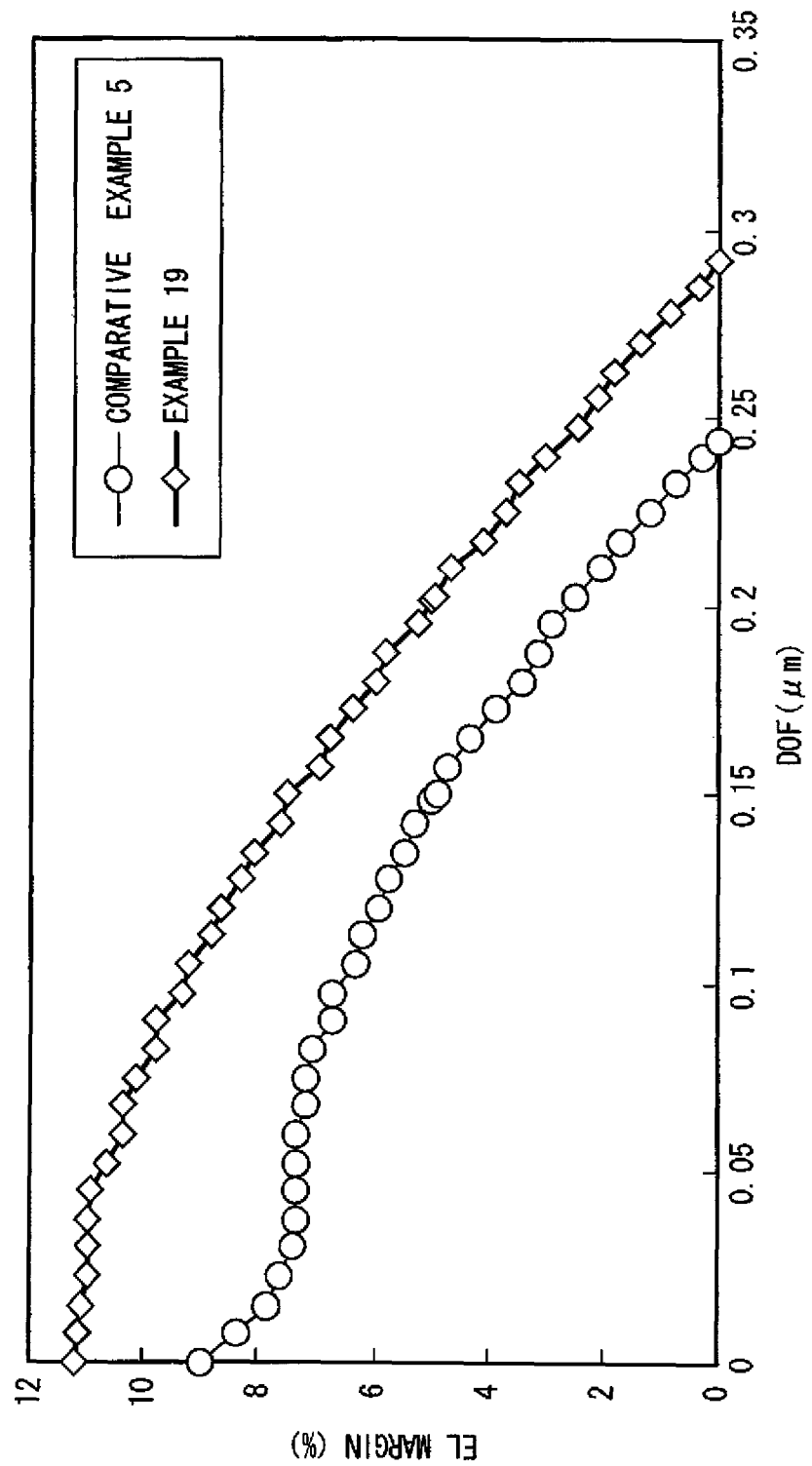

US 8,257,904 B2

RESIST COMPOSITION AND METHOD OF FORMING RESIST PATTERN

TECHNICAL FIELD

The present invention relates to a resist composition and a method of forming a resist pattern.

The application claims priority from Japanese Patent Application No. 2008-289603, filed on Nov. 12, 2008, Japanese Patent Application No. 2009-096378, filed on Apr. 10, 2009, and Japanese Patent Application No. 2009-248211, filed on Oct. 28, 2009, the disclosures of which are incorporated by reference herein.

BACKGROUND ART

Lithography techniques include processes in which, for example, a resist film formed from a resist material is formed on top of a substrate, the resist film is selectively exposed to irradiation such as light, an electron beam or the like through a mask in which a predetermined pattern has been formed, and then a developing treatment is conducted, thereby forming a resist pattern of the prescribed shape in the resist film.

Resist materials in which the exposed portions change to become soluble in a developing solution are termed positive materials, whereas resist materials in which the exposed portions change to become insoluble in the developing solution are termed negative materials.

In recent years, in the production of semiconductor elements and liquid crystal display elements, advances in lithography techniques have led to rapid progress in the field of miniaturization.

Typically, these miniaturization techniques involve shortening the wavelength of the exposure light source. Conventionally, ultraviolet radiation typified by g-line and i-line radiation has been used; however, nowadays, KrF excimer lasers and ArF excimer lasers are starting to be introduced in mass production of semiconductor elements. Furthermore, research is also being conducted into lithography techniques that use $F_2$ excimer lasers, electron beams (EB), extreme ultraviolet radiation (EUV) and X-rays.

Resist materials are required to have lithography properties such as high sensitivity to the aforementioned light source and sufficient resolution to reproduce patterns with very fine dimensions.

As resist materials which fulfill the aforementioned requirements, there is used a chemically-amplified resist composition containing a base resin that displays changed solubility in an alkali developing solution under action of an acid, and an acid generator that generates an acid upon exposure.

For example, as the chemically-amplified positive resist composition, a composition containing a resin component (a base resin) that exhibits increased solubility in an alkali developing solution under action of an acid and an acid generator component is commonly used. If the resist film formed using the resist composition is selectively exposed during formation of a resist pattern, then within the exposed portions, an acid is generated from the acid generator, and the action of this acid causes an increase in the solubility of the resin component in an alkali developing solution, making the exposed portions soluble in the alkali developing solution.

On the other hand, the chemically-amplified negative resist composition includes, for example, a resin component having a carboxyl group, a cross-linking agent having an alcoholic hydroxyl group, and an acid generator. In the resist pattern formation, the action of an acid generated from the acid generator causes a reaction between the carboxyl group within the resin component and the alcoholic hydroxyl group within the cross-linking agent, thereby changing the resin component from an alkali-soluble state to an alkali-insoluble state.

Resins (acrylic resins) that contain structural units derived from (meth)acrylate esters within the main chain are now widely used as base resins for resists that use ArF excimer laser lithography, as they exhibit excellent transparency in the vicinity of 193 nm (for example, see Patent Document 1). Here, the term "(meth)acrylic acid" is a generic term that includes either or both of the acrylic acid having a hydrogen atom bonded to the α-position and the methacrylic acid having a methyl group bonded to the α-position. The term "(meth)acrylate ester" is a generic term that includes either or both of an acrylate ester having a hydrogen atom bonded to the α-position and a methacrylate ester having a methyl group bonded to the α-position. The term "(meth)acrylate" is a generic term that includes either or both of an acrylate having a hydrogen atom bonded to the α-position, and a methacrylate having a methyl group bonded to the α-position.

Also, as base resins for chemically-amplified resists, base resins containing a plurality of structural units are now used in order to improve lithography properties and the like. For example, in the case of using a positive-type resist, a base resin is typically used which includes a structural unit having an acid dissociable, dissolution inhibiting group which dissociates under action of an acid generated from an acid generator, and further includes a structural unit having a polar group such as a hydroxyl group, a structural unit having a lactone structure, and the like. Of these structural units, the structural unit having a lactone structure is generally considered to contribute to the improvement of the adhesion of the resist film with a substrate, the improvement of compatibility with an alkali developing solution, and the improvement of lithography properties.

DOCUMENTS OF RELATED ART

Patent Documents

[Patent Document 1] Japanese Unexamined Patent Application, First Publication No. 2003-241385.

SUMMARY OF THE INVENTION

Problems to be Solved by the Invention

The demand for a novel material which can be used for lithography has increased, since it is expected that lithography technology will further progress and the field of application will be broadened. For example, as miniaturization of the resist pattern has further progressed, it is desired that resist materials have improved lithography properties, such as resolution, EL margin, depth of focus (DOF), line edge roughness (LER), and resistance to pattern collapse.

The present invention takes the above circumstances into consideration, with an object of providing a resist composition which exhibits excellent lithography properties, and a method of forming a resist pattern using the resist composition.

Means for Solving the Problems

To achieve the above object, the present invention employs the following constitutions.

Specifically, a first aspect of the present invention is a resist composition including a base component (A) which exhibits changed solubility in an alkali developing solution under action of an acid, an acid generator component (B) which generates an acid upon exposure, and an organic solvent (S), wherein the base component (A) includes a polymeric compound (A1) which contains a structural unit (a0) represented by the general formula (a0-1) shown below:

[Chemical Formula 1]

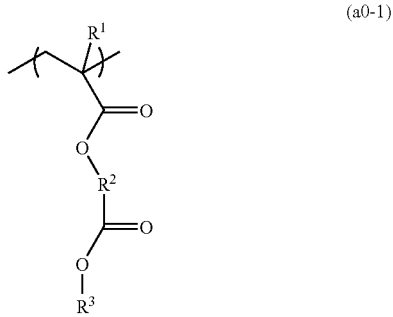

(a0-1)

(in the formula, $R^1$ represents a hydrogen atom, an alkyl group of 1 to 5 carbon atoms, or a halogenated alkyl group of 1 to 5 carbon atoms; $R^2$ represents a bivalent linking group; and $R^3$ represents a cyclic group which has —$SO_2$— within the ring skeleton), and the organic solvent (S) includes a cyclic ketone having 5 to 7-membered ring, an ether represented by the general formula (S-1) shown below, or a mixture of the cyclic ketone having 5 to 7-membered ring and the ether represented by the general formula (S-1):

[Chemical Formula 2]

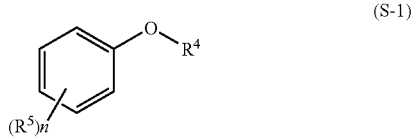

(S-1)

(in the formula, $R^4$ represents an alkyl group of 1 to 5 carbon atoms; $R^5$ represents an alkyl group of 1 to 3 carbon atoms; and n represents an integer of 0 to 2).

A second aspect of the present invention is a method of forming a resist pattern, which includes: forming a resist film on a substrate using the resist composition of the first aspect; exposing the resist film; and developing the resist film with an alkali to form a resist pattern.

In the present description and claims, the term "aliphatic" is a relative concept used in relation to the term "aromatic", and defined as a group, compound or the like that has no aromaticity.

The term "alkyl group" is a concept containing a linear, branched and cyclic monovalent saturated hydrocarbon group, unless another definition is particularly provided. The same definition can also be applied to an alkyl group included in an alkoxy group.

The term "alkylene group" is a concept containing a linear, branched, and cyclic bivalent saturated hydrocarbon group, unless another specific definition is provided.

The term "halogenated alkyl group" means a group in which a part or all of hydrogen atoms in an alkyl group are substituted with halogen atoms, and examples of the halogen atom include a fluorine atom, a chlorine atom, a bromine atom, and an iodine atom.

The term "fluorinated alkyl group" or "fluorinated alkylene group" means a group in which a part or all of hydrogen atoms in the alkyl group or alkylene group are substituted with fluorine atoms.

The term "structural unit" means a monomer unit that contributes to the formation of a polymeric compound (resin, polymer, copolymer).

The term "structural unit derived from an acrylate ester" means a structural unit that is formed by the cleavage of the ethylenic double bond of an acrylate ester.

The term "acrylate ester" is a concept containing an acrylate ester in which a hydrogen atom is bonded to a carbon atom at the α-position, and an α-substituted acrylate ester in which a hydrogen atom bonded to the carbon atom at the α-position is substituted with a substituent (an atom or group other than a hydrogen atom). Examples of the substituent bonded to the carbon atom at the α-position include an alkyl group of 1 to 5 carbon atoms, a halogenated alkyl group of 1 to 5 carbon atoms, and a hydroxyalkyl group of 1 to 5 carbon atoms.

Hereinafter, an alkyl group of 1 to 5 carbon atoms and a halogenated alkyl group of 1 to 5 carbon atoms are sometimes referred to as a lower alkyl group and a halogenated lower alkyl group, respectively.

Here, the carbon atom at the α-position of an acrylate ester means the carbon atom to which the carbonyl group is bonded, unless another definition is provided.

The term "exposure" is used as a general concept involving irradiation with any form of radiation.

Effects of the Invention

According to the present invention, a resist composition which exhibits excellent lithography properties, and a method of forming a resist pattern using the resist composition can be provided.

BRIEF DESCRIPTION OF THE DRAWINGS

FIG. 1 shows a graph in which the relationship between EL margin and DOF in a contact hole (CH) pattern is shown.

BEST MODE FOR CARRYING OUT THE INVENTION

The resist composition of the present invention may be a positive type or a negative type. Hereinafter, each of the positive resist composition and the negative resist composition will be explained.

<<Positive Resist Composition>>

The positive resist composition of the present invention includes a base component (A) which exhibits increased solubility in an alkali developing solution under action of an acid (hereinafter, referred to as "component (A)"), and an acid generator component (B) which generates an acid upon exposure (hereinafter, referred to as "component (B)").

The positive resist composition makes an acid generated from the component (B) when an exposure is conducted, and the acid thus generated causes an increase in the solubility of the component (A) in an alkali developing solution. Therefore, in a resist pattern formation, when a selective exposure is conducted to a resist film formed by using the positive resist composition, the exposed portions of the resist film increase solubility in an alkali developing solution, whereas the unexposed portions do not change solubility in an alkali developing solution. As a result, a resist pattern can be formed by a following developing treatment with alkali.

<Component (A)>

In the present invention, the term "base component" means an organic compound with a film-formation capability.

As the base component, an organic compound having a molecular weight of 500 or more is preferably used. When the molecular weight of the organic compound is 500 or more, the film-forming capability can be improved, and a nano-level resist pattern can easily be formed.

The "organic compounds having a molecular weight of 500 or more" used as the base component can broadly be separated into non-polymers and polymers.

As the non-polymer, those which have a molecular weight of 500 to less than 4,000 are typically used. Hereinafter, a non-polymer having a molecular weight of 500 to less than 4,000 is referred to as "low molecular weight compound".

As the polymers, those which have a molecular weight of 2,000 or more are typically used. Hereinafter, a polymer having a molecular weight of 2,000 or more is referred to as "polymeric compound (high molecular weight compound)". In the case of using a polymeric compound, the polystyrene equivalent weight average molecular weight determined using gel permeation chromatography (GPC) shall be used as the "molecular weight". Hereinafter, polymeric compounds are sometimes referred to as "resin".

In the present invention, the component (A) includes the polymeric compound (A1) (hereinafter, referred to as "component (A1)") which includes the structural unit (a0) represented by the general formula (a0-1).

[Polymeric Compound (A1)]

The component (A1) is a polymeric compound containing the structural unit (a0).

The component (A1) preferably includes a structural unit (a1) derived from an acrylate ester which has an acid dissociable, dissolution inhibiting group, in addition to the structural unit (a0).

Also, it is preferable that the component (A1) further include a structural unit (a2) derived from an acrylate ester which has a lactone-containing cyclic group, in addition to the structural unit (a0) or the structural units (a0) and (a1).

Also, it is preferable that the component (A1) further include a structural unit (a3) derived from an acrylate ester which has a polar group-containing aliphatic hydrocarbon group, in addition to the structural unit (a0), the structural units (a0) and (a 1), or the structural units (a0), (a1) and (a2).

(Structural Unit (a0))

In the above formula (a0-1), $R^1$ represents a hydrogen atom, an alkyl group of 1 to 5 carbon atoms, or a halogenated alkyl group of 1 to 5 carbon atoms.

The alkyl group of 1 to 5 carbon atoms for $R^1$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group of 1 to 5 carbon atoms for $R^1$ is a group in which a part or all of the hydrogen atoms of the aforementioned alkyl group of 1 to 5 carbon atoms are substituted with halogen atoms. Examples of the halogen atom include a fluorine atom, a chlorine atom, an iodine atom, and a bromine atom. Of these, a fluorine atom is preferable.

$R^1$ is preferably a hydrogen atom, an alkyl group of 1 to 5 carbon atoms, or a fluorinated alkyl group of 1 to 5 carbon atoms, and most preferably a hydrogen atom or a methyl group in terms of industrial availability.

In the above formula (a0-1), $R^2$ represents a bivalent linking group.

As $R^2$, a bivalent hydrocarbon group which may contain a substituent, a bivalent linking group containing a hetero atom, or the like is preferably used.

With Respect to the Bivalent Hydrocarbon Group which may Contain a Substituent:

In $R^2$, the expression that a hydrocarbon group "contains a substituent" means that a part or all of the hydrogen atoms within the hydrocarbon group are substituted with groups or atoms other than hydrogen atoms.

The hydrocarbon group may be an aliphatic hydrocarbon group, or may be an aromatic hydrocarbon group. The aliphatic hydrocarbon group means a hydrocarbon group which contains no aromaticity.

The aliphatic hydrocarbon group may be saturated or unsaturated, and is typically preferably saturated.

Specific examples of the aliphatic hydrocarbon group include a linear or branched aliphatic hydrocarbon group, and an aliphatic hydrocarbon group containing a ring within the structure.

The linear or branched aliphatic hydrocarbon group preferably has 1 to 10 carbon atoms, more preferably 1 to 8 carbon atoms, still more preferably 1 to 5 carbon atoms, and most preferably 1 to 2 carbon atoms.

As the linear aliphatic hydrocarbon group, a linear alkylene group is preferable, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group is preferably a branched alkylene group, and specific examples thereof include alkylalkylene groups such as alkylmethylene groups (for example, —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—); alkylethylene groups (for example, —$CH(CH_3)CH_2$—, —$CH(CH_3)CH(CH_3)$—, —$C(CH_3)_2CH_2$—, —$CH(CH_2CH_3)CH_2$—, or —$CH(CH_2CH_3)_2$—$CH_2$—); alkyltrimethylene groups (for example, —$CH(CH_3)CH_2CH_2$— or —$CH_2CH(CH_3)CH_2$—); and alkyltetramethylene groups (for example, —$CH(CH_3)CH_2CH_2CH_2$— or —$CH_2CH(CH_3)CH_2CH_2$—). The alkyl group in the alkylalkylene group is preferably a linear alkyl group of 1 to 5 carbon atoms.

The chain-like aliphatic hydrocarbon group may or may not contain a substituent. Examples of the substituent include a fluorine atom, a fluorinated alkyl group of 1 to 5 carbon atoms, and an oxygen atom (=O).

Examples of the aliphatic hydrocarbon group containing a ring within the structure include a cyclic aliphatic hydrocarbon group (a group in which two hydrogen atoms have been removed from an aliphatic hydrocarbon ring); and a group in which the above cyclic aliphatic hydrocarbon group is bonded to the terminal of the aforementioned chain-like (linear or branched) aliphatic hydrocarbon group or present in the aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be a polycyclic group or may be a monocycle group. The monocycle group is preferably a group in which two hydrogen atoms have been removed from a monocycloalkane of 3 to 6 carbon atoms, and examples thereof include cyclopentane and cyclohexane. The polycyclic group is preferably a group in which two hydrogen atoms have been removed from a polycycloalkane of 7 to 12 carbon atoms, and examples thereof include adamantane, norbornane, isobornane, tricyclodecane, and tetracyclododecane.

The cyclic aliphatic hydrocarbon group may or may not contain a substituent. Examples of the substituent include an alkyl group of 1 to 5 carbon atoms, a fluorine atom, a fluorinated alkyl group of 1 to 5 carbon atoms, and an oxygen atom (=O).

Examples of the aromatic hydrocarbon group include bivalent aromatic hydrocarbon groups in which one hydrogen atom has been further removed from an aromatic hydrocarbon nucleus of a monovalent aromatic hydrocarbon group such as a phenyl group, a biphenyl group, a fluorenyl group, a naphthyl group, an anthryl group and a phenanthryl group; aromatic hydrocarbon groups in which a part of the carbon atoms constituting the ring of the above bivalent aromatic hydrocarbon group are substituted with hetero atoms such as an oxygen atom, a sulfur atom, a nitrogen atom and the like; aromatic hydrocarbon groups in which one hydrogen atom has been further removed from an aromatic hydrocarbon nucleus of an arylalkyl group such as a benzyl group, a phenethyl group, a 1-naphthylmethyl group, a 2-naphthylmethyl group, a 1-naphthylethyl group, and a 2-naphthylethyl group.

The aromatic hydrocarbon group may or may not contain a substituent. Examples of the substituent include an alkyl group of 1 to 5 carbon atoms, a fluorine atom, a fluorinated alkyl group of 1 to 5 carbon atoms, and an oxygen atom (=O).

With Respect to the Bivalent Linking Group Containing a Hetero Atom:

In $R^2$, the hetero atom in the "bivalent linking group containing a hetero atom" means an atom other than a carbon atom and hydrogen atom, and examples thereof include an oxygen atom, a nitrogen atom, a sulfur atom, and a halogen atom.

Specific examples of the bivalent linking group containing a hetero atom include —O—, —C(=O)—, —C(=O)—O—, a carbonate linkage (—O—C(=O)—O—), —NH—, —$NR^{04}$— (wherein, $R^{04}$ represents an alkyl group), —NH—C(=O)—, and =N—. Also, a combination of the above "bivalent linking group containing a hetero atom" and a bivalent hydrocarbon group can be used. Examples of the bivalent hydrocarbon group include the same groups as those described above for "bivalent hydrocarbon group which may contain a substituent", and of these, a linear or branched aliphatic hydrocarbon group is preferably used.

$R^2$ may or may not contain an acid dissociable portion within the structure.

The term "acid dissociable portion" means a portion in the bivalent linking group which dissociates under action of an acid generated upon exposure. When $R^2$ contains an acid dissociable portion, it is preferable to contain an acid dissociable portion which has a tertiary carbon atom.

In the present invention, the bivalent linking group for $R^2$ is preferably an alkylene group, a bivalent aliphatic cyclic group, or a bivalent linking group containing a hetero group. Of these, an alkylene group is particularly preferable.

If $R^2$ is an alkylene group, the alkylene group preferably has 1 to 10 carbon atoms, more preferably 1 to 6 carbon atoms, still more preferably 1 to 4 carbon atoms, and most preferably 1 to 3 carbon atoms. Specific examples thereof include the same linear alkylene groups and branched alkylene groups as those described above.

When $R^2$ is a bivalent aliphatic cyclic group, examples of the aliphatic cyclic group include the same cyclic aliphatic hydrocarbon groups as those described above in "aliphatic hydrocarbon group containing a ring within the structure".

It is particularly preferable that the aliphatic cyclic group be a group in which two or more hydrogen atoms have been removed from a cyclopentane, a cyclohexane, a norbornane, an isobornane, an adamantane, a tricyclodecane or a tetracyclododecane.

When $R^2$ is a bivalent linking group containing a hetero atom, preferable examples of the linking group include —O—, —C(=O)—O—, —C(=O)—, —C(=O)NH—, —NH— (wherein, H may be substituted with a substituent such as an alkyl group or an acyl group), —S—, —S(=O)$_2$—, —S(=O)$_2$—O—, a group represented by the formula -A-O—B—, and a group represented by the formula -[A-C(=O)—O]$_d$—B—. Wherein, A and B each independently represents a bivalent hydrocarbon group which may contain a substituent; and d represents an integer of 0 to 3.

When $R^2$ is —NH—, said H may be substituted with a substituent such as an alkyl group or an acyl group. The substituent (an alkyl group, an acyl group, or the like) preferably has 1 to 10 carbon atoms, more preferably 1 to 8 carbon atoms, and still more preferably 1 to 5 carbon atoms.

In -A-O—B— or -[A-C(=O)—O—]$_d$—B—, A and B each independently represents a bivalent hydrocarbon group which may contain a substituent.

Examples of the bivalent hydrocarbon group which may contain a substituent for A and B include the same groups as those described above in "bivalent hydrocarbon groups which may contain a substituent" for $R^2$.

A is preferably a linear aliphatic hydrocarbon group, more preferably a linear alkylene group, still more preferably a linear alkylene group of 1 to 5 carbon atoms, and particularly preferably a methylene group or an ethylene group.

B is preferably a linear or branched aliphatic hydrocarbon group, and more preferably a methylene group, an ethylene group or an alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

Also, in a group represented by the formula -[A-C(=O)—O—]$_d$—B—, d represents an integer of 0 to 3, more preferably an integer of 0 to 2, still more preferably 0 or 1, and most preferably 1.

In the above formula (a0-1), $R^3$ represents a cyclic group containing —SO$_2$— within the ring skeleton (cyclic structure).

The cyclic group for $R^3$ refers to a cyclic group containing a ring which has —SO$_2$— within the ring skeleton, and this ring is counted as the first ring. A cyclic group in which the only ring structure is this ring is referred to as a monocyclic group, and a cyclic group containing other ring structures is referred to as polycyclic group regardless of the structure of the other rings. The cyclic group for $R^3$ may be a monocyclic group or may be a polycyclic group.

It is particularly preferable that $R^3$ include a cyclic group containing —O—SO$_2$— within the ring skeleton, that is, a sultone ring.

The cyclic group for $R^3$ is preferably 3 to 30 carbon atoms, more preferably 4 to 20 carbon atoms, still more preferably 4 to 15 carbon atoms, and particularly preferably 4 to 12 carbon atoms. Here, the number of carbon atoms described above means the number of carbon atoms constituting the ring skeleton, and does not include the number of carbon atoms included in a substituent.

The cyclic group for $R^3$ may be an aliphatic cyclic group, or may be an aromatic cyclic group. $R^3$ is preferably an aliphatic cyclic group.

Examples of the aliphatic cyclic group for $R^3$ include groups in which a part of the carbon atoms constituting the ring skeleton(s) of the cyclic aliphatic hydrocarbon group described above are substituted with —$SO_2$— or —O—$SO_2$—.

Specific examples of the monocyclic group include: groups in which one hydrogen atom has been eliminated from a monocycloalkane in which —$CH_2$— constituting the ring skeleton has been substituted with —$SO_2$—; and groups in which one hydrogen atom has been eliminated from a monocycloalkane in which —$CH_2$—$CH_2$— constituting the ring skeleton has been substituted with —O—$SO_2$—. Also, specific examples of the polycyclic group include: groups in which one hydrogen atom has been eliminated from a polycycloalkane (bicycloalkane, tricycloalkane, tetracycloalkane, or the like) in which —$CH_2$— constituting the ring skeleton has been substituted with —$SO_2$—; and groups in which one hydrogen atom has been eliminated from a polycycloalkane in which —$CH_2$—$CH_2$— constituting the ring skeleton has been substituted with —O—$SO_2$—.

The cyclic group for $R^3$ may contain a substituent. Examples of the substituent include an alkyl group, an alkoxy group, a halogen atom, a halogenated alkyl group, a hydroxyl group, an oxygen atom (=O), —COOR", —OC(=O)R", a hydroxyalkyl group, and a cyano group. Here, R" represents a hydrogen atom or an alkyl group.

The alkyl group for the substituent is preferably an alkyl group of 1 to 6 carbon atoms. The alkyl group is preferably a linear or branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Of these, a methyl group or an ethyl group is preferable, and a methyl group is particularly preferable.

The alkoxy group for the substituent is preferably an alkoxy group of 1 to 6 carbon atoms. The alkoxy group is preferably a linear or branched alkoxy group. Specific examples thereof include groups in which an oxygen atom (—O—) has been bonded to an alkyl group described above as the alkyl group for the substituent.

Examples of the halogen atom for the substituent include a fluorine atom, a chlorine atom, a bromine atom, and an iodine atom. Of these, a fluorine atom is preferable.

Examples of the halogenated alkyl group for the substituent include a group in which a part or all of the hydrogen atoms within an alkyl group described above as the alkyl group for the substituent are substituted with the above halogen atoms. The halogenated alkyl group is preferably a fluorinated alkyl group, and particularly preferably a perfluoroalkyl group.

Each of R" within the above —COOR" and —OC(=O)R" is preferably a hydrogen atom, or a linear, branched, or cyclic alkyl group of 1 to 15 carbon atoms.

In the case that R" is a linear or branched alkyl group, R" preferably has 1 to 10 carbon atoms, more preferably 1 to 5 carbon atoms, and still more preferably a methyl group or an ethyl group.

In the case that R" is a cyclic alkyl group, the number of carbon atoms is preferably 3 to 15, more preferably 4 to 12, and most preferably 5 to 10. Specific examples of the cyclic alkyl group include groups in which one or more hydrogen atoms have been removed from a monocycloalkane or a polycycloalkane such as a bicycloalkane, tricycloalkane or tetracycloalkane, in which a fluorine atom or a fluorinated alkyl group may or may not be included as a substituent. Specific examples include groups in which at least one hydrogen atom has been removed from a monocycloalkane such as cyclopentane or cyclohexane; and groups in which at least one hydrogen atom has been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include groups in which at least one hydrogen atom of an alkyl group described above as the alkyl group for the substituent has been substituted with a hydroxyl group.

More specific examples of $R^3$ include groups represented by the general formulae (3-1) to (3-4) shown below.

[Chemical Formula 3]

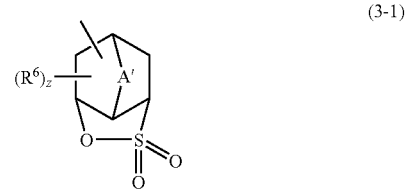

(3-1)

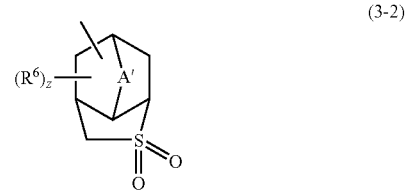

(3-2)

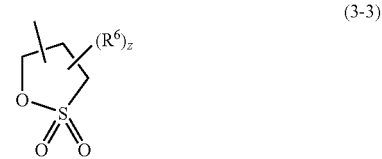

(3-3)

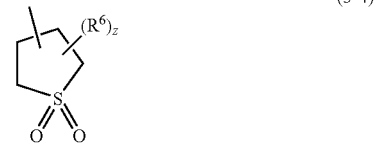

(3-4)

(In the above formulae, A' represents an oxygen atom, a sulfur atom, or an alkylene group of 1 to 5 carbon atoms which may contain an oxygen atom or a sulfur atom; z represents an integer of 0 to 2; $R^6$ represents an alkyl group, an alkoxy group, a halogenated alkyl group, a hydroxyl group, —COOR", —OC(=O)R", a hydroxyalkyl group or a cyano group; and R" represents a hydrogen atom or an alkyl group.)

In the above formulae (3-1) to (3-4), A' represents an oxygen atom, a sulfur atom, or an alkylene group of 1 to 5 carbon atoms which may contain an oxygen atom (—O—) or a sulfur atom (—S—).

The alkylene group of 1 to 5 carbon atoms for A' is preferably a linear or branched alkylene group, and examples thereof include a methylene group, an ethylene group, an n-propylene group, and an isopropylene group.

When the alkylene group for A' contains an oxygen atom or a sulfur atom, a group in which —O— or —S— is located at the terminal of the alkylene group or between carbon atoms of the alkylene group can be mentioned as an example. Specific examples thereof include —O—$CH_2$—, —$CH_2$—O—$CH_2$—, —S—$CH_2$— and —$CH_2$—S—$CH_2$—.

A' is preferably —O— or an alkylene group of 1 to 5 carbon atoms, more preferably an alkylene group of 1 to 5 carbon atoms, and most preferably a methylene group.

z may be any of an integer of 0 to 2, and most preferably 0.

Here, when z is 2, a plurality of $R^2$ may be the same, or may be different from each other.

Examples of the alkyl group, alkoxy group, halogenated alkyl group, —COOR", —OC(=O)R", and a hydroxyalkyl group for $R^6$ include the same groups as the alkyl group, alkoxy group, halogenated alkyl group, —COOR", —OC(=O)R", and hydroxyalkyl group, respectively, described above as the substituent which the cyclic group for $R^3$ may contain.

Specific cyclic groups represented by the above general formulae (3-1) to (3-4) are shown below. Here, in the formulae, the term "Ac" represents an acetyl group.

[Chemical Formula 4]

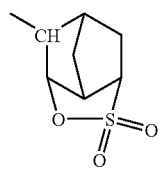 (3-1-1)

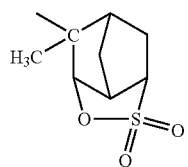 (3-1-2)

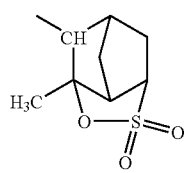 (3-1-3)

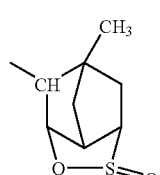 (3-1-4)

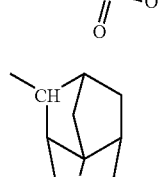 (3-1-5)

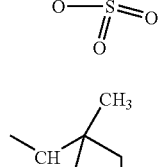 (3-1-6)

-continued

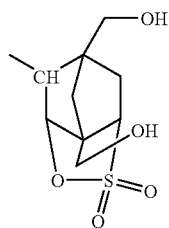 (3-1-7)

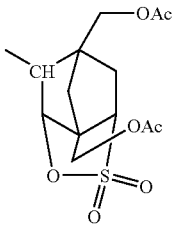 (3-1-8)

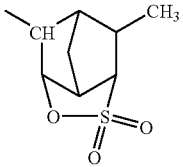 (3-1-9)

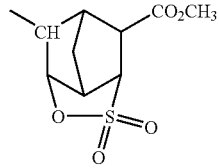 (3-1-10)

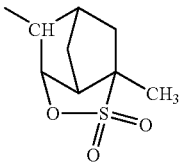 (3-1-11)

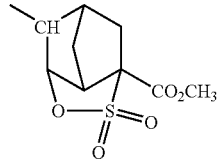 (3-1-12)

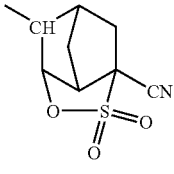 (3-1-13)

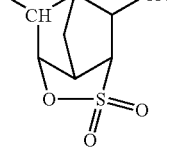 (3-1-14)

(3-1-15)
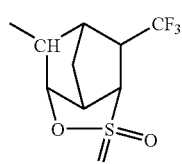
(3-1-16)
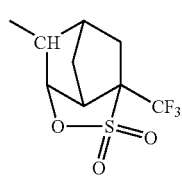
(3-1-17)
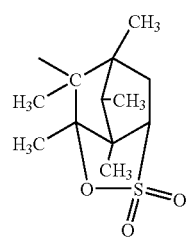
[Chemical Formula 5]
(3-1-18)
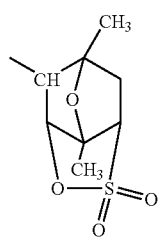
(3-1-19)
(3-1-20)
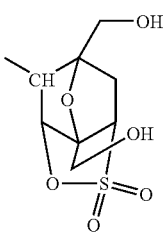
(3-1-21)
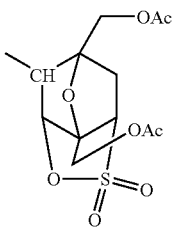
(3-1-22)
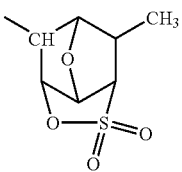
(3-1-23)
(3-1-24)
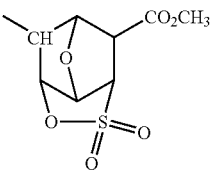
(3-1-25)
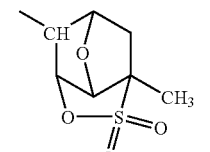
(3-1-26)
(3-1-27)
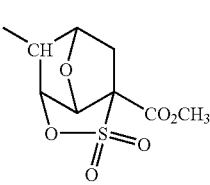
(3-1-28)
(3-1-29)
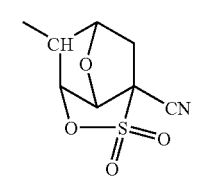
(3-1-30)

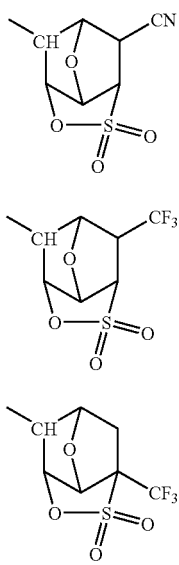

(3-1-31)

(3-1-32)

(3-1-33)

[Chemical Formula 6]

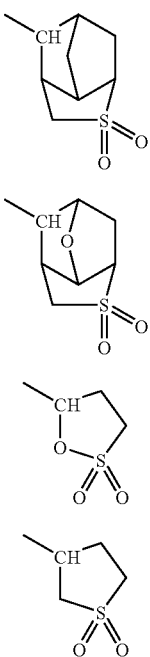

(3-2-1)

(3-2-2)

(3-3-1)

(3-4-1)

Of these, $R^3$ is preferably a group represented by the general formula (3-1), (3-1) or (3-4) shown above, and particularly preferably a group represented by general formula (3-1) shown above.

Specifically, $R^3$ is preferably at least one selected from the group consisting of groups represented by the formula (3-1-1), (3-1-18), (3-3-1) and (3-4-1) shown above, and most preferably a group represented by the formula (3-1-1).

In the present invention, the structural unit (a0) is particularly preferably a structural unit represented by the general formula (a0-1-11) shown below.

[Chemical Formula 7]

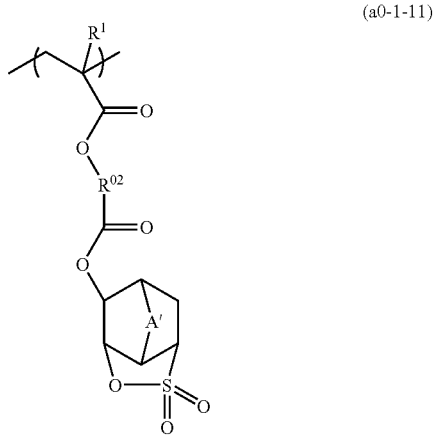

(a0-1-11)

(In the above formula, $R^1$ is as defined above; $R^{o2}$ represents a linear or branched alkylene group; and A' is as defined above.)

The linear or branched alkylene group for $R^{o2}$ preferably has 1 to 10 carbon atoms, more preferably 1 to 8 carbon atoms, still more preferably 1 to 5 carbon atoms, still more preferably 1 to 3 carbon atoms, and most preferably 1 or 2 carbon atoms.

A' is preferably a methylene group, an oxygen atom (—O—), or a sulfur atom (—S—).

As the structural unit (a0), one type of structural unit may be used, or two or more types may be used in combination.

In the component (A1), the proportion of the structural unit (a0) is preferably 1 to 60 mol %, more preferably 5 to 50 mol %, still more preferably 10 to 40 mol %, and most preferably 15 to 40 mol %, based on the combined total of all structural units constituting the component (A1), because it excels in MEF, the resist pattern shape (for example, rectangularity in case of a line pattern, and circularity in case of a hole pattern), CDU (critical dimension uniformity), LER (line edge roughness), LWR (line width roughness) and the like when a resist pattern is formed using a positive resist composition including the component (A1).

(Structural Unit (a1))

Structural unit (a1) is a structural unit which does not correspond with the above structural unit (a0) and is derived from an acrylate ester which has an acid dissociable, dissolution inhibiting group.

As the acid dissociable, dissolution inhibiting group in the structural unit (a1), any of the groups that have been proposed as acid dissociable, dissolution inhibiting groups for the base resins of chemically-amplified resists can be used, provided the group has an alkali dissolution-inhibiting effect that renders the entire component (A1) alkali-insoluble prior to dissociation, and then following dissociation by action of an acid, causes the entire component (A1) to change to an alkali-soluble state. Generally, groups that form either a cyclic or chain-like tertiary alkyl ester with the carboxyl group of the (meth)acrylic acid; and acetal-type acid dissociable, dissolution inhibiting groups such as alkoxyalkyl groups are widely known. Here, the term "(meth)acrylate ester" is a generic term that includes either or both of an acrylate ester having a hydrogen atom bonded to the α-position and a methacrylate ester having a methyl group bonded to the α-position.

Here, the term "tertiary alkyl ester" means a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(O)—O—). In the tertiary alkyl ester, the bond between the oxygen atom and the tertiary carbon atom is cleaved under action of an acid.

Here, the chain-like or cyclic alkyl group may contain a substituent.

Hereinafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of the tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

Here, the term "aliphatic branched" means to contain a branched structure having no aromaticity. The "aliphatic branched, acid dissociable, dissolution inhibiting group" is not limited to groups (hydrocarbon groups) composed of carbon atoms and hydrogen atoms, and is preferably a hydrocarbon group. Further, the "hydrocarbon group" may be either saturated or unsaturated, and is preferably saturated.

As the aliphatic branched, acid dissociable, dissolution inhibiting group, a group represented by the formula "—C($R^{71}$)($R^{72}$)($R^{73}$)" can be used. In the formula, $R^{71}$ to $R^{73}$ each independently represents a linear alkyl group of 1 to 5 carbon atoms. The group represented by —C($R^{71}$)($R^{72}$)($R^{73}$) preferably has 4 to 8 carbon atoms, and specific examples thereof include a tert-butyl group, a 2-methyl-2-butyl group, a 2-methyl-2-pentyl group, and a 3-methyl-3-pentyl group. Of these, a tert-butyl group is particularly preferable.

The term "aliphatic cyclic group" means a monocyclic or polycyclic group which has no aromaticity.

The "aliphatic cyclic group" within the structural unit (a1) may or may not contain a substituent. Examples of substituents include an alkyl group of 1 to 5 carbon atoms, an alkoxy group of 1 to 5 carbon atoms, a fluorine atom, a fluorinated alkyl group of 1 to 5 carbon atoms, and an oxygen atom The basic ring of the "aliphatic cyclic group" exclusive of substituents is not limited to groups (hydrocarbon groups) composed of carbon atoms and hydrogen atoms, and is preferably a hydrocarbon group. Further, the "hydrocarbon group" may be either saturated or unsaturated, and is preferably saturated. The "aliphatic cyclic group" is preferably a polycyclic group.

Examples of the aliphatic cyclic groups include groups in which one or more hydrogen atoms have been removed from a monocycloalkane or a polycycloalkane such as a bicycloalkane, tricycloalkane or tetracycloalkane in which a lower alkyl group, a fluorine atom or a fluorinated lower alkyl group may or may not be included as a substituent. Specific examples thereof include groups in which at least one hydrogen atom has been removed from a monocycloalkane such as cyclopentane or cyclohexane; and groups in which at least one hydrogen atom has been removed from a polycycloalkane such as adamantane, norbornane, isobornane, tricyclodecane or tetracyclododecane. Also, a part of carbon atoms constituting the ring(s) of groups in which at least one hydrogen atom has been removed from a monocycloalkane, or groups in which at least one hydrogen atom has been removed from a polycycloalkane have been substituted with ether oxygen atoms (—O—).

Examples of aliphatic cyclic group-containing acid dissociable, dissolution inhibiting groups include: (i) groups having a tertiary carbon atom within the ring skeleton of a monovalent aliphatic cyclic group; and (ii) groups having a monovalent aliphatic cyclic group and a branched alkylene group containing a tertiary carbon atom bonded to the monovalent aliphatic cyclic group.

Specific examples of "(i) groups having a tertiary carbon atom within the ring skeleton of a monovalent aliphatic cyclic group" include groups represented by the general formulae (1-1) to (1-9) shown below.

Specific examples of "(ii) groups having a monovalent aliphatic cyclic group and a branched alkylene group containing a tertiary carbon atom bonded to the monovalent aliphatic cyclic group" include groups represented by general formulae (2-1) to (2-6) shown below.

[Chemical Formula 8]

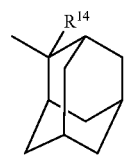

(1-1)

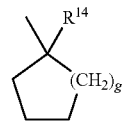

(1-2)

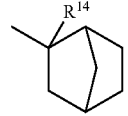

(1-3)

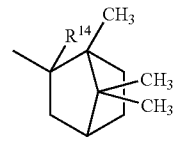

(1-4)

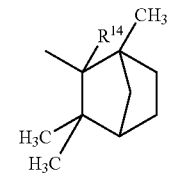

(1-5)

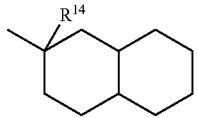

(1-6)

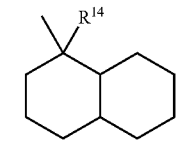

(1-7)

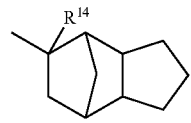

(1-8)

(1-9)

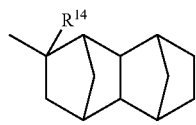

(In the above formulae, R$^{14}$ represents an alkyl group; and g represents an integer of 0 to 8.)

[Chemical Formula 9]

(2-1)

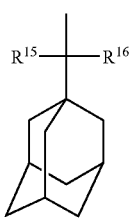

(2-2)

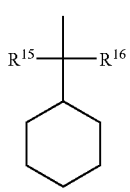

(2-3)

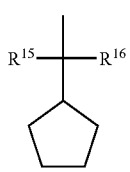

(2-4)

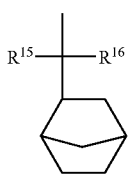

(2-5)

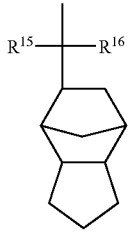

(2-6)

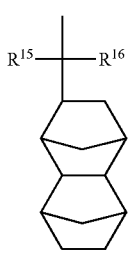

(In the above formulae, R$^{15}$ and R$^{16}$ each independently represents an alkyl group.)

The alkyl group for R$^{14}$ is preferably a linear or branched alkyl group.

The linear alkyl group for R$^{14}$ preferably has 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Of these, a methyl group, an ethyl group or an n-butyl group is preferable, and a methyl group or an ethyl group is more preferable.

The branched alkyl group for R$^{14}$ preferably has 3 to 10 carbon atoms, and more preferably 3 to 5 carbon atoms. Specific examples thereof include an isopropyl group, an isobutyl group, a tert-butyl group, an isopentyl group, and a neopentyl group. Of these, an isopropyl group is most preferable.

g is preferably an integer of 0 to 3, and more preferably an integer of 1 to 3, and still more preferably 1 or 2.

As the alkyl group for R$^{15}$ and R$^{16}$, the same alkyl groups as those described above for R$^{14}$ can be used.

In the above formulae (1-1) to (1-9) and (2-1) to (2-6), a part of carbon atoms constituting the ring may be substituted with ether oxygen atoms (—O—).

Also, in the above formulae (1-1) to (1-9) and (2-1) to (2-6), a hydrogen atom bonded to a carbon atom constituting the ring may be substituted with a substituent. Examples of the substituent include a lower alkyl group, a fluorine atom, and a fluorinated alkyl group.

An "acetal-type acid dissociable, dissolution inhibiting group" generally replaces a hydrogen atom at the terminal of an alkali-soluble group such as a carboxy group or a hydroxyl group, so as to be bonded to an oxygen atom. When an acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of the acetal-type acid dissociable, dissolution inhibiting groups include groups represented by the general formula (p1) shown below.

[Chemical Formula 10]

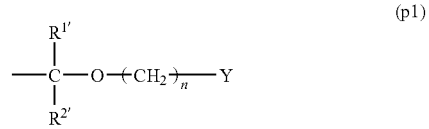

(p1)

(In the formula, R$^{1\prime}$ and R$^{2\prime}$ each independently represents a hydrogen atom or a lower alkyl group; n represents an integer of 0 to 3; and Y represents a lower alkyl group or an aliphatic cyclic group.)

In the above formula (p1), n is preferably an integer of 0 to 2, more preferably 0 or 1, and most preferably 0.

As the lower alkyl group for R$^{1\prime}$ and R$^{2\prime}$, the same lower alkyl groups as those described above for R can be used. As the lower alkyl group for R$^{1\prime}$ or R$^{2\prime}$, a methyl group or an ethyl group is preferable, and a methyl group is most preferable.

In the present invention, at least one of R$^{1\prime}$ and R$^{2\prime}$ is preferably a hydrogen atom. That is, it is preferable that the acid dissociable, dissolution inhibiting group (p1) be a group represented by the general formula (p1-1) shown below.

[Chemical Formula 11]

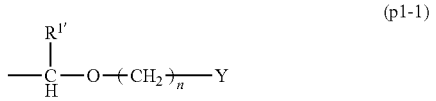

(In the formula, $R^{1\prime}$, n, and Y are respectively as defined above.)

As the lower alkyl group for Y, the same lower alkyl group as those described above for R can be used.

As the aliphatic cyclic group for Y, any of the aliphatic monocyclic or polycyclic groups which have been proposed for conventional ArF resists and the like can be used by being appropriately selected from these. For example, the same groups described above in the "aliphatic cyclic group" can be used.

Further, as the acetal-type, acid dissociable, dissolution inhibiting group, groups represented by general formula (p2) shown below can also be used.

[Chemical Formula 12]

(In the above formula, $R^{17}$ and $R^{18}$ each independently represents a linear or branched alkyl group or a hydrogen atom; and $R^{19}$ represents a linear, branched, or cyclic alkyl group. Alternatively, $R^{17}$ and $R^{19}$ each may independently represent a linear or branched alkylene group, in which the terminal of $R^{17}$ and the terminal of $R^{19}$ are bonded to form a ring.)

The alkyl group for $R^{17}$ and $R^{18}$ preferably has 1 to 15 carbon atoms, and may be either linear or branched. Of these, as the alkyl group for $R^{17}$ and $R^{18}$, an ethyl group or a methyl group is more preferable, and a methyl group is most preferable. It is particularly preferable that either one of $R^{17}$ and $R^{18}$ be a hydrogen atom, and the other be a methyl group.

$R^{19}$ represents a linear, branched or cyclic alkyl group. $R^{19}$ preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. Specific examples of the cyclic alkyl group include groups in which one or more hydrogen atoms have been removed from a monocycloalkane or a polycycloalkane such as a bicycloalkane, a tricycloalkane or a tetracycloalkane, in which a fluorine atom or a fluorinated alkyl group may or may not be included as a substituent. Specific examples thereof include groups in which one or more hydrogen atoms have been removed from a monocycloalkane such as cyclopentane or cyclohexane, and a polycycloalkane such as adamantine, norbornane, isobornane, tricyclodecane, or tetracyclododecane. Of these, a group in which one or more hydrogen atoms have been removed from adamantane is preferable.

Also, in the general formula (p2), $R^{17}$ and $R^{19}$ each may independently represent a linear or branched alkylene group (and preferably an alkylene group of 1 to 5 carbon atoms), in which the terminal of $R^{19}$ is bonded to the terminal of $R^{17}$.

In this case, a cyclic group is formed by $R^{17}$, $R^{19}$, the oxygen atom to which $R^{19}$ is bonded, and the carbon atom to which the oxygen atom and $R^{17}$ are bonded. Such a cyclic group is preferably a 4 to 7-membered ring, and more preferably a 4 to 6-membered ring. Specific examples of the cyclic group include a tetrahydropyranyl group and a tetrahydrofuranyl group.

Specific examples of the acetal-type acid dissociable, dissolution inhibiting group include groups represented by the formulae (p3-1) to (p3-12) shown below.

[Chemical Formula 13]

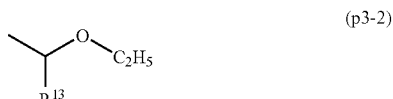

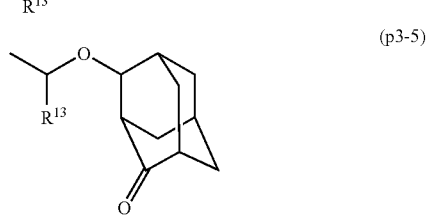

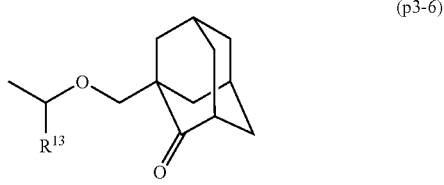

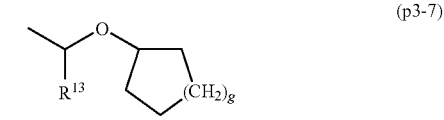

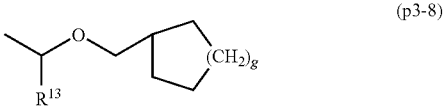

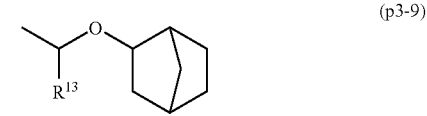

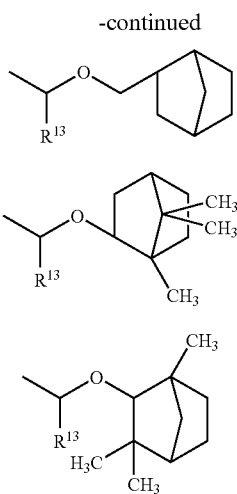

(In the formula, $R^{13}$ represents a hydrogen atom or a methyl group; and g is as defined above.)

More specific examples of the structural unit (a1) include a structural unit represented by the general formula (a1-0-1) shown below and a structural unit represented by the general formula (a1-0-2) shown below.

[Chemical Formula 14]

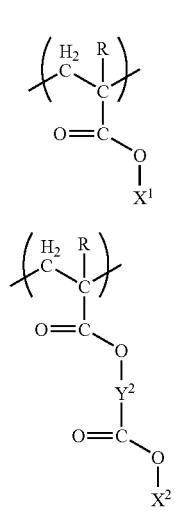

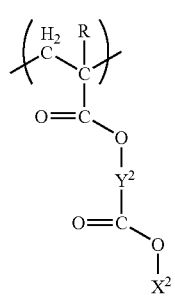

(In the formulae, R represents a hydrogen atom, a lower alkyl group or a halogenated lower alkyl group; $X^1$ represents an acid dissociable, dissolution inhibiting group; $Y^2$ represents a bivalent linking group; and $X^2$ represents an acid dissociable, dissolution inhibiting group.)

In the formula (a1-0-1), R is the same as $R^1$ in the above general formula (a0-1).

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups. Of these, tertiary alkyl ester-type acid dissociable, dissolution inhibiting groups are preferable.

In the general formula (a1-0-2), R is as defined above.

$X^2$ is the same as $X^1$ described above in the general formula (a1-0-1).

Examples of the bivalent linking group for $Y^2$ include the same groups as those described for $R^2$ in the above formula (a0-1).

$Y^2$ is preferably an alkylene group, a bivalent aliphatic cyclic group or a bivalent linking group containing a hetero atom. Of these, $Y^2$ is preferably a bivalent linking group containing a hetero atom, and particularly preferably a linear group containing an oxygen atom as a hetero atom, such as a group containing an ester bond.

Of these, $Y^2$ is preferably a group represented by -A-O—B— or -A-C(=O)—O—B— above, and particularly preferably a group represented by —$(CH_2)_x$—C(=O)—O—$(CH_2)_y$—.

x represents an integer of 1 to 5, preferably 1 or 2, and most preferably 1.

y represents an integer of 1 to 5, preferably 1 or 2, and most preferably 1.

Specific examples of the structural unit (a1) include structural units represented by the general formulae (a1-1) to (a1-4) shown below.

[Chemical Formula 15]

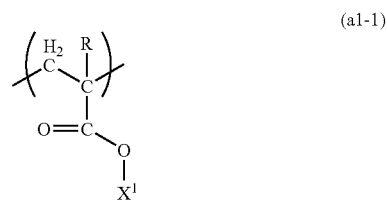

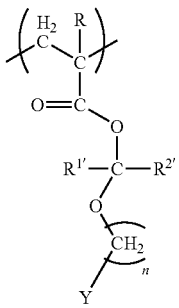

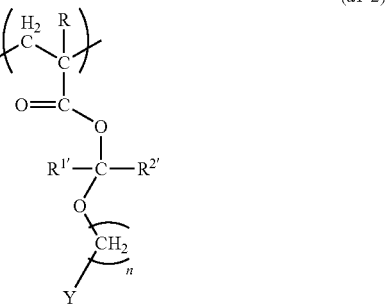

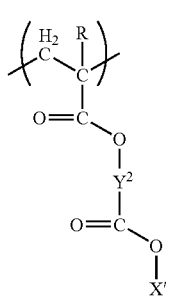

(a1-4)

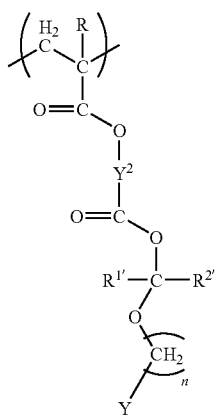

(In the formulae, X' represents a tertiary alkyl ester-type acid dissociable, dissolution inhibiting group; Y represents a lower alkyl group of 1 to 5 carbon atoms, or an aliphatic cyclic group; n represents an integer of 0 to 3; $Y^2$ represents a bivalent linking group; R is as defined above; and $R^{1\prime}$ and $R^{2\prime}$ each independently represents a hydrogen atom or a lower alkyl group of 1 to 5 carbon atoms.)

In the above formulae, as X', the same tertiary alkyl ester-type acid dissociable, dissolution inhibiting groups as those described in $X^1$ can be used.

$R^{1\prime}$, $R^{2\prime}$, n, and Y are respectively the same as $R^{1\prime}$, $R^{2\prime}$, n, and Y in the general formula (p1) described above in the explanation of "acetal-type acid dissociable, dissolution inhibiting group".

$Y^2$ is the same as $Y^2$ in the general formula (a1-0-2).

Specific examples of structural units represented by the general formulae (a1-1) to (a1-4) shown above include the following.

In each of the following formulae, $R^\alpha$ represents a hydrogen atom, a methyl group, or a trifluoromethyl group.

[Chemical Formula 16]

(a1-1-1)

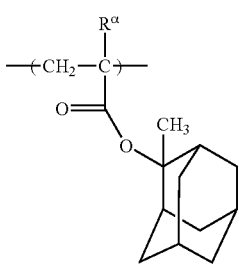

(a1-1-2)

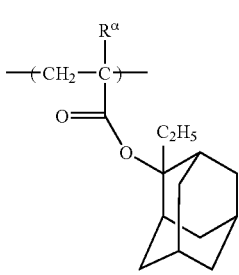

(a1-1-3)

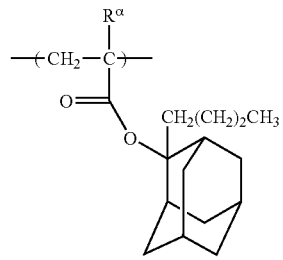

(a1-1-4)

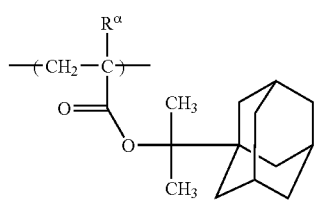

(a1-1-5)

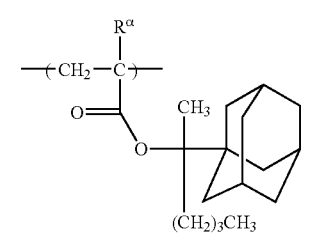

(a1-1-6)

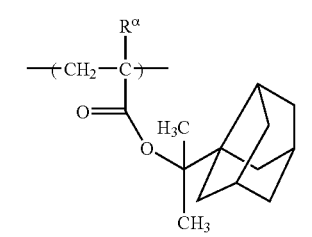

(a1-1-7)

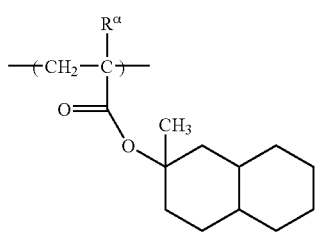

(a1-1-8)

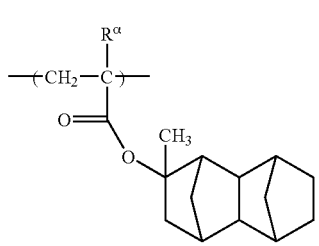

(a1-1-9)

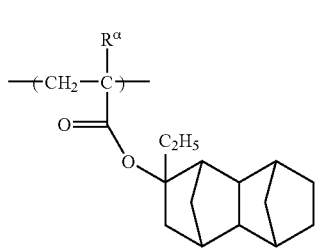

27
-continued
(a1-1-10)
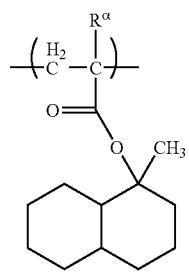
(a1-1-11)
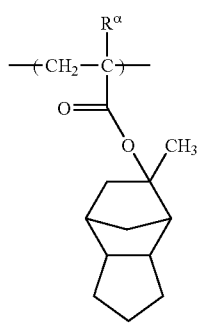
(a1-1-12)
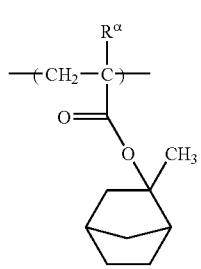
(a1-1-13)
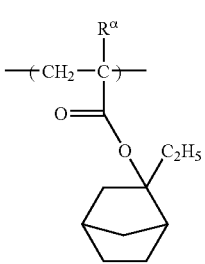
(a1-1-14)
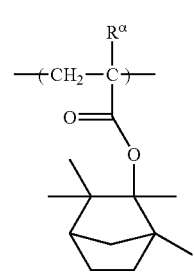
(a1-1-15)
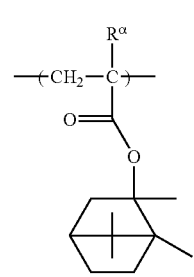
28
-continued
(a1-1-16)
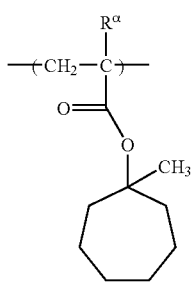
(a1-1-17)
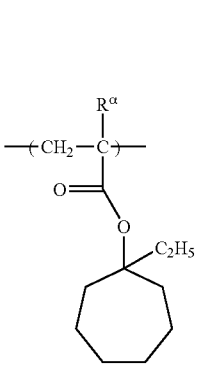
(a1-1-18)
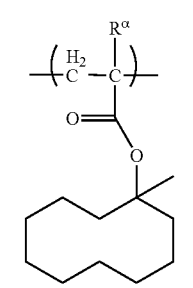
(a1-1-19)
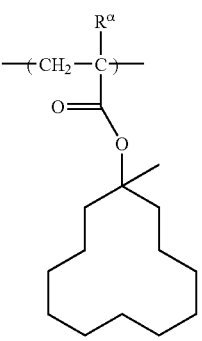
(a1-1-20)
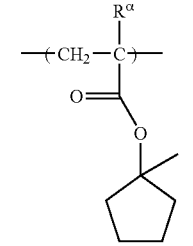

-continued
(a1-1-21)
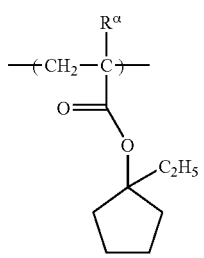
[Chemical Formula 17]
(a1-1-22)
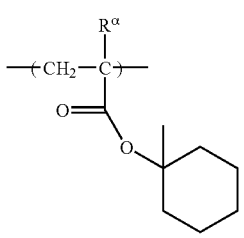
(a1-1-23)
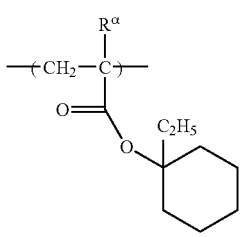
(a1-1-24)
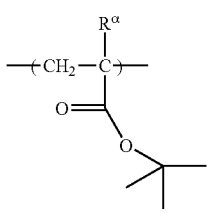
(a1-1-25)
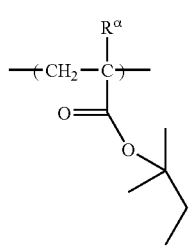
(a1-1-26)
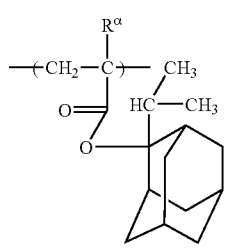
-continued
(a1-1-27)
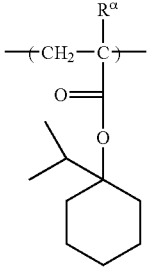
(a-1-1-28)
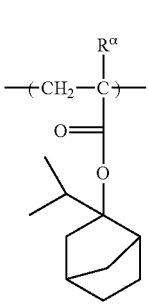
(a-1-1-29)
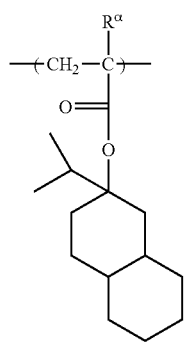
(a-1-1-30)
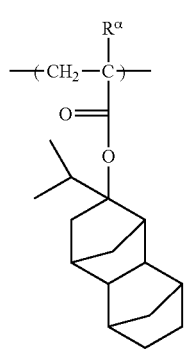
(a-1-1-31)
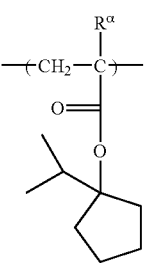

[Chemical Formula 18]
(a1-2-1)
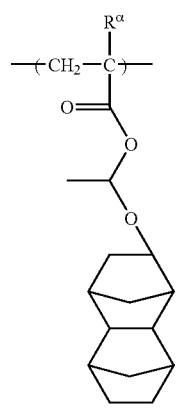
(a1-2-2)
(a1-2-3)
(a1-2-4)
(a-1-2-5)
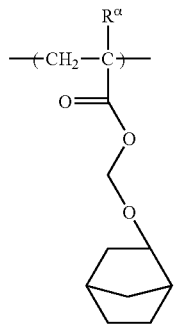
(a-1-2-6)
(a-1-2-7)
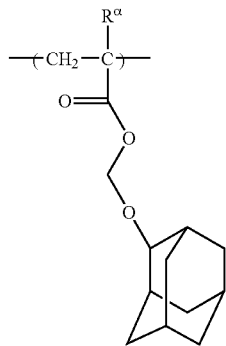
(a-1-2-8)
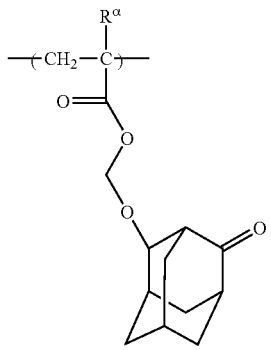

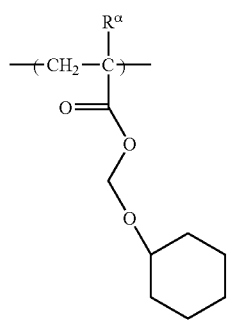 (a-1-2-9)
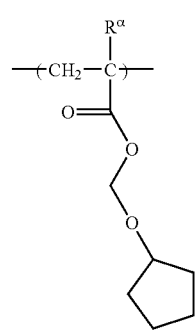 (a1-2-10)
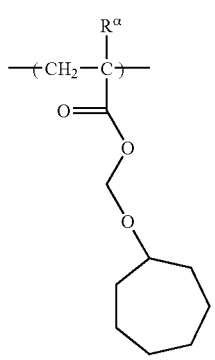 (a1-2-11)
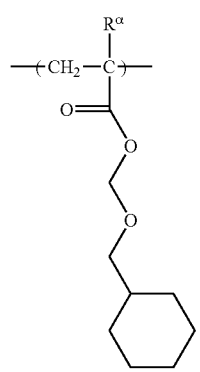 (a1-2-12)
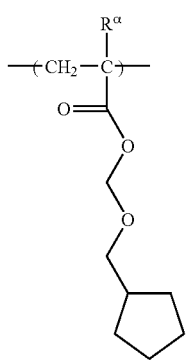 (a1-2-13)
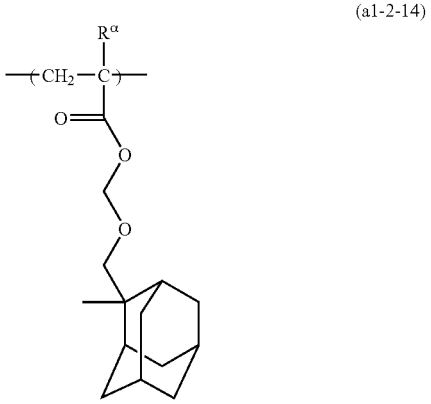 (a1-2-14)
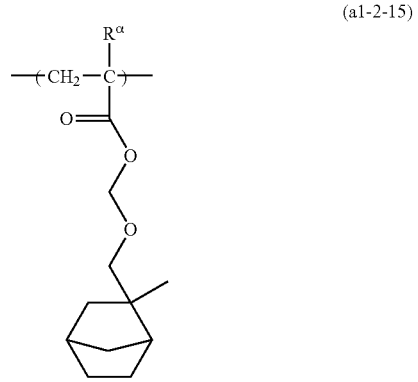 (a1-2-15)
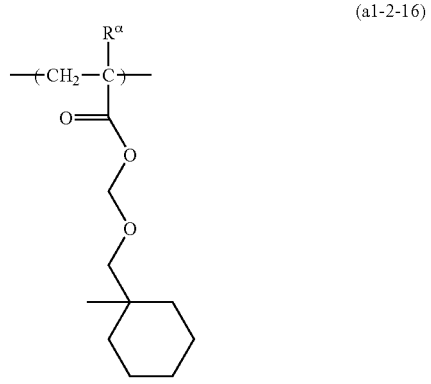 (a1-2-16)

(a1-2-17) 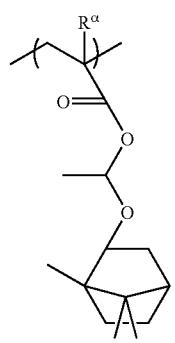
(a1-2-18) 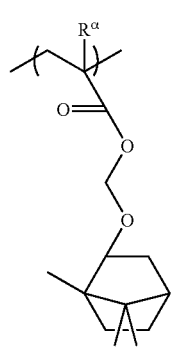
(a1-2-19) 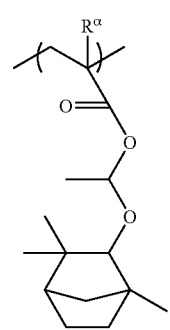
(a1-2-20) 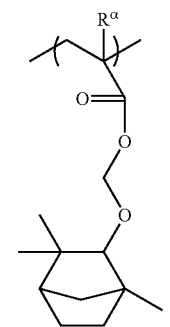
(a1-2-21) 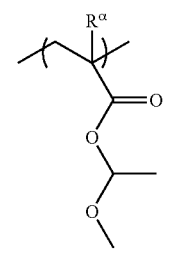
(a1-2-22) 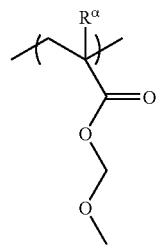
(a1-2-23) 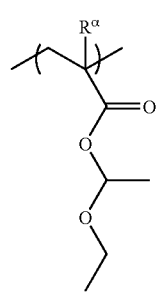
(a1-2-24) 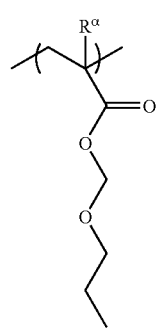
[Chemical Formula 19]
(a1-3-1) 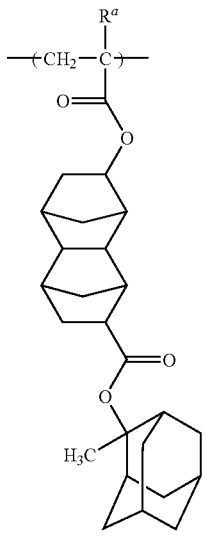

(a1-3-2)
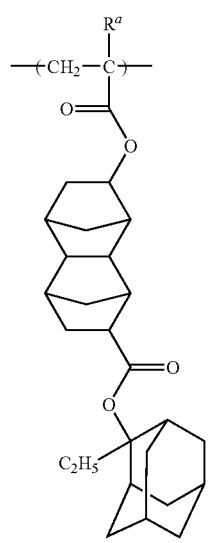
(a1-3-3)
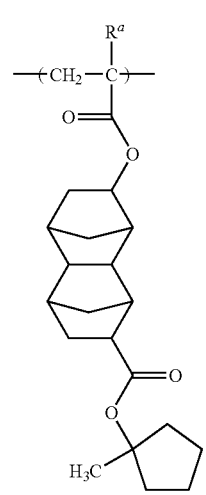
(a1-3-4)
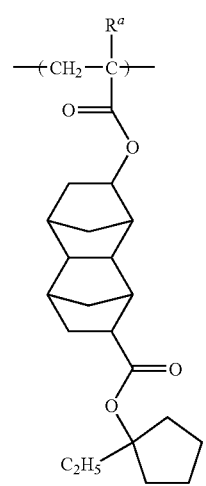
(a1-3-5)
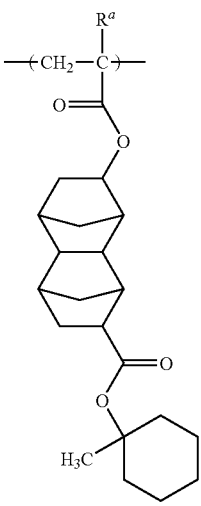
(a1-3-6)
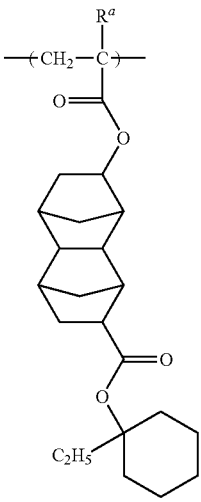
(a1-3-7)
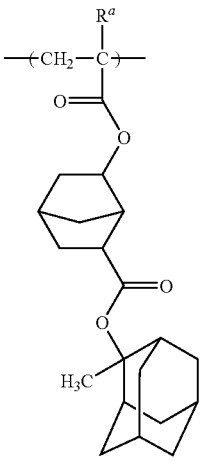

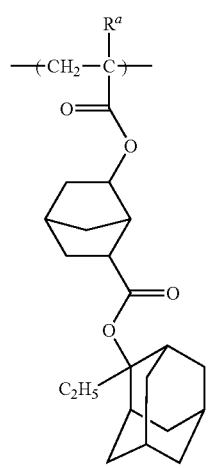 (a1-3-8)
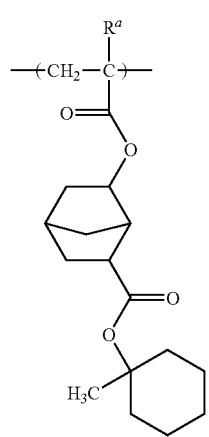 (a1-3-9)
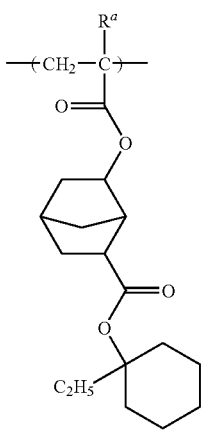 
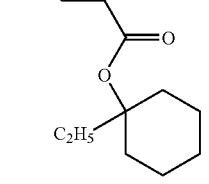 (a1-3-10)
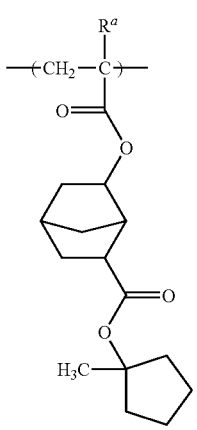 (a1-3-11)
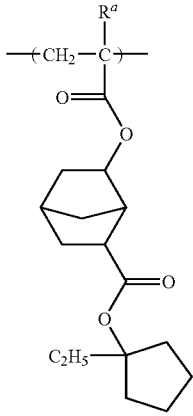 (a1-3-12)
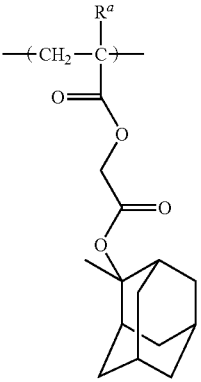 (a1-3-13)
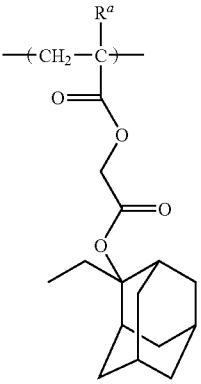 (a1-3-14)

[Chemical Formula 20]
(a1-3-15)
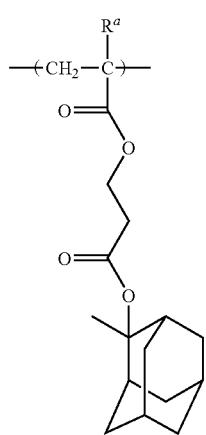
(a1-3-16)
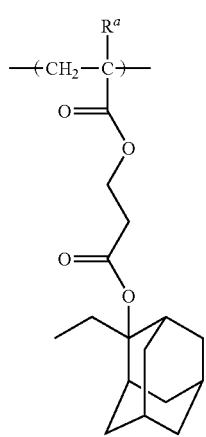
(a1-3-17)
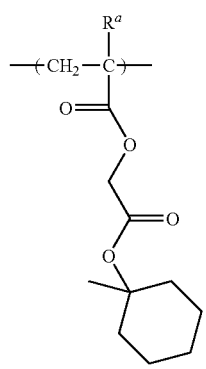
(a1-3-18)
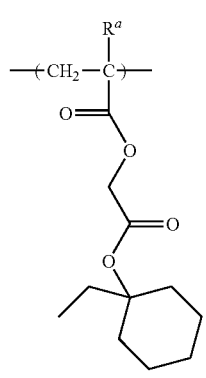
(a1-3-19)
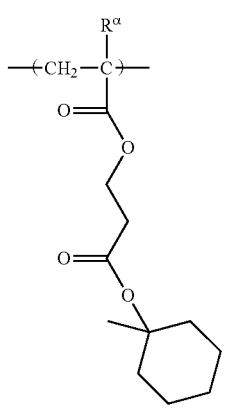
(a1-3-20)
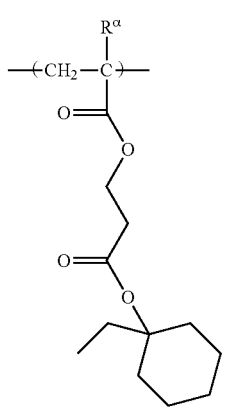
(a1-3-21)
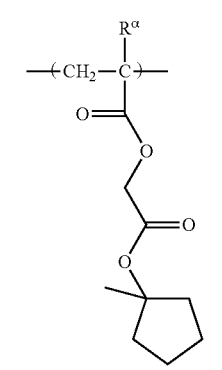
(a1-3-22)
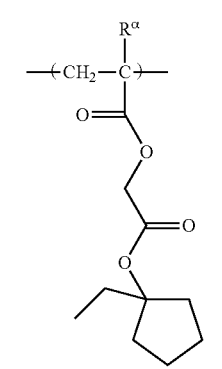

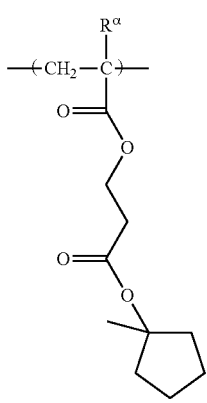
(a1-3-23)
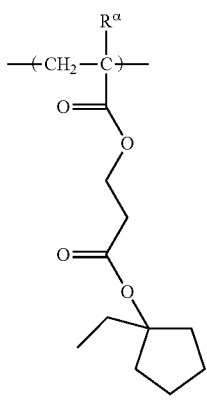
(a1-3-24)
[Chemical Formula 21]
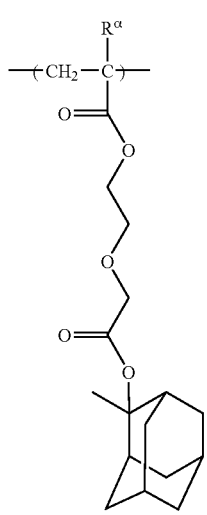
(a1-3-25)
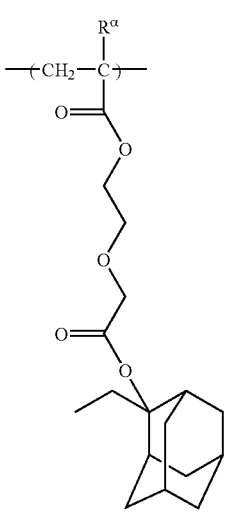
(a1-3-26)
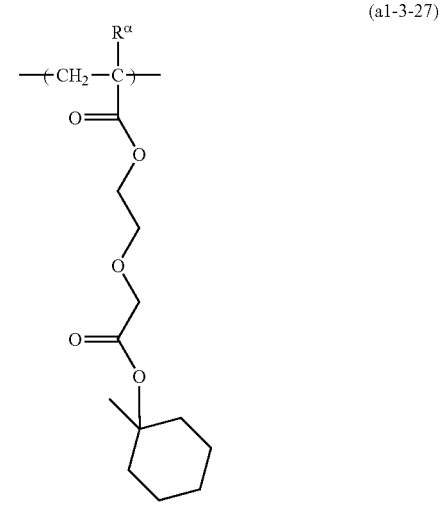
(a1-3-27)
(a1-3-28)

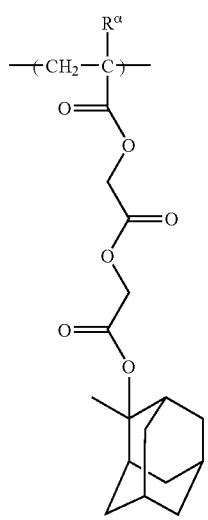 (a1-3-29)
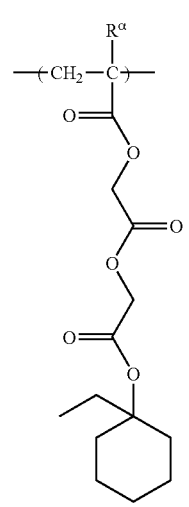 (a1-3-30)
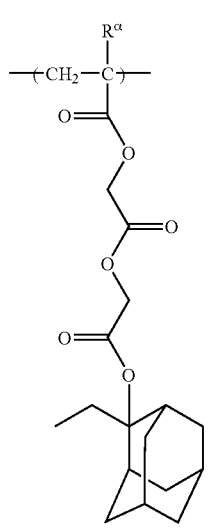 (a1-3-31)
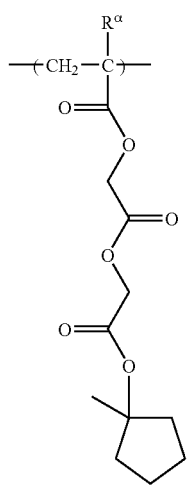 (a1-3-32)
[Chemical Formula 22]
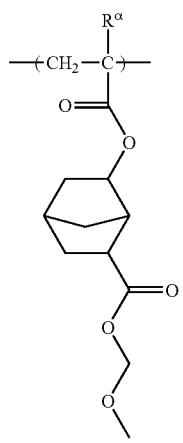 (a1-4-1)
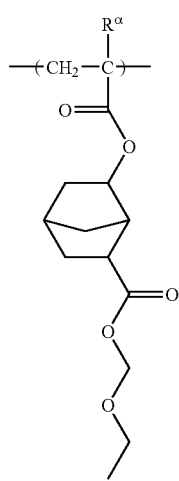 (a1-4-2)

(a1-4-3)
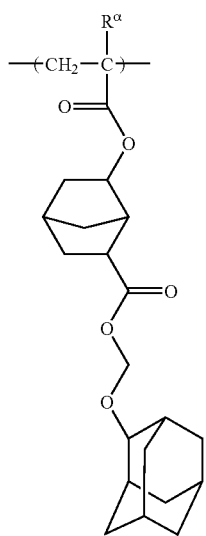
(a1-4-4)
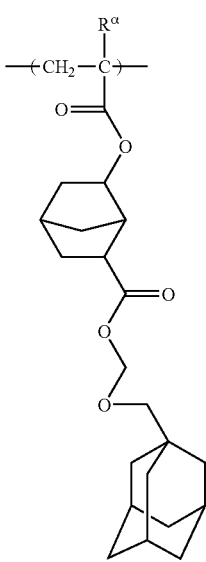
(a1-4-5)
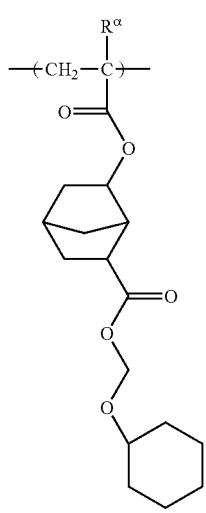
(a1-4-6)
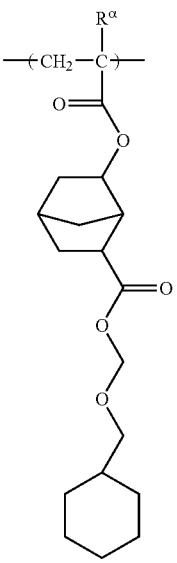
(a1-4-7)
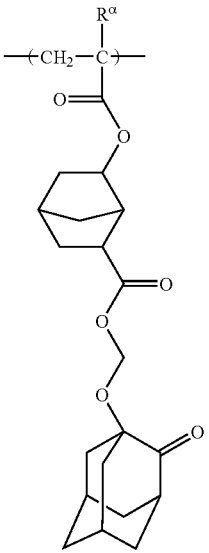
(a1-4-8)
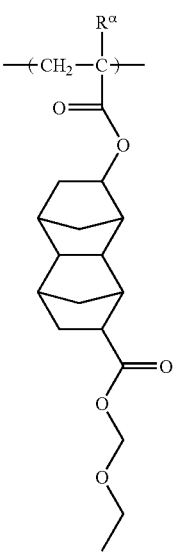

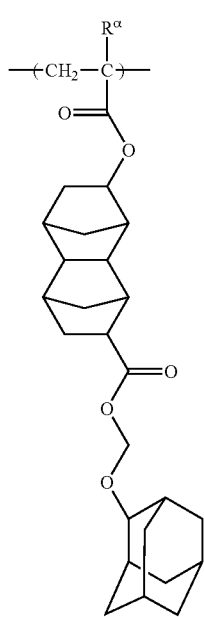 (a1-4-9)
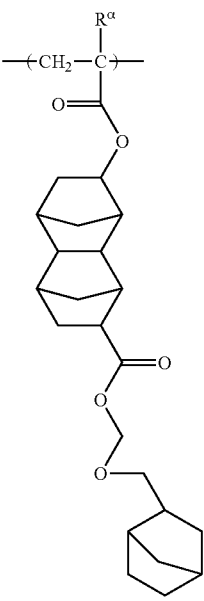 (a1-4-11)
(a1-4-10)
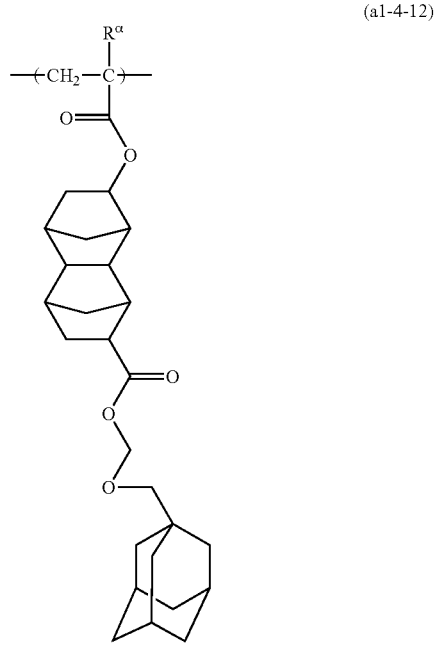 (a1-4-12)

(a1-4-13)
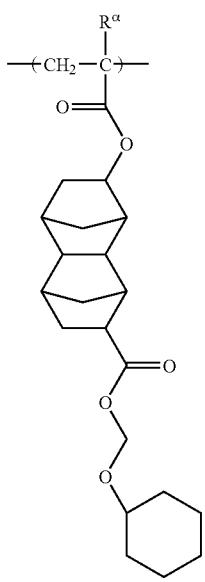

(a1-4-14)
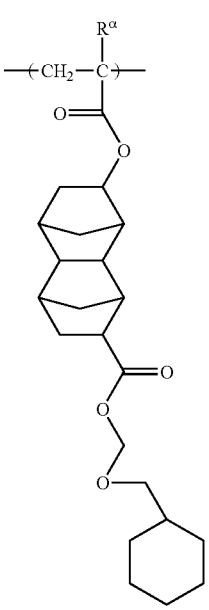

(a1-4-15)
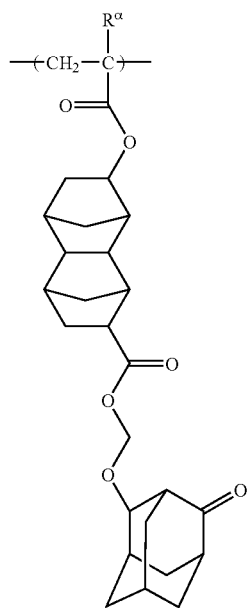

As the structural unit (a1), one type can be used alone, or two or more different types can be used in combination.

In the present invention, it is preferable to contain, as the structural unit (a1), at least one kind selected from the group consisting of a structural unit represented by the general formula (a1-0-11) shown below, a structural unit represented by the general formula (a1-0-12) shown below, and a structural unit represented by the general formula (a1-0-2) shown below, because it excels in lithography properties such as resolution and the resist pattern shape.

[Chemical Formula 23]

(a1-0-11)
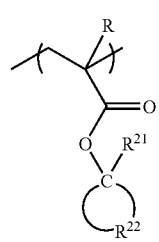

(a1-0-12)
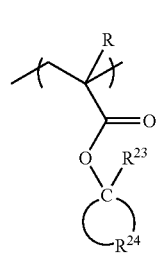

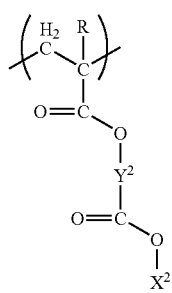

(a1-0-2)

(In the above formulae, R represents a hydrogen atom, a lower alkyl group, or a halogenated lower alkyl group; $R^{21}$ represents an alkyl group; $R^{22}$ represents a group which forms an aliphatic monocyclic group together with the carbon atom to which $R^{22}$ is bonded; $R^{23}$ represents a branched alkyl group; $R^{24}$ represents a group which forms an aliphatic polycyclic group together with the carbon atom to which $R^{24}$ is bonded; $Y^2$ represents a bivalent linking group; and $X^2$ represents an acid dissociable, dissolution inhibiting group.)

In each of the formulae, R, $Y^2$ and $X^2$ are respectively as defined above.

In the formula (a1-0-11), examples of the alkyl group for $R^{21}$ include the same alkyl groups as those for $R^{14}$ in the above formula (1-1) to (1-9), and of these, a methyl group or an ethyl group is preferable, and an ethyl group is most preferable.

Examples of the aliphatic monocyclic group formed by $R^{22}$ and the carbon atom to which $R^{22}$ is bonded include the same aliphatic monocyclic groups as those included in the aliphatic cyclic groups described above in the tertiary alkyl ester-type acid dissociable, dissolution inhibiting group. Specific examples thereof include a group in which one or more hydrogen atoms have been removed from a monocycloalkane. The monocycloalkane is preferably a 3 to 11-membered ring, more preferably a 3 to 8-membered ring, still more preferably 4 to 6-membered ring, and particularly preferably a 5 or 6-membered ring.

In the monocycloalkane, a part of carbon atoms constituting the ring may or may not be substituted with ether oxygen atom (—O—).

Also, the monocycloalkane may contain a lower alkyl group, a fluorine atom or a fluorinated alkyl group as a substituent.

Examples of $R^{22}$ constituting the aliphatic monocyclic group include a linear alkylene group in which an ether oxygen atom (—O—) may be positioned between carbon atoms.

Specific examples of the structural unit represented by the formula (a1-0-11) include structural units represented by the above formulae (a1-1-16) to (a1-1-23). Of these, a structural unit represented by the formula (a1-1-02) shown below which includes the structural units represented by the formulae (a1-1-16), (a1-1-17), and (a1-1-20) to (a1-1-23) is preferable. A structural unit represented by the formula (a1-1-02') shown below is also preferable.

In each of the formulae below, h is preferably 1 or 2, and most preferably 2.

[Chemical Formula 24]

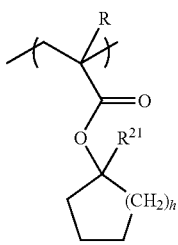

(a1-1-02)

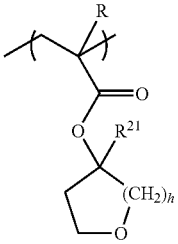

(a1-1-02')

(In the above formulae, R and $R^{21}$ are respectively as defined above; and h represents an integer of 1 to 3.)

In the formula (a1-0-12), examples of the branched alkyl group for $R^{23}$ include the same branched alkyl groups as those described for $R^{14}$ in the above formulae (1-1) to (1-9), and of these, an isopropyl group is most preferable.

Examples of the aliphatic polycyclic group formed by $R^{24}$ and the carbon atom to which $R^{24}$ is bonded include the same aliphatic polycyclic groups as those included in the aliphatic cyclic groups described above in the tertiary alkyl ester-type acid dissociable, dissolution inhibiting group.

Specific examples of the structural unit represented by the formula (a1-0-12) include structural units represented by the above formulae (a1-1-26) to (a1-1-31).

As the structural unit represented by the formula (a1-0-2), a structural unit represented by the above formula (a1-3) or (a1-4) can be used, and of these, a structural unit represented by the formula (a1-3) is particularly preferable.

The structural unit represented by the formula (a1-0-2) is particularly preferably a structural unit in which $Y^2$ in the formula is a group represented by -A-O—B— or -A-C(=O)—O—B—.

Preferable examples of such a structural unit include a structural unit represented by the general formula (a1-3-01) shown below, a structural unit represented by the general formula (a1-3-02) shown below, and a structural unit represented by the general formula (a1-3-03) shown below.

[Chemical Formula 25]

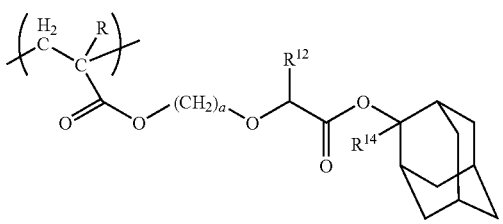

(a1-3-01)

(In the formula, R and $R^{14}$ are respectively as defined above; $R^{12}$ represents a hydrogen atom or a methyl group; and a represents an integer of 1 to 10.)

[Chemical Formula 26]

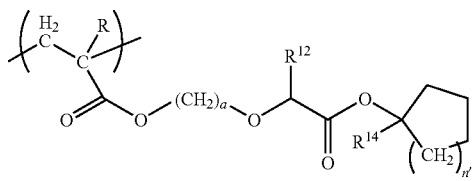
(a1-3-02)

(In the formula, R and $R^{14}$ are respectively as defined above; $R^{12}$ represents a hydrogen atom or a methyl group; a represents an integer of 1 to 10; and n' represents an integer of 0 to 3.)

[Chemical Formula 27]

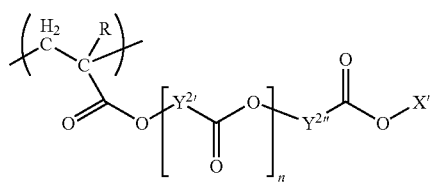
(a1-3-03)

(In the above formula, R is as defined above; $Y^{2'}$ and $Y^{2''}$ each independently represents a bivalent linking group; X' represents an acid dissociable, dissolution inhibiting group, and n represents an integer of 0 to 3.)

In the formulae (a1-3-01) and (a1-3-02), $R^{12}$ is preferably a hydrogen atom.

a is preferably an integer of 1 to 8, more preferably an integer of 1 to 5, and most preferably 1 or 2.

n' is preferably 1 or 2, and most preferably 2.

Specific examples of the structural unit represented by the formula (a1-3-01) include structural units represented by the above formulae (a1-3-25) to (a1-3-26).

Specific examples of the structural unit represented by the formula (a1-3-02) include structural units represented by the above formulae (a1-3-27) to (a1-3-28).

In the formula (a1-3-03), examples of the bivalent linking group for $Y^{2'}$ and $Y^{2''}$ include the same bivalent linking groups as those for $Y^2$ described above in the general formula (a1-3).

$Y^{2'}$ is preferably a bivalent hydrocarbon group which may contain a substituent, more preferably a linear aliphatic hydrocarbon group, and still more preferably a linear alkylene group. Of these, $Y^{2'}$ is particularly preferably a linear alkylene group of 1 to 5 carbon atoms, and most preferably a methylene group or an ethylene group.

$Y^{2''}$ is preferably a bivalent hydrocarbon group which may contain a substituent, more preferably a linear aliphatic hydrocarbon group, and still more preferably a linear alkylene group. Of these, $Y^{2''}$ is particularly preferably a linear alkylene group of 1 to 5 carbon atoms, and most preferably a methylene group or an ethylene group.

The acid dissociable, dissolution inhibiting group for X' is as defined above, preferably a tertiary alkyl ester-type acid dissociable, dissolution inhibiting group, and more preferably "(i) groups having a tertiary carbon atom within the ring skeleton of a monovalent aliphatic cyclic group" described above. Of these, a group represented by the general formula (1-1) is preferable.

n is an integer of 0 to 3, preferably 0 to 2, more preferably 0 or 1, and most preferably 1.

The structural unit represented by the formula (a1-3-03) is preferably a structural unit represented by the general formula (a1-3-03-1) or (a1-3-03-2) shown below. Of these, a structural unit represented by the formula (a1-3-03-1) is preferable, and particularly preferably a structural unit represented by the above formulae (a1-3-29) to (a1-3-30).

[Chemical Formula 28]

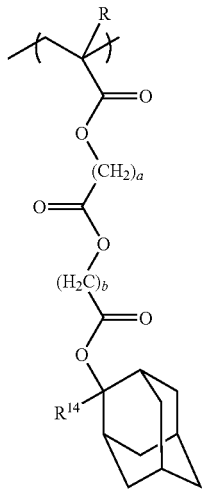
(a1-3-03-1)

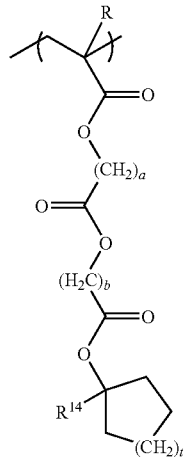
(a1-3-03-2)

(In the formula, R and $R^{14}$ are respectively as defined above; a represents an integer of 1 to 10; b represents an integer of 1 to 10; and t represents an integer of 0 to 3.)

a is preferably an integer of 1 to 5, and particularly preferably 1 or 2.

b is preferably an integer of 1 to 5, and particularly preferably 1 or 2.

t is preferably an integer of 1 to 3, and particularly preferably 1 or 2.

In the present invention, the component (A1) particularly preferably contains at least two kinds of the structural units (a1). By using two or more kinds of the structural units (a1) in combination, lithography properties can be further improved.

In this case, at least one kind among at least two kinds of the structural units (a1) is preferably at least one kind selected from the group consisting of structural units represented by the above general formula (a1-0-11), structural units represented by the general formula (a1-0-12), and structural units represented by the general formula (a1-0-2).

In this case, at least two kinds of the structural units (a1) may be composed of those selected from the group consisting of structural units represented by the above general formula (a1-0-11), structural units represented by the above general formula (a1-0-12), and structural units represented by the above general formula (a1-0-2); or may be constituted by a combination of at least one kind selected from these structural units and a structural unit (a1) which does not correspond with these structural units.

Examples of the structural unit (a1) which does not correspond with any of structural units represented by the general formulae (a1-0-11), (a1-0-12) and (a1-0-2), and can be used in combination with at least one kind selected from structural units represented by the general formulae (a1-0-11), (a1-0-12) and (a1-0-2), include: structural units represented by the general formula (a1-1-01) shown below which includes the formulae (a1-1-1) to (a1-1-2), and (a1-1-7) to (a1-1-15) described above as specific examples for the general formula (a1-1); structural units represented by the above general formula (a1-2); and structural units represented by the above general formula (a1-4).

The structural unit represented by the general formula (a1-1-01) is particularly preferably a structural unit represented by the general formula (a1-1-101) which includes the formulae (a1-1-1) to (a1-1-2).

[Chemical Formula 29]

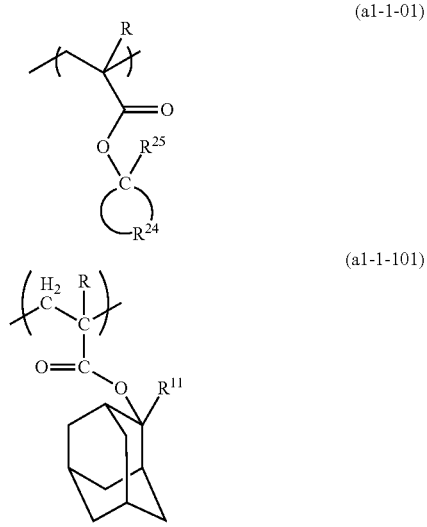

(In the formulae, R is as defined above; $R^{25}$ and $R^{11}$ each independently represents a linear alkyl group of 1 to 5 carbon atoms; and $R^{24}$ is as defined above.)

In the component (A1), the proportion of the structural unit (a1) is preferably 10 to 80 mol %, more preferably 20 to 70 mol %, and still more preferably 25 to 50 mol %, based on the combined total of all structural units constituting the component (A1). When this proportion is not less than the lower limit in the above range, then a pattern can be easily formed using a positive resist composition which includes the component (A1), whereas when the proportion is not more than the upper limit in the above range, a good quantitative balance with the other components can be attained.

(Structural Unit (a2))

Structural unit (a2) is a structural unit derived from an acrylate ester which has a lactone-containing cyclic group.

Here, the term "lactone-containing cyclic group" means a cyclic group containing a single ring (lactone ring) which has a "—O—C(O)—" structure. This lactone ring is counted as the first ring, and groups that contain only the lactone ring are referred to as monocyclic groups, whereas groups that also contain other ring structures are described as polycyclic groups regardless of the structure of the other rings.

In the case of using the component (A1) to form a resist film, the lactone-containing cyclic group of the structural unit (a2) is effective at improving the adhesion between the resist film and a substrate, and improving compatibility with a developing solution containing water.

The structural unit (a2) can be used arbitrarily without any particular restriction.

Specific examples of the lactone-containing monocyclic group include groups in which one hydrogen atom has been removed from a 4 to 6-membered lactone ring, such as a group in which one hydrogen atom has been removed from β-propiolactone, a group in which one hydrogen atom has been removed from γ-butyrolactone, and a group in which one hydrogen atom has been removed from δ-valerolactone. Furthermore, specific examples of the lactone-containing polycyclic group include groups in which one hydrogen atom has been eliminated from a bicycloalkane, a tricycloalkane, or a tetracycloalkane which contains a lactone ring.

Specific examples of the structural unit (a2) include structural units represented by the general formulae (a2-1) to (a2-5) shown below.

[Chemical Formula 30]

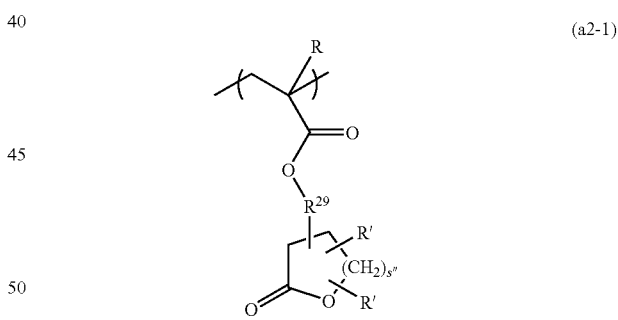

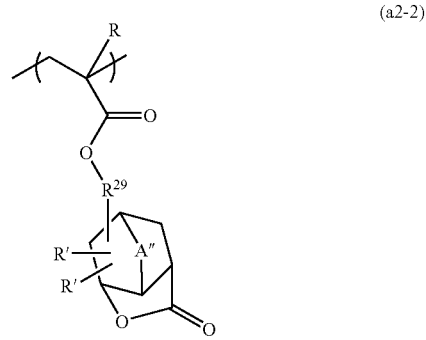

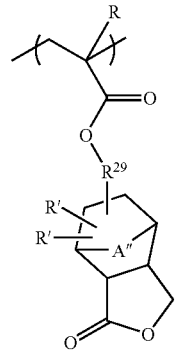
(a2-3)

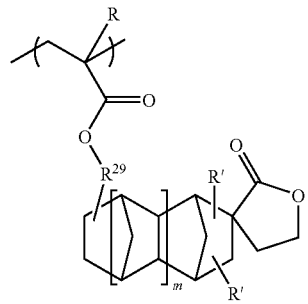
(a2-4)

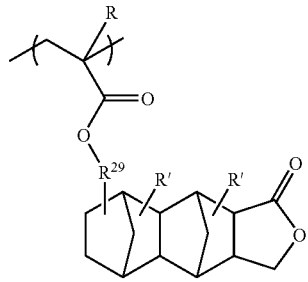
(a2-5)

(In the above formulae, R represents a hydrogen atom, a lower alkyl group or a halogenated lower alkyl group; each independently represents a hydrogen atom, an alkyl group of 1 to 5 carbon atoms, an alkoxy group of 1 to 5 carbon atoms, or —COOR", wherein R" represents a hydrogen atom or an alkyl group; $R^{29}$ represents a single bond or a bivalent linking group; s" represents an integer of 0 to 2; A" represents an oxygen atom, a sulfur atom, or an alkylene group of 1 to 5 carbon atoms which may contain an oxygen atom or a sulfur atom; and m represents an integer of 0 or 1.)

R in the general formula (a2-1) to (a2-5) is the same as R described above in the structural unit (a1).

Examples of the alkyl group of 1 to 5 carbon atoms for R' include a methyl group, an ethyl group, a propyl group, an n-butyl group, and a tert-butyl group.

Examples of the alkoxy group of 1 to 5 carbon atoms for R' include a methoxy group, an ethoxy group, an n-propoxy group, an iso-propoxy group, an n-butoxy group, and a tert-butoxy group.

In the general formulae (a2-1) to (a2-5), R' is preferably a hydrogen atom in terms of industrial availability.

The alkyl group for R" may be linear, branched or cyclic.

In the case that R" is a linear or branched alkyl group, the number of carbon atoms is preferably 1 to 10, and more preferably 1 to 5.

In the case that R" is a cyclic alkyl group, the number of carbon atoms is preferably 3 to 15, more preferably 4 to 12, and most preferably 5 to 10. Specific examples of the cyclic alkyl group include groups in which one or more hydrogen atoms have been removed from a monocycloalkane or a polycycloalkane such as a bicycloalkane, tricycloalkane or tetracycloalkane, in which a fluorine atom or a fluorinated alkyl group may or may not be included as a substituent. More specific examples thereof include groups in which one or more hydrogen atoms have been removed from a monocycloalkane such as cyclopentane or cyclohexane, and a polycycloalkane such as adamantane, norbornane, isobornane, tricyclodecane, or tetracyclododecane.

A" is preferably —O— or an alkylene group of 1 to 5 carbon atoms, more preferably an alkylene group of 1 to 5 carbon atoms, and most preferably a methylene group.

$R^{29}$ represents a single bond or a bivalent linking group. As the bivalent linking group, the same bivalent linking groups as those described in $R^2$ in the above general formula (a0-1) can be used, and of these, an alkylene group, an ester group (—C(=O)—O—), or a combination thereof is preferably used. The alkylene group as the bivalent linking group for $R^{29}$ is more preferably a linear or branched alkylene group. Specific examples thereof include the same linear alkylene groups and branched alkylene groups as those described above in $R^2$.

s" is preferably an integer of 1 or 2.

Specific examples of structural units represented by the above general formulae (a2-1) and (a2-5) include the following. In each of the following formulae, $R^\alpha$ represents a hydrogen atom, a methyl group, or a trifluoromethyl group.

[Chemical Formula 31]

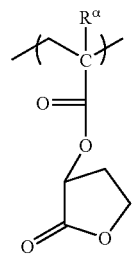
(a2-1-1)

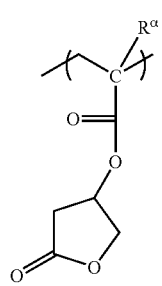
(a2-1-2)

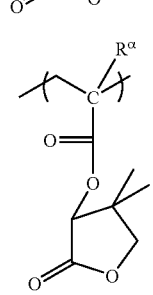
(a2-1-3)

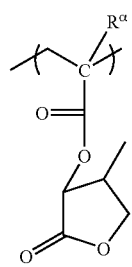 (a2-1-4)
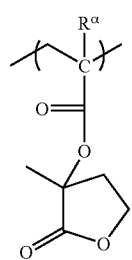 (a2-1-5)
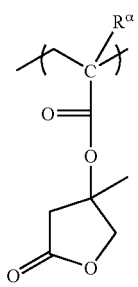 (a2-1-6)
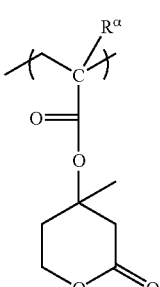 (a2-1-7)
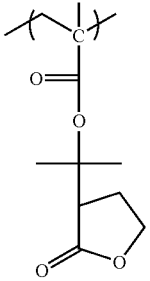 (a2-1-8)
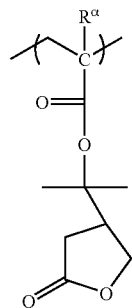 (a2-1-9)
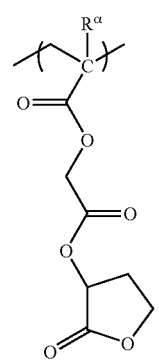 (a2-1-10)
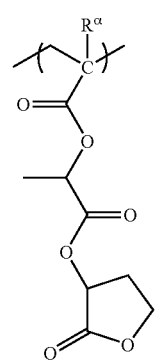 (a2-1-11)
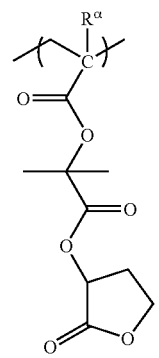 (a2-1-12)

(a2-1-13)
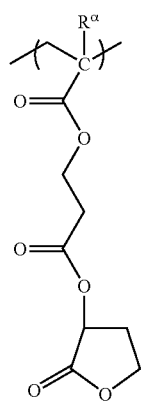
[Chemical Formula 32]
(a2-2-1)
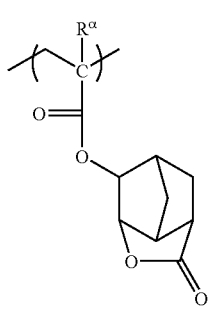
(a2-2-2)
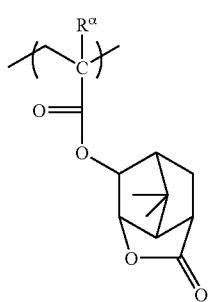
(a2-2-3)
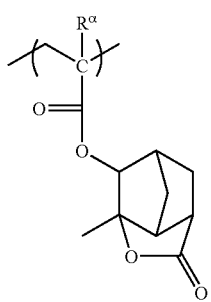
(a2-2-4)
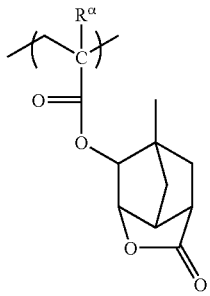
(a2-2-5)
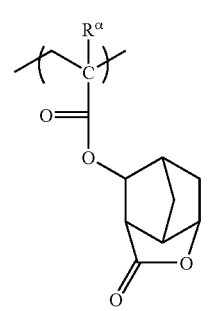
(a2-2-6)
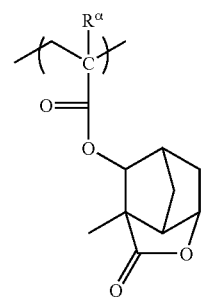
(a2-2-7)
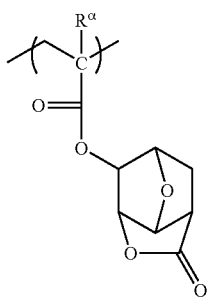
(a2-2-8)
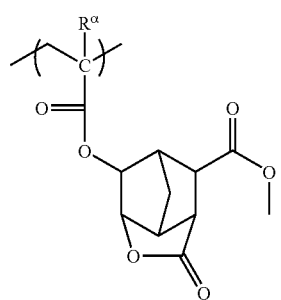

(a2-2-9)
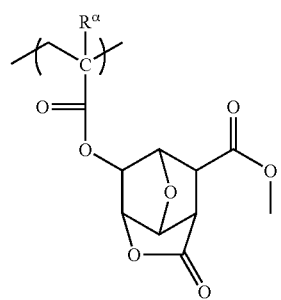
(a2-2-10)
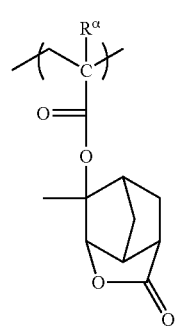
(a2-2-11)
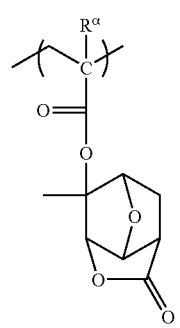
(a2-2-12)
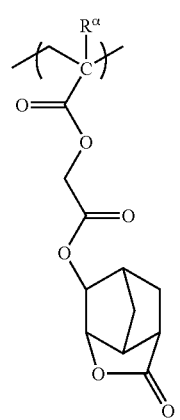
(a2-2-13)
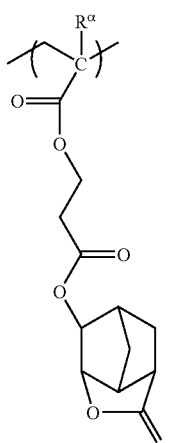
(a2-2-14)
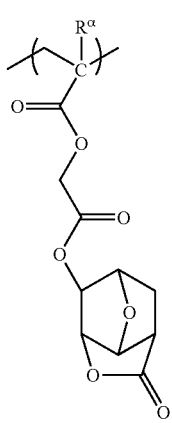
(a2-2-15)
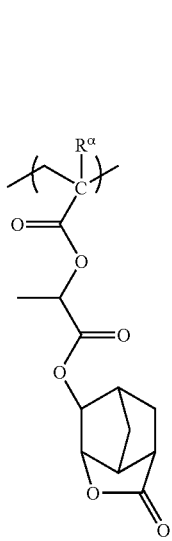

-continued
(a2-2-16)
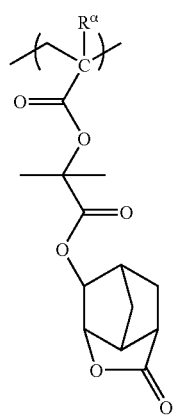
(a2-2-17)
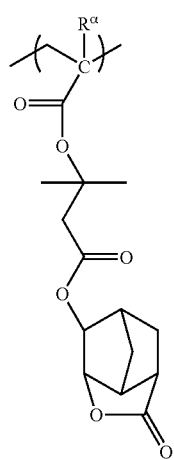
[Chemical Formula 33]
(a2-3-1)
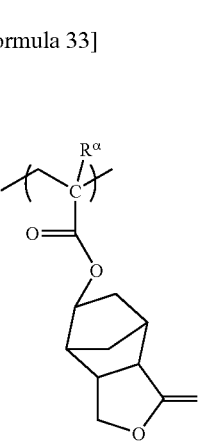
(a2-3-2)
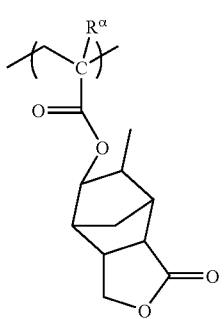
-continued
(a2-3-3)
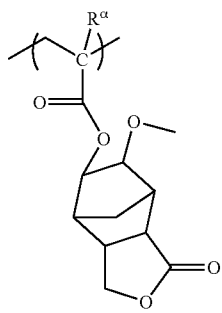
(a2-3-4)
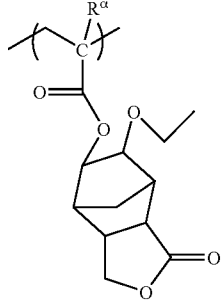
(a2-3-5)
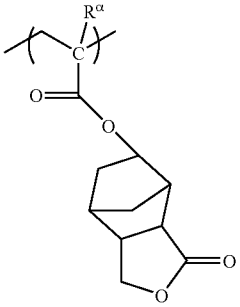
(a2-3-6)
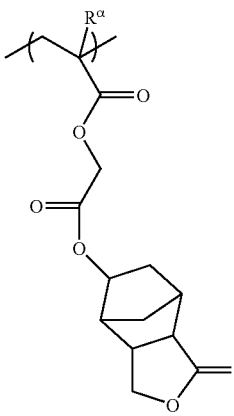

-continued
(a2-3-7)
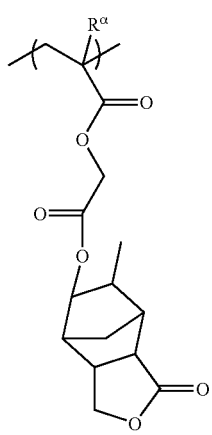
(a2-3-10)
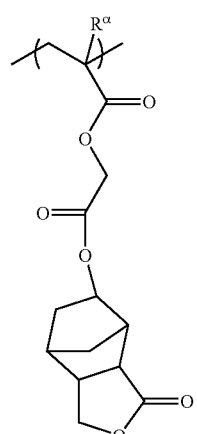
[Chemical Formula 34]
(a2-3-8)
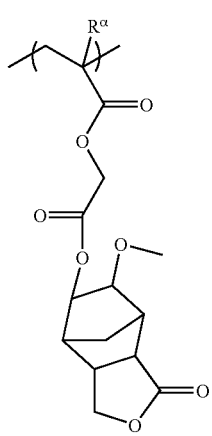
(a2-4-1)
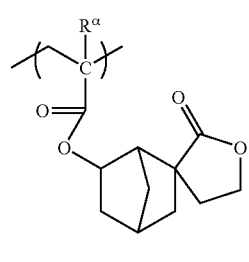
(a2-4-2)
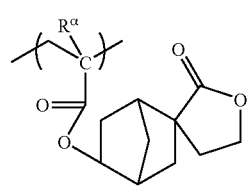
(a2-4-3)
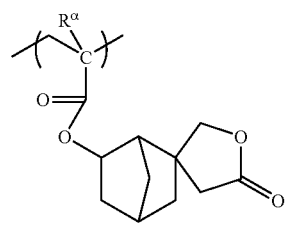
(a2-3-9)
(a2-4-4)
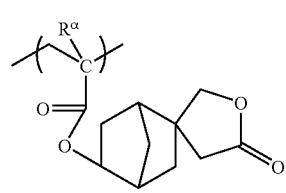
(a2-4-5)
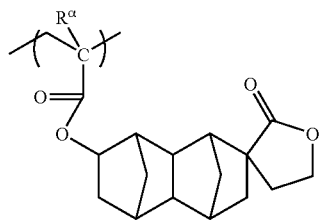

-continued
(a2-4-6)
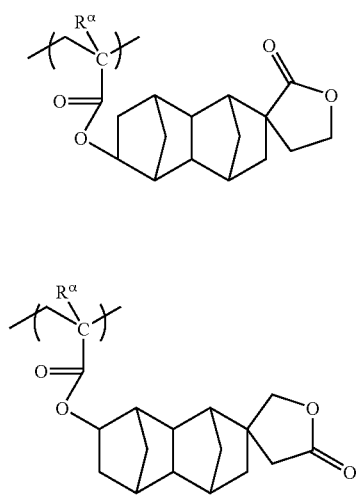
(a2-4-7)
(a2-4-8)
(a2-4-9)
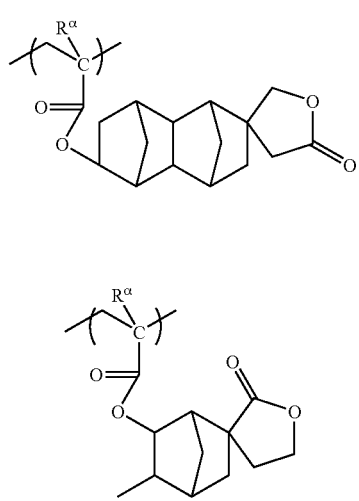
(a2-4-10)
(a2-4-11)
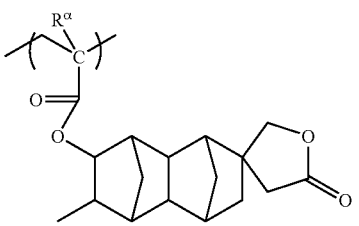
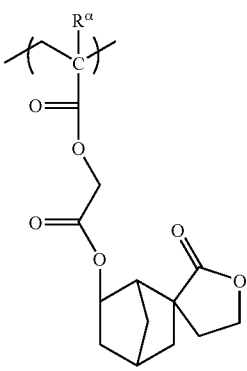
-continued
(a2-4-12)
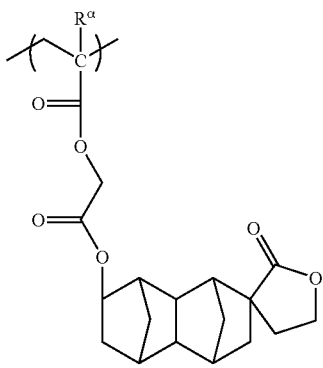
[Chemical Formula 35]
(a2-5-1)
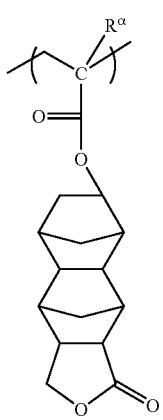
(a2-5-2)
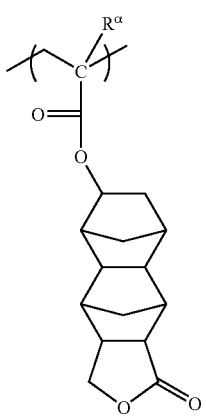

(a2-5-3)

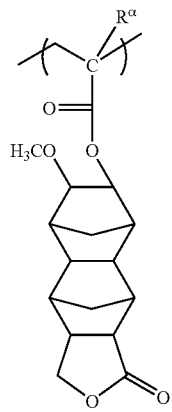

(a2-5-4)

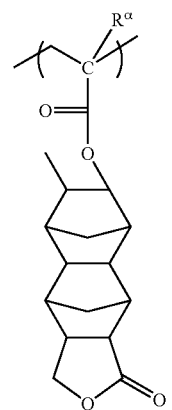

(a2-5-5)

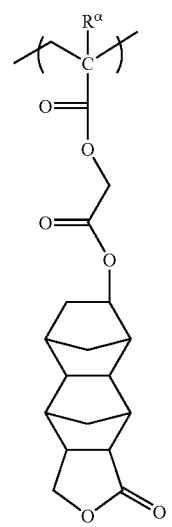

(a2-5-6)

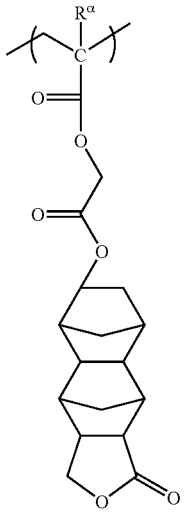

In the component (A1), as the structural unit (a2), one type may be used alone, or two or more types may be used in combination.

In the present invention, the component (A1) particularly preferably includes, as the structural unit (a2), at least one kind selected from the group consisting of structural units represented by the above general formula (a2-1) and structural units represented by the above general formula (a2-2).

In the component (A1), the proportion of the structural unit (a2) is preferably 1 to 50 mol %, more preferably 5 to 50 mol %, and still more preferably 10 to 45 mol %, based on the combined total of all structural units constituting the component (A1), because it excels in the adhesion between a resist film formed using a positive resist composition containing the component (A1) and a support such as a substrate, and also excels in the compatibility with a developing solution. When the proportion of the structural unit (a2) is within the above range, EL margin, DOF, LER and the pattern shape can be more excellent.

Furthermore, in the component (A1), the total proportion of the structural unit (a0) and the structural unit (a2) (if the component (A1) does not contain the structural unit (a2), the proportion of the structural unit (a0) only) is preferably 1 to 70 mol %, more preferably 5 to 70 mol %, still more preferably 10 to 65 mol %, and most preferably 20 to 65 mol %, based on the combined total of all structural units constituting the component (A1), because it excels in various lithography properties. When the proportion is within the above range, EL margin, DOF, LER and the pattern shape can be more excellent.

If the component (A1) contains both of the structural units (a0) and (a2), the proportion of each of the structural units (a0) and (a2) in the component (A1) is preferably the following. That is, the proportion of the structural unit (a0) is preferably 1 to 80 mol %, more preferably 10 to 75 mol %, and most preferably 15 to 65 mol %, and the proportion of the structural unit (a2) is preferably 1 to 45 mol %, more preferably 10 to 45 mol %, and most preferably 15 to 45 mol %.

(Structural Unit (a3))

Structural unit (a3) is a structural unit derived from an acrylate ester which has a polar group-containing aliphatic hydrocarbon group.

If the component (A1) includes the structural unit (a3), the hydrophilicity of the component (A) can be improved, and hence, the compatibility of the component (A) with the developing solution can be improved. As a result, the solubility of the exposed portions in an alkali developing solution can be improved, which contributes to favorable improvements in the resolution.

Examples of the polar group include a hydroxyl group, a cyano group, a carboxyl group, and a hydroxyalkyl group in which a part of the hydrogen atoms in an alkyl group is substituted with fluorine atoms. Of these, a hydroxyl group is particularly preferable.

Examples of the aliphatic hydrocarbon group include a linear or branched hydrocarbon group of 1 to 10 carbon atoms (preferably an alkylene group), and a polycyclic aliphatic hydrocarbon group (polycyclic group). The polycyclic group can be appropriately selected from the multitude of polycyclic groups proposed within resins in resist compositions for ArF excimer lasers and the like. The polycyclic group preferably has 7 to 30 carbon atoms.

Of these, a structural unit derived from an acrylate ester having the polycyclic aliphatic group which contains a hydroxyl group, cyano group, a carboxyl group, or a hydroxyalkyl group in which a part of the hydrogen atoms within an alkyl group has been substituted with fluorine atoms is more preferable. Examples of the polycyclic group include groups in which two or more hydrogen atoms have been removed from a bicycloalkane, a tricycloalkane, a tetracycloalkane, or the like. Specific examples include a group in which two or more hydrogen atoms have been removed from a polycycloalkane such as adamantane, norbornane, isobornane, tricyclodecane, or tetracyclododecane. Of these polycyclic groups, a group in which two or more hydrogen atoms have been removed from adamantane, norbornane, or tetracyclododecane is industrially preferable.

As the structural unit (a3), for example, a structural unit derived from a hydroxyethyl ester of acrylic acid is preferable, when the hydrocarbon group within the polar group-containing aliphatic hydrocarbon group is a linear or branched hydrocarbon group of 1 to 10 carbon atoms. On the other hand, a structural unit represented by the general formula (a3-1), (a3-2), or (a3-3) shown below is preferable, when the hydrocarbon group is a polycyclic group.

[Chemical Formula 36]

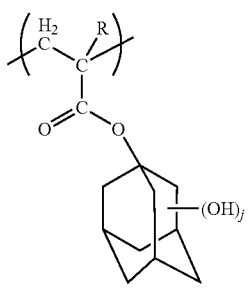
(a3-1)

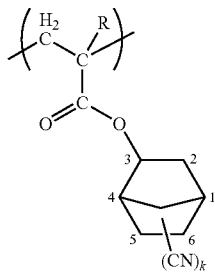
(a3-2)

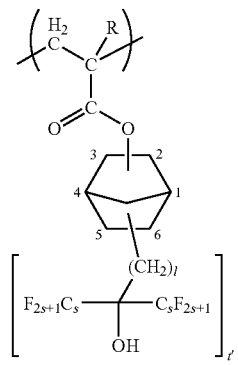
(a3-3)

(In the formulae, R is as defined above; j represents an integer of 1 to 3; k represents an integer of 1 to 3; t' represents an integer of 1 to 3; l represents an integer of 1 to 5; and s represents an integer of 1 to 3.)

In the general formula (a3-1), j is preferably 1 or 2, and more preferably 1. In the case that j be 2, a structural unit in which the hydroxyl groups are bonded to the 3-position and 5-position of the adamantyl group is preferable. In the case that j be 1, a structural unit in which the hydroxyl group is bonded to the 3-position of the adamantyl group is preferable.

Of these, j is preferably 1, and a structural unit in which the hydroxyl group is bonded to the 3-position of the adamantyl group is particularly preferable.

In the general formula (a3-2), k is preferably 1. In the general formula (a3-2), a cyano group is preferably bonded to the 5-position or 6-position of the norbornyl group.

In the general formula (a3-3), t' is preferably 1. l is preferably 1. s is preferably 1. Further, in the general formula (a3-3), it is preferable that a 2-norbonyl group or 3-norbonyl group be bonded to the terminal of the carboxyl group of the acrylic acid. It is preferable that a fluorinated alkyl alcohol within brackets [ ] in the formula (a3-3) be bonded to the 5-position or 6-position of the norbornyl group.

As the structural unit (a3), one type can be used alone, or two or more different types can be used in combination.

In the component (A1), the proportion of the structural unit (a3) is preferably 5 to 50 mol %, more preferably 5 to 40 mol %, and still more preferably 5 to 25 mol %, based on the combined total of all structural units constituting the component (A1). When this proportion is not less than the lower limit in the above range, then the effect made by containing the structural unit (a3) can be sufficiently obtained. When the proportion is not more than the upper limit in the above range, a good quantitative balance with the other structural units can be attained.

(Other Structural Units)

The copolymer (A1) may also have a structural unit (hereinafter, referred to as structural unit (a4)) which is different from the above-mentioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers, KrF excimer lasers or the like (and particularly for ArF excimer lasers) can be used.

The structural unit (a4) is preferably, for example, a structural unit derived from an acrylate ester containing a non-acid dissociable aliphatic polycyclic group. Examples of the polycyclic group include the same polycyclic groups as those described above in the structural unit (a1), and any of the multitude of conventional polycyclic groups used within the resin component of positive resist compositions for ArF excimer lasers, KrF excimer lasers or the like (and preferably for ArF excimer lasers) can be used.

In particular, at least one group selected from the group consisting of a tricyclodecanyl group, an adamantyl group, a tetracyclododecanyl group, an isobornyl, group, and a norbornyl group is preferable in terms of industrial availability and the like. These polycyclic groups may contain a linear or branched alkyl group of 1 to 5 carbon atoms as a substituent.

Specific examples of the structural unit (a4) include a structural unit represented by the general formulae (a4-1) to (a4-5) shown below.

[Chemical Formula 37]

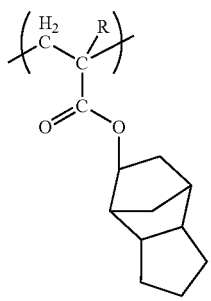
(a4-1)

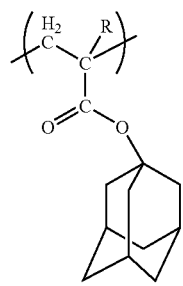
(a4-2)

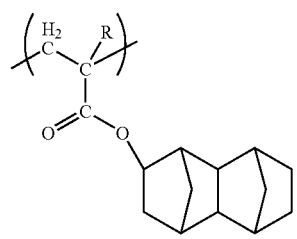
(a4-3)

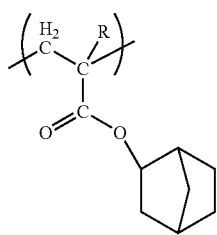
(a4-4)

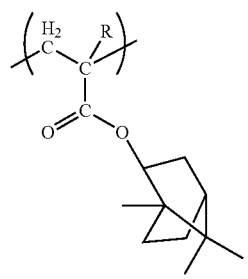
(a4-5)

(In the formula, R is as defined above.)

When the structural unit (a4) is included in the component (A1), the proportion of the structural unit (a4) is preferably within the range of 1 to 30 mol %, and more preferably 10 to 20 mol %, based on the combined total of all the structural units that constitute the component (A1).

The component (A1) is preferably a copolymer containing the structural units (a0) and (a1).

Examples of the copolymer include a copolymer consisting of the above structural units (a0) and (a1); a copolymer consisting of the above structural units (a0), (a1) and (a3); a copolymer consisting of the above structural units (a0), (a1) and (a2); and a copolymer consisting of the above structural units (a0), (a1), (a2) and (a3).

In the present invention, it is particularly preferable that these copolymers contain, as the structural unit (a1), at least one kind selected from the group consisting of the structural unit represented by the above general formula (a1-0-11), the structural unit represented by the general formula (a1-0-12), and the structural unit represented by the above general formula (a1-1-01).

Also, as described above, it is preferable that the above copolymer contain at least two kinds of the structural unit (a1). Of the at least two kinds, it is preferable that at least one kind be a structural unit selected from the group consisting of structural units represented by the above general formula (a1-0-11) and structural units represented by the above general formula (a1-0-12), and it is more preferable that all of the at least two kinds be structural units selected from the above group.

In the present invention, the component (A1) preferably includes five kinds of structural units represented by the general formula (A1-11) shown below or the general formula (A1-12) shown below.

[Chemical Formula 38]

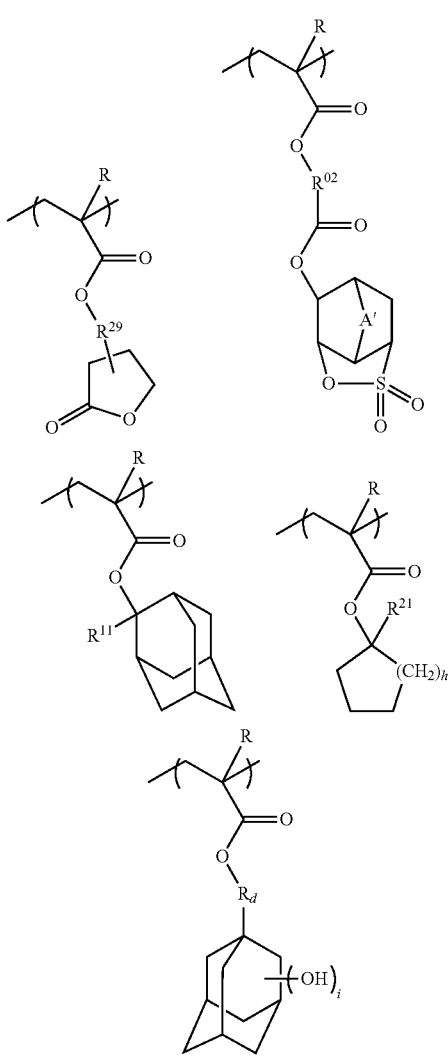

(A1-11)

(In the formula, R, $R^{29}$, $R^{02}$, A', $R^{11}$, $R^{21}$, h and i are respectively as defined above; a plurality of R may be the same as or different from one another; and Rd represents a single bond or a bivalent linking group, and is as defined for $R^{29}$.)

[Chemical Formula 39]

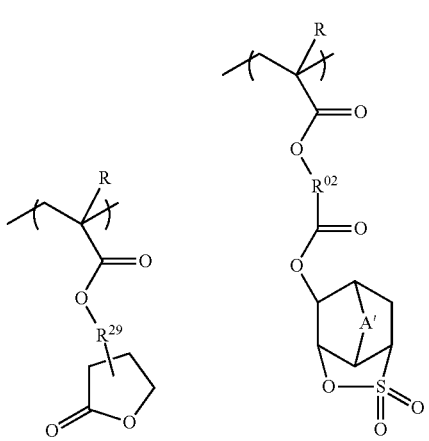

(A1-12)

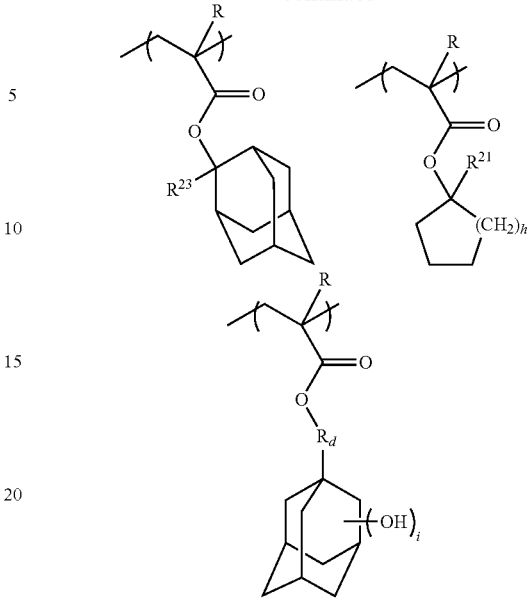

(In the formula, R, $R^{29}$, $R^{02}$, A', $R^{23}$, $R^{21}$, h and i are respectively as defined above; a plurality of R may be the same as or different from one another; and Rd represents a single bond or a bivalent linking group, and is as defined for $R^{29}$.)

Also, the component (A1) preferably includes four kinds of structural units represented by the general formula (A1-13) shown below.

[Chemical Formula 40]

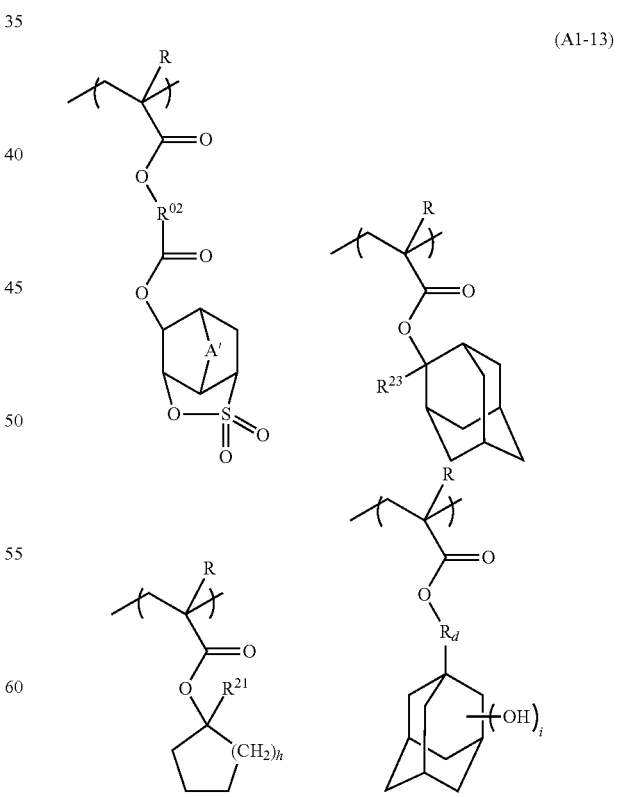

(A1-13)

(In the formula, R, $R^{02}$, A', $R^{23}$, $R^{21}$, h and i are respectively as defined above; a plurality of R may be the same as or different from one another; and Rd represents a single bond or a bivalent linking group, and is as defined for $R^{29}$.)

The weight average molecular weight (Mw) (the polystyrene equivalent value determined by gel permeation chromatography) of the component (A1) is not particularly limited, and is preferably 2,000 to 50,000, more preferably 3,000 to 30,000, and most preferably 5,000 to 20,000. By ensuring that the weight average molecular weight of the component (A1) is not more than the upper limit, solubility sufficient for a resist relative to a resist solvent can be obtained. By ensuring that it is not less than the lower limit, excellent dry-etching resistance and excellent cross-sectional shape of the resist pattern can be obtained.

Further, the dispersity (Mw/Mn) is preferably within a range from 1.0 to 5.0, more preferably from 1.0 to 3.0, and most preferably from 1.2 to 2.5. Herein, Mn means the number average molecular weight.

As the component (A1) in the component (A), one kind may be used alone, or two or more kinds may be used in combination.

The proportion of the component (A1) in the component (A) is preferably at least 25% by weight, more preferably at least 50% by weight, still more preferably at least 75% by weight, and may be 100% by weight. When the proportion of the component (A1) is 25% by weight or more, effects such as lithography properties can be improved.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—CH$_2$—CH$_2$—CH$_2$—C(CF$_3$)$_2$—OH, a —C(CF$_3$)$_2$—OH group can be introduced at the terminals of the component (A1). When a hydroxyalkyl group in which a part of the hydrogen atoms of the alkyl group has been substituted with fluorine atoms is introduced into a copolymer in this manner, the copolymer thus obtained can have an advantageous effect of reducing the levels of developing defects and LER (line edge roughness: unevenness of the line side walls of a line pattern).

The monomer which corresponds with each of the structural units may be a commercially available compound, or may be synthesized by using a conventional method.

For example, examples of the monomer which corresponds with the structural unit (a0) include compounds represented by the general formula (a0-1-0) shown below (hereinafter, referred to as "compound (a0-1-0)").

[Chemical Formula 41]

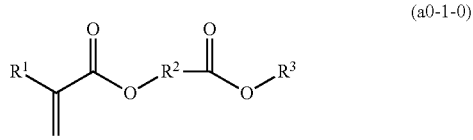

(a0-1-0)

(In the formula (a0-1-0), $R^1$ to $R^3$ are respectively as defined above.)

There are no particular restrictions on the manufacturing method of the compound (a0-1-0), and it can be manufactured by using a conventional method.

For example, the compound (X-2) represented by the general formula (X-2) shown below is added to a solution in which the compound (X-1) represented by the general formula (X-1) shown below is dissolved in a reaction solvent in the presence of a base, and then reacted, thereby obtaining the compound (a0-1-0).

Examples of the base include inorganic bases such as sodium hydroxide, K$_2$CO$_3$, and Cs$_2$CO$_3$; and organic bases such as triethylamine, 4-dimethylaminopyridine (DMAP), and pyridine. Examples of condensing agents include carbodiimide reagents such as ethyldiisopropylaminocarbodiimide (EDCI) hydrochloride, dicyclohexylcarboxyimide (DCC), diisopropylcarbodiimide and carbodiimidazole; tetraethyl pyrophosphate; and benzotriazole-N-hydroxytrisdimethylaminophosphonium hexafluorophosphide (Bop reagent).

Also, an acid may be used if necessary. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids may be used alone, or in a combination of two or more.

[Chemical Formula 42]

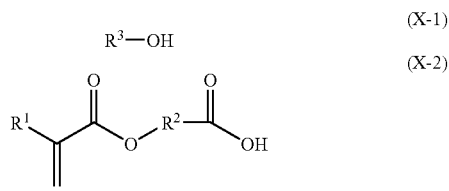

(X-1)
(X-2)

The positive resist composition of the present invention may include, as the component (A), a base component (hereinafter, referred to as "component (A2)") which does not correspond with the component (A1) and exhibits increased solubility in an alkali developing solution under action of an acid.

There is no particular restriction on the component (A2), and any of the multitude of conventional base components used for a chemically-amplified positive resist composition (for example, base resins for ArF excimer lasers or KrF excimer lasers (and preferably for ArF excimer lasers)), arbitrarily selected, can be used. Examples of the base resin for ArF excimer lasers include those which contain the aforementioned structural unit (a1) as an indispensable structural unit, and arbitrarily contains the aforementioned structural units (a2) to (a4). Also, the component (A2) may contain a non-polymer (low molecular weight compound) having a molecular weight of 500 to less than 4,000.

As the component (A2), one type may be used alone, or two or more types may be used in combination.

In the positive resist composition of the present invention, the content of the component (A) may be adjusted according to the thickness of the resist film to be formed.

<Component (B)>

There is no particular restriction on the component (B), and those proposed as acid generators for conventional chemically-amplified resists can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators; and disulfone-based acid generators.

As an onium salt-based acid generator, for example, an acid generator represented by the general formula (b-1) or (b-2) shown below can be used.

[Chemical Formula 43]

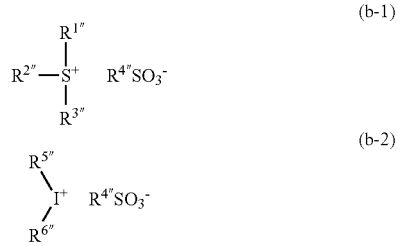

(In the formulae, $R^{1\prime\prime}$ to $R^{3\prime\prime}$, $R^{5\prime\prime}$ and $R^{6\prime\prime}$ each independently represents an aryl group which may contain a substituent or an alkyl group which may contain a substituent; two of $R^{1\prime\prime}$ to $R^{3\prime\prime}$ in the formula (b-1) may mutually be bonded to form a ring together with the sulfur atom in the formula; $R^{4\prime\prime}$ represents an alkyl group which may contain a substituent, a halogenated alkyl group which may contain a substituent, an aryl group which may contain a substituent, or an alkenyl group which may contain a substituent; at least one of $R^{1\prime\prime}$ to $R^{3\prime\prime}$ represents an aryl group; and at least one of $R^{5\prime\prime}$ and $R^{6\prime\prime}$ represents an aryl group.)

In the general formula (b-1), $R^{1\prime\prime}$ to $R^{3\prime\prime}$ each independently represents an aryl group which may contain a substituent or an alkyl group which may contain a substituent. Here, two of $R^{1\prime\prime}$ to $R^{3\prime\prime}$ in the formula (b-1) may mutually be bonded to form a ring together with the sulfur atom in the formula.

Also, at least one of $R^{1\prime\prime}$ to $R^{3\prime\prime}$ represents an aryl group. Two or more of $R^{1\prime\prime}$ to $R^{3\prime\prime}$ are preferably aryl groups, and all of $R^{1\prime\prime}$ to $R^{3\prime\prime}$ are most preferably aryl groups.

There is no particular restriction on the aryl group for $R^{1\prime\prime}$ to $R^{3\prime\prime}$. For example, the aryl group is an aryl group of 6 to 20 carbon atoms, and a part of or all of hydrogen atoms in the aryl group may be substituted with an alkyl group, an alkoxy group, a halogen atom, a hydroxyl group or the like, or may not be substituted.

The aryl group is preferably an aryl group of 6 to 10 carbon atoms because it can be synthesized inexpensively. Specific examples thereof include a phenyl group and a naphthyl group.

In the aryl group, the alkyl group with which hydrogen atoms may be substituted is preferably an alkyl group of 1 to 5 carbon atoms, and most preferably a methyl group, an ethyl group, a propyl group, an n-butyl group, or a tert-butyl group.

In the aryl group, the alkoxy group with which hydrogen atoms may be substituted is preferably an alkoxy group of 1 to 5 carbon atoms, and more preferably a methoxy group, an ethoxy group, an n-propoxy group, an iso-propoxy group, an n-butoxy group, or a tert-butoxy group, and most preferably a methoxy group or an ethoxy group.

In the aryl group, the halogen atom with which hydrogen atoms may be substituted is preferably a fluorine atom.

There are no particular restrictions on the alkyl groups for $R^{1\prime\prime}$ to $R^{3\prime\prime}$. Examples thereof include a linear, branched, or cyclic alkyl group of 1 to 10 carbon atoms. The alkyl group preferably has 1 to 5 carbon atoms, in terms of excellent resolution. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. Of these, a methyl group is preferable, because it excels in resolution, and can be synthesized inexpensively.

If two of $R^{1\prime\prime}$ to $R^{3\prime\prime}$ in the general formula (b-1) are mutually bonded to form a ring together with the sulfur atom in the formula, the ring including the sulfur atom preferably forms a 3 to 10-membered ring, and more preferably forms a 5 to 7-membered ring.

Also, if two of $R^{1\prime\prime}$ to $R^{3\prime\prime}$ in the general formula (b-1) are mutually bonded to form a ring together with the sulfur atom in the formula, the other of $R^{1\prime\prime}$ to $R^{3\prime\prime}$ is preferably an aryl group. As the aryl group, the same aryl groups as those for $R^{1\prime\prime}$ to $R^{3\prime\prime}$ can be used.

As the cation moiety of compounds represented by the formula (b-1), a cation moiety represented by the formulae (I-1-1) to (I-1-10) shown below can preferably be used. Of these, a cation moiety which contains a triphenylmethane skeleton, such as cation moieties represented by the formulae (I-1-1) to (I-1-8), is particularly preferable.

In the formulae (I-1-9) and (I-1-10), $R^9$ and $R^{10}$ each independently represents a phenyl group which may contain a substituent, a naphthyl group which may contain a substituent, an alkyl group of 1 to 5 carbon atoms, an alkoxy group of 1 to 5 carbon atoms, or a hydroxyl group.

u represents an integer of 1 to 3, and is most preferably 1 or 2.

[Chemical Formula 44]

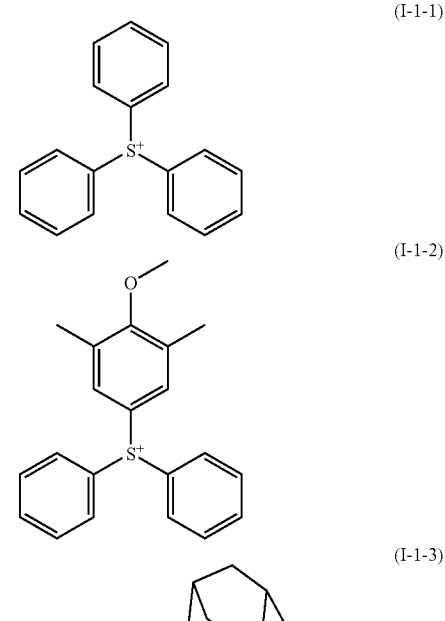

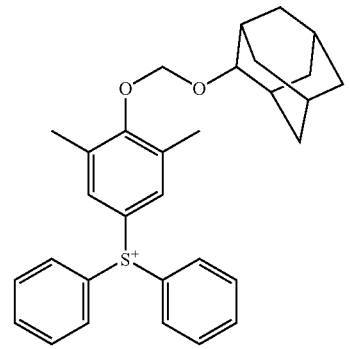

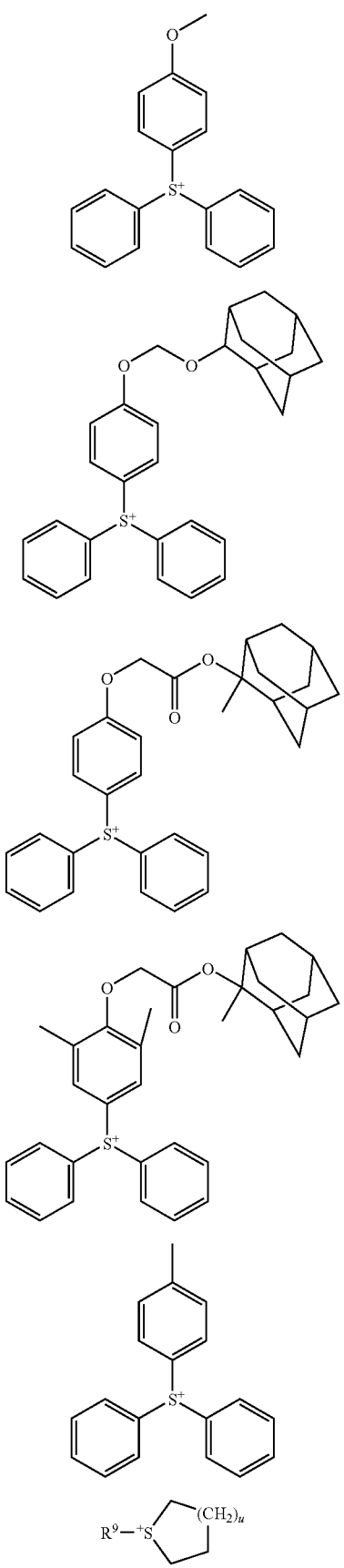

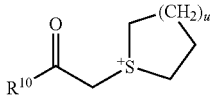

$R^{4\prime\prime}$ represents an alkyl group which may contain a substituent, a halogenated alkyl group which may contain a substituent, an aryl group which may contain a substituent, or an alkenyl group which may contain a substituent.

The alkyl group for $R^{4\prime\prime}$ may be linear, branched or cyclic.

The number of carbon atoms within the linear or branched alkyl group for $R^{4\prime\prime}$ is preferably 1 to 10, more preferably 1 to 8, and most preferably 1 to 4.

The cyclic alkyl group for $R^{4\prime\prime}$ preferably has 4 to 15 carbon atoms, more preferably 4 to 10 carbon atoms, and most preferably 6 to 10 carbon atoms.

As the halogenated alkyl group for $R^{4\prime\prime}$, groups in which a part or all of the hydrogen atoms in the above linear, branched or cyclic alkyl group are substituted with halogen atoms can be used. Examples of the halogen atom include a fluorine atom, a chlorine atom, a bromine atom and iodine atom. Of these, a fluorine atom is preferable.

In the halogenated alkyl group, the proportion (halogenated ratio (%)) of the number of halogen atoms relative to the total number of halogen atoms and hydrogen atoms included in the halogenated alkyl group is preferably 10 to 100%, more preferably 50 to 100%, and most preferably 100%. A higher halogenated ratio is preferable because the strength of the acid increases.

The aryl group for $R^{4\prime\prime}$ is preferably an aryl group of 6 to 20 carbon atoms.

The alkenyl group for $R^{4\prime\prime}$ is preferably an alkenyl group of 2 to 10 carbon atoms.

In the aforementioned $R^{4\prime\prime}$, the expression "may contain a substituent" means that a part or all of hydrogen atoms in the aforementioned linear, branched, or cyclic alkyl group, the halogenated alkyl group, the aryl group, or the alkynyl group may be substituted with substituents (atoms or groups other than hydrogen atoms).

The number of substituents in $R^{4\prime\prime}$ may be either one, or two or more.

Examples of the substituent include a halogen atom, a hetero atom, an alkyl group, a group represented by the formula: X-$Q^1$- (wherein, $Q^1$ represents a bivalent linking group containing an oxygen atom, and X represents a hydrocarbon group of 3 to 30 carbon atoms which may contain a substituent).

Examples of the halogen atom and alkyl group include the halogen atom in the halogenated alkyl group for $R^{4\prime\prime}$ and the alkyl groups for $R^{4\prime\prime}$.

Examples of the hetero atom include an oxygen atom, a nitrogen atom, and a sulfur atom.

In the group represented by the formula: X-$Q^1$-, $Q^1$ represents a bivalent linking group containing an oxygen atom.

$Q^1$ may contain an atom other than an oxygen atom. Examples of the atom other than an oxygen atom include a carbon atom, a hydrogen atom, a sulfur atom, and a nitrogen atom.

Examples of the bivalent linking group containing an oxygen atom include non-hydrocarbon-based oxygen atom-containing linking groups such as an oxygen atom (ether linkage; —O—), an ester linkage (—C(=O)—O—), an amide linkage (—C(=O)—NH—), a carbonyl group (—C(=O)—), and a carbonate linkage (—O—C(=O)—O—); and combined groups of the non-hydrocarbon-based oxygen-containing linking group and an alkylene group.

Examples of the above combined groups include —$R^{91}$—O—, —$R^{92}$—O—C(=O)—, and —C(=O)—O—$R^{93}$—O—C(=O)— (wherein, $R^{91}$ to $R^{93}$ each independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and still more preferably 1 to 3 carbon atoms.

Specific examples of the alkylene group include a methylene group [—$CH_2$—]; an alkylmethylene group such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; an ethylene group [—$CH_2CH_2$—]; an alkylethylene group such as —CH($CH_3$)$CH_2$—, —CH($CH_3$)CH($CH_3$)—, —C($CH_3$)$_2CH_2$—, and —CH($CH_2CH_3$)$CH_2$—; a trimethylene group (n-propylene group) [—$CH_2CH_2CH_2$—]; an alkyltrimethylene group such as —CH($CH_3$)$CH_2CH_2$— and —$CH_2$CH($CH_3$)$CH_2$—; a tetramethylene group [—$CH_2CH_2CH_2CH_2$—]; an alkyltetramethylene group such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

$Q^1$ is preferably a bivalent linking group containing an ester linkage or ether linkage, and more preferably —$R^{91}$—O—, —$R^{92}$—O—C(=O)—, or —C(=O)—O—$R^{93}$—O—C(=O)—.

In the group represented by the formula: "X-$Q^1$-", the hydrocarbon group for X may be an aromatic hydrocarbon group or an aliphatic hydrocarbon group.

The aromatic hydrocarbon group is a hydrocarbon group containing an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of the carbon atoms described above does not include the number of carbon atoms within a substituent.

Specific examples of the aromatic hydrocarbon group include aryl groups in which one hydrogen atom has been removed from an aromatic hydrocarbon ring such as a phenyl group, a biphenyl group, a fluorenyl group, a naphthyl group, an anthryl group, or a phenanthryl group; and arylalkyl groups such as a benzyl group, a phenethyl group, a 1-naphthylmethyl group, a 2-naphthylmethyl group, a 1-naphthylethyl group, and a 2-naphthylethyl group. The number of carbon atoms of the alkyl chain in the arylalkyl group is preferably 1 to 4, more preferably 1 or 2, and still more preferably 1.

The aromatic hydrocarbon group may contain a substituent. For example, a part of carbon atoms which constitutes an aromatic ring included in the aromatic hydrocarbon group may be substituted with a hetero atom, or a part of hydrogen atoms bonded to an aromatic ring included in the aromatic hydrocarbon group may be substituted with a substituent.

Examples of the former case include a heteroaryl group in which a part of carbon atoms which constitutes the ring of the aryl group described above is substituted with a hetero atom such as an oxygen atom, a sulfur atom, or a nitrogen atom; and a heteroarylalkyl group in which a part of carbon atoms which constitutes the aromatic hydrocarbon ring of the arylalkyl group described above is substituted with the hetero atom.

On the other hand, examples of the substituents in the aromatic hydrocarbon group in the latter case include an alkyl group, an alkoxy group, a halogen atom, a halogenated alkyl group, a hydroxyl group, and an oxygen atom (=O).

The alkyl group for the substituent in the aromatic hydrocarbon group is preferably an alkyl group of 1 to 5 carbon atoms, and most preferably a methyl group, an ethyl group, a propyl group, an n-butyl group, or a tert-butyl group.

The alkoxy group for the substituent in the aromatic hydrocarbon group is preferably an alkoxy group of 1 to 5 carbon atoms, and more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent in the aromatic hydrocarbon group include a fluorine atom, a chlorine atom, a bromine atom, and an iodine atom. Of these, a fluorine atom is preferable.

Examples of the halogenated alkyl group for the substituent in the aromatic hydrocarbon group include groups in which a part of or all of the hydrogen atoms of the above alkyl group are substituted with the halogen atoms.

The aliphatic hydrocarbon group for X may be a saturated aliphatic hydrocarbon group, or an unsaturated aliphatic hydrocarbon group. Also, the aliphatic hydrocarbon group may be linear, branched, or cyclic.

In the aliphatic hydrocarbon group for X, a part of carbon atoms which constitute the aliphatic hydrocarbon group may be substituted with a substituent containing a hetero atom, or a part or all of hydrogen atoms which constitute the aliphatic hydrocarbon group may be substituted with a substituent containing a hetero atom.

There is no particular restriction on the "hetero atom" in X, as long as it is an atom other than a carbon atom and a hydrogen atom. Examples thereof include a halogen atom, an oxygen atom, a sulfur atom, and a nitrogen atom. Examples of the halogen atom include a fluorine atom, a chlorine atom, an iodine atom, and a bromine atom.

The substituent containing a hetero atom may be an atom/group consisting of the hetero atom, or a group containing a group or an atom other than the hetero atom.

As the substituents which are substituted for a part of carbon atoms which constitute the above aliphatic hydrocarbon group, for example, —O—, —(=O)—O—, —C(=O)—, —O—C(=O)—O—, —C(=O)—NH—, —NH— (wherein H may be substituted with a substitutent such as an alkyl group or an acyl group), —S—, —S(=O)$_2$—, or —S(=O)$_2$—O— can be used. If the aliphatic hydrocarbon group for X is cyclic, these substituents may be included in the ring structure.

Specific examples of the substituents which are substituted for a part or all of the hydrogen atoms include an alkoxy group, a halogen atom, a halogenated alkyl group, a hydroxyl group, an oxygen atom, and a cyano group.

The alkoxy group for the substituent is preferably an alkoxy group of 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent include a fluorine atom, a chlorine atom, a bromine atom, and an iodine atom. Of these, a fluorine atom is preferable.

Examples of the halogenated alkyl group for the substituent include a group in which a part or all of the hydrogen atom in an alkyl group of 1 to 5 carbon atoms, such as a methyl group, an ethyl group, a propyl group, an n-butyl group, or a tert-butyl group, are substituted with the halogen atoms.

The aliphatic hydrocarbon group is preferably a linear or branched saturated hydrocarbon group, a linear or branched monovalent unsaturated hydrocarbon group, or a cyclic aliphatic hydrocarbon group (aliphatic cyclic group).

The linear saturated hydrocarbon group (alkyl group) preferably has 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched saturated hydrocarbon group (alkyl group) has preferably 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of the linear monovalent unsaturated hydrocarbon group include a vinyl group, a propenyl group (allyl group) and a butynyl group. Examples of the branched monovalent unsaturated hydrocarbon group include a 1-methylpropenyl group and a 2-methylpropenyl group.

Of these, the unsaturated hydrocarbon group is particularly preferably a propenyl group.

The aliphatic cyclic group may be a monocycle group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples thereof include groups in which one or more of hydrogen atoms have been removed from a monocycloalkane; and groups in which one or more of hydrogen atoms have been removed from a polycycloalkane such as a bicycloalkane, a tricycloalkane, or a tetracycloalkane. Specific examples include groups in which at least one hydrogen atom has been removed from a monocycloalkane such as cyclopentane or cyclohexane; and groups in which at least one hydrogen atom has been removed from a polycycloalkane such as adamantane, norbornane, isobornane, tricyclodecane or tetracyclododecane.

If the aliphatic cyclic group does not contain a substituent containing a hetero atom in the ring structure, the aliphatic cyclic group is preferably a polycyclic group, more preferably groups in which one or more hydrogen atoms have been removed from a polycycloalkane, and most preferably groups in which one or more hydrogen atoms have been removed from adamantane.

If the aliphatic cyclic group contains a substituent containing a hetero atom within the ring structure, the substituent containing a hetero atom is preferably —O—, —C(=O)—O—, —S—, —S(=O)$_2$—, or —S(=O)$_2$—O—. Specific examples of the aliphatic cyclic group include groups represented by the formulae (L1) to (L5), and (S1) to (S4) shown below.

[Chemical Formula 45]

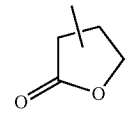

(L1)

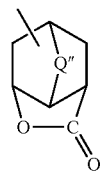

(L2)

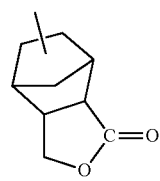

(L3)

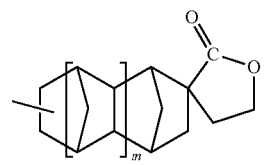

(L4)

(L5)

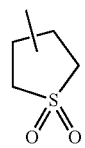

(S1)

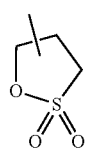

(S2)

(S3)

(S4)

(In the above formulae, Q" represents an alkylene group of 1 to 5 carbon atoms, —O—, —S—, —O—R$^{94}$—, or —S—$R^{95}$—, wherein $R^{94}$ and $R^{95}$ each independently represents an alkylene group of 1 to 5 carbon atoms; and m represents an integer of 0 or 1.)

In the formulae, as the alkylene group for Q''', $R^{94}$, and $R^{95}$, the same alkylene groups as those for $R^{91}$ to $R^{93}$ above can be used.

These aliphatic cyclic group may be a group in which a part of hydrogen atoms bonded to the carbon atoms constituting the ring structure are substituted with substitutents. Examples of the substituent include an alkyl group, an alkoxy group, a halogen atom, a halogenated alkyl group, a hydroxyl group, and an oxygen atom (=O).

The alkyl group for the substituent is preferably an alkyl group of 1 to 5 carbon atoms, and particularly preferably a methyl group, an ethyl group, a propyl group, an n-butyl group, or a tert-butyl group.

Examples of the alkoxy group and halogen atom for the substituent, respectively, include the same alkoxy groups and halogen atoms as those described above as the substitutents which are substituted for a part or all of hydrogen atoms.

In the present invention, X is preferably a cyclic group which may contain a substituent. The cyclic group may be an aromatic hydrocarbon group which may contain a substituent or an aliphatic cyclic group which may contain a substituent, and is preferably an aliphatic cyclic group which may contain a substituent.

The aforementioned aromatic hydrocarbon group is preferably a naphthyl group which may contain a substituent or a phenyl group which may contain a substituent.

The aliphatic cyclic group which may contain a substituent is preferably a polycyclic aliphatic cyclic group which may contain a substituent. The polycyclic aliphatic cyclic group is preferably a group in which one or more hydrogen atoms have been removed from the above polycycloalkane, or a group represented by the above formulae (L2) to (L5), and (S3) to (S4).

In the present invention, $R^{4'''}$ preferably contains X-$Q^1$- as a substituent. In this case, $R^{4'''}$ is preferably a group represented by the formula X-$Q^1$-$Y^1$— (wherein $Q^1$ and X are as defined above; and $Y^1$ represents an alkylene group of 1 to 4 carbon atoms which may contain a substituent, or a fluorinated alkylene group of 1 to 4 carbon atoms which may contain a substituent).

In the group represented by the formula X-$Q^1$-$Y^1$—, examples of the alkylene group for $Y^1$ include the same alkylene group as those described above for $Q^1$ in which the number of carbon atoms is 1 to 4.

As the fluorinated alkylene group for $Y^1$, groups in which a part or all of hydrogen atoms in the alkylene group are substituted with fluorine atoms can be used.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, and —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, and —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, and —$CF(CF_2CF_3)CF_2$—; —$CH_2CF_2$—, —$CH_2CH_2CF_2$—, and —$CH_2CF_2CF_2$—; and —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$—, or —$CH_2CF_2CF_2$— is preferable, —$CF_2$—, —$CF_2CF_2$—, or —$CF_2CF_2CF_2$— is more preferable, and —$CF_2$— is still more preferable.

The alkylene group or fluorinated alkylene group for $Y^1$ may contain a substituent. The expression that the alkylene group or fluorinated alkylene group "contain a substituent" means that a part or all of the hydrogen atoms or fluorine atoms in the alkylene group or fluorinated alkylene group are substituted with groups other than hydrogen atoms and fluorine atoms.

Examples of the substituent which may be included in the alkylene group or fluorinated alkylene group include an alkyl group of 1 to 4 carbon atoms, an alkoxy group of 1 to 4 carbon atoms, and hydroxyl group.

In the general formula (b-2), $R^{5'''}$ and $R^{6'''}$ each independently represents an aryl group or an alkyl group. At least one of $R^{5'''}$ and $R^{6'''}$ represents an aryl group. Both of $R^{5'''}$ and $R^{6'''}$ preferably represent aryl groups.

As the aryl groups for $R^{5'''}$ and $R^{6'''}$, the same aryl groups as those for $R^{1'''}$ to $R^{3'''}$ above can be used.

As the alkyl groups for $R^{5'''}$ and $R^{6'''}$, the same alkyl group as those for $R^{1'''}$ to $R^{3'''}$ can be used.

Of these, it is most preferable that both of $R^{5'''}$ and $R^{6'''}$ be phenyl groups.

Examples of $R^{4'''}$ in the general formula (b-2) include the same as those described above for $R^{4'''}$ in the general formula (b-1).

Specific examples of onium salt-based acid generators represented by the formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl) phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate;

1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by an alkylsulfonate such as methanesulfonate, n-propanesulfonate, n-butanesulfonate, n-octanesulfonate, 1-adamantane sulfonate, or 2-norbornane sulfonate; or a sulfonate such as d-camphar-10-sulfonate, benzene sulfonate, perfluorobenzene sulfonate, or p-toluene sulfonate.

Also, onium salts whose anion moiety is substituted with one of anion moieties represented by formulae (b1) to (b8) shown below can be used.

[Chemical Formula 46]

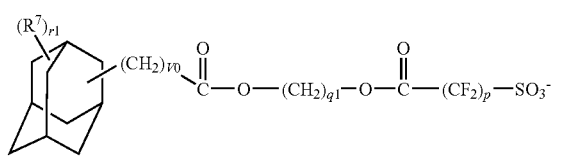
(b1)

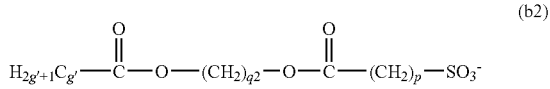
(b2)

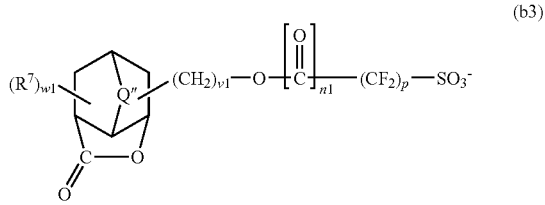
(b3)

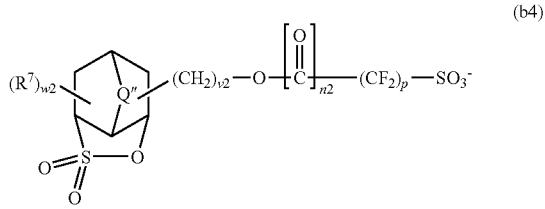
(b4)

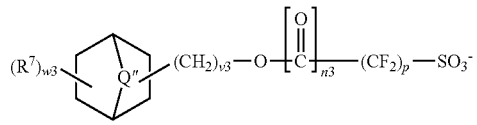
(b5)

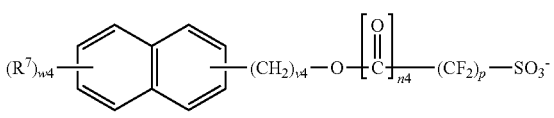
(b6)

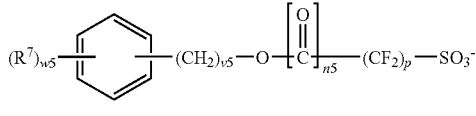
(b7)

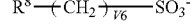
(b8)

(In the formulae, p represents an integer of 1 to 3; q1 and q2 each independently represents an integer of 1 to 5; r1 represents an integer of 0 to 3; g' represents an integer of 1 to 20; $R^7$ represents a substituent; n1 to n5 each independently represents an integer of 0 or 1; v1 to v5 each independently represents an integer of 0 to 3; v0 represents an integer of 0 to 3; w1 to w5 each independently represents an integer of 0 to 3; Q″ is as defined above; $R^8$ represents a cyclic alkyl group of 4 to 20 carbon atoms having an oxygen atom (=O) as a substituent; and v6 represents an integer of 0 or 1.)

Examples of the substituent for $R^7$ include substituents which an aliphatic hydrocarbon group may contain or substituents which an aromatic hydrocarbon group may contain as described above in X.

If each of the symbols (r1, and w1 to w5) attached at the bottom right of $R^7$ is an integer of 2 or more, then a plurality of $R^7$ in the compound may be the same as, or different from one another.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 47]

(b-3)

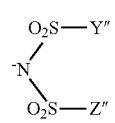
(b-4)

(In the formulae, X″ represents an alkylene group of 2 to 6 carbon atoms in which at least one hydrogen atom is substituted with a fluorine atom; and Y″ and Z″ each independently represents an alkyl group of 1 to 10 carbon atoms in which at least one hydrogen atom is substituted with a fluorine atom.)

X″ represents a linear or branched alkylene group in which at least one hydrogen atom is substituted with a fluorine atom. The alkylene group for X″ has 2 to 6 carbon atoms, preferably 3 to 5 carbon atoms, and most preferably 3 carbon atoms.

Y" and Z" each independently represents a linear or branched alkyl group in which at least one hydrogen atom is substituted with a fluorine atom. The alkyl group for Y" and Z" has 1 to 10 carbon atoms, preferably 1 to 7 carbon atoms, and more preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved, and thus it is consequently preferable.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less or electron beam is improved. The proportion of fluorine atoms in the alkylene group or alkyl group, that is, the fluorination rate is preferably within the range of 70 to 100%, and more preferably 90 to 100%. A perfluoroalkylene group or a perfluoroalkyl group wherein all hydrogen atoms are substituted with fluorine atoms is most preferable.

Furthermore, a sulfonium salt that contains a cation moiety represented by the general formula (b-5) or (b-6) shown below can be used as an onium salt-based acid generator.

[Chemical Formula 48]

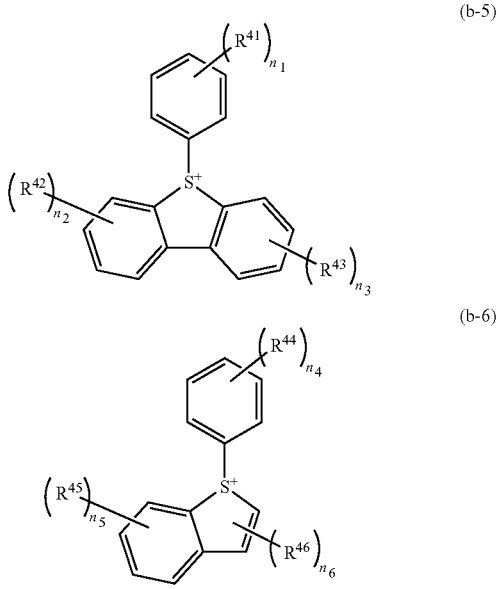

(In the formulae, $R^{41}$ to $R^{46}$ each independently represents an alkyl group, an acetyl group, an alkoxy group, a carboxyl group, a hydroxyl group or a hydroxyalkyl group; $n_1$ to $n_5$ each independently represents an integer of 0 to 3; and $n_6$ represents an integer of 0 to 2.)

The alkyl group for $R^{41}$ to $R^{46}$ is preferably an alkyl group of 1 to 5 carbon atoms, more preferably a linear or branched alkyl group, and particularly preferably a methyl group, an ethyl group, a propyl group, an isopropyl group, an n-butyl group, or a tert-butyl group.

The alkoxy group for $R^{41}$ to $R^{46}$ is preferably an alkoxy group of 1 to 5 carbon atoms, more preferably a linear or branched alkoxy group, and particularly preferably a methoxy group or an ethoxy group.

The hydroxyalkyl group for $R^{41}$ to $R^{46}$ in the formulae (b-5) and (b-6) is preferably a group in which one or more hydrogen atoms of the alkyl group described above are substituted with hydroxyl groups, and examples thereof include a hydroxymethyl group, a hydroxyethyl group, and a hydroxypropyl group.

When the subscripts $n_1$ to $n_6$ attached at the bottom right of $R^{41}$ to $R^{46}$ represent an integer of 2 or more, a plurality of $R^{41}$ to $R^{46}$ may be the same as or different from one another.

$n_1$ is preferably 0 to 2, more preferably 0 or 1, and still more preferably 0.

It is preferable that $n_2$ and $n_3$ each be independently 0 or 1, and it is more preferable that they be 0.

$n_4$ is preferably 0 to 2, and more preferably 0 or 1.

$n_5$ is preferably 0 or 1, and more preferably 0.

$n_6$ is preferably 0 or 1, and more preferably 1.

There are no particular restrictions on an anion moiety of a sulfonium salt that contains the cation moiety represented by the general formula (b-5) or (b-6), and anion moieties for onium salt-based acid generators which have been proposed may be used as the anion moieties. Examples of the anion moieties include a fluorinated alkylsulfonate ion such as the anion moiety ($R^{4''}SO_3^-$) of the onium salt-based acid generator represented by the general formula (b-1) or (b-2); and an anion moiety represented by the above general formula (b-3) or (b-4).

In the present specification, the term "oxime sulfonate-based acid generator" means a compound which has at least one of the groups represented by the general formula (B-1) shown below, and has a property that an acid is generated upon exposure to radiation. These kinds of oxime sulfonate-based acid generators are widely used for a chemically-amplified resist composition, so any oxime sulfonate-based acid generator, arbitrarily selected from these, can be used.

[Chemical Formula 49]

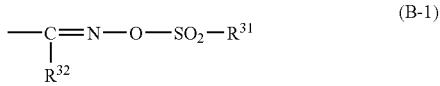

(In the general formula (B-1), $R^{31}$ and $R^{32}$ each independently represents an organic group.)

The organic group for $R^{31}$ and $R^{32}$ is a group containing carbon atoms, and may further contain atoms other than carbon atoms (for example, a hydrogen atom, an oxygen atom, a nitrogen atom, a sulfur atom or a halogen atom (a fluorine atom, a chlorine atom or the like)).

The organic group for $R^{31}$ is preferably a linear, branched or cyclic alkyl group or an aryl group. The alkyl group or aryl group may contain a substituent. There are no particular restrictions on the substituent, and examples thereof include a fluorine atom, and a linear, branched or cyclic alkyl group of 1 to 6 carbon atoms. Here, the term "containing a substituent" means that a part or all of the hydrogen atoms in the alkyl group or aryl group are substituted with substituents.

The alkyl group as the organic group for $R^{31}$ preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. The alkyl group for $R^{31}$ is particularly preferably an alkyl group which is partially or completely halogenated (hereinafter, sometimes referred to as a halogenated alkyl group). Here, a partially halogenated alkyl group means an alkyl group in which a part of the hydrogen atoms are substituted with halogen atoms, and a completely halogenated alkyl group represents an alkyl group in which all of the hydrogen atoms are substituted with halogen atoms. Examples of the halogen atoms include a fluorine atom, a chlorine atom, a bromine atom and an iodine atom. Of these, a fluorine atom is preferable. That is, the halogenated alkyl group is preferably a fluorinated alkyl group.

The aryl group as the organic group for $R^{31}$ preferably has 4 to 20 carbon atoms, more preferably 4 to 10 carbon atoms, and most preferably 6 to 10 carbon atoms. The aryl group as the organic group for $R^{31}$ is particularly preferably an aryl group which is partially or completely halogenated. Here, a partially halogenated aryl group means an aryl group in which a part of the hydrogen atoms are substituted with halogen atoms, and a completely halogenated aryl group means an aryl group in which all of the hydrogen atoms are substituted with halogen atoms.

$R^{31}$ is particularly preferably an alkyl group of 1 to 4 carbon atoms containing no substituent, or a fluorinated alkyl group of 1 to 4 carbon atoms.

The organic group for $R^{32}$ is preferably a linear, branched or cyclic alkyl group, an aryl group, or a cyano group. As the alkyl group or the aryl group for $R^{32}$, the same alkyl groups or aryl groups as those described above for $R^{31}$ can be used.

$R^{32}$ is particularly preferably a cyano group, an alkyl group of 1 to 8 carbon atoms containing no substituent, or a fluorinated alkyl group of 1 to 8 carbon atoms.

Preferred examples of the oxime sulfonate-based acid generator include compounds represented by the general formula (B-2) or (B-3) shown below.

[Chemical Formula 50]

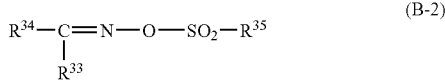

(B-2)

(In the general formula (B-2), $R^{33}$ represents a cyano group, an alkyl group containing no substituent, or a halogenated alkyl group; $R^{34}$ represents an aryl group; and $R^{35}$ represents an alkyl group containing no substituent or a halogenated alkyl group.)

[Chemical Formula 51]

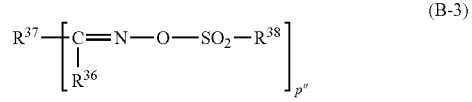

(B-3)

(In the formula (B-3), $R^{36}$ represents a cyano group, an alkyl group containing no substituent, or a halogenated alkyl group; $R^{37}$ represents a bivalent or trivalent aromatic hydrocarbon group; $R^{38}$ represents an alkyl group containing no substituent or a halogenated alkyl group; and p" represents an integer of 2 or 3.)

In the general formula (B-2), the alkyl group containing no substituent or the halogenated alkyl group for $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group for $R^{33}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group; and heteroaryl groups in which a part of the carbon atoms which constitute the rings of these groups are substituted with heteroatoms such as an oxygen atom, a sulfur atom, and a nitrogen atom. Of these, a fluorenyl group is preferable.

The aryl group of $R^{34}$ may contain a substituent such as an alkyl group of 1 to 10 carbon atoms, a halogenated alkyl group of 1 to 10 carbon atoms and an alkoxy group of 1 to 10 carbon atoms. The alkyl group or halogenated alkyl group for the aforementioned substituent preferably has 1 to 8 carbon atoms, and more preferably 1 to 4 carbon atoms. Also, the halogenated alkyl group for the substituent is preferably a fluorinated alkyl group.

The alkyl group containing no substituent or the halogenated alkyl group for $R^{35}$ preferably has 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

The fluorinated alkyl group for $R^{35}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated, because the strength of the generated acid increases. The fluorinated alkyl group for $R^{35}$ is most preferably a completely fluorinated alkyl group in which 100% of the hydrogen atoms are substituted with fluorine atoms.

In the general formula (B-3), as the alkyl group containing no substituent or the halogenated alkyl group for $R^{36}$, the same alkyl groups containing no substituent or halogenated alkyl groups as those described above for $R^{33}$ can be used.

Examples of the bivalent or trivalent aromatic hydrocarbon group for $R^{37}$ include aryl groups for $R^{34}$ in which one or two hydrogen atoms are further removed.

As the alkyl group containing no substituent or the halogenated alkyl group for $R^{38}$, the same alkyl groups containing no substituent or halogenated alkyl groups as those described above for $R^{35}$ can be used.

p" is preferably 2.

Specific examples of the oxime sulfonate-based acid generator include

α-(p-toluenesulfonyloxyimino)-benzylcyanide,
α-(p-chlorobenzenesulfonyloxyimino)-benzylcyanide,
α-(4-nitrobenzenesulfonyloxyimino)-benzylcyanide,
α-(4-nitro-2-trifluoromethylbenzenesulfonyloxyimino)-benzylcyanide,
α-(benzenesulfonyloxyimino)-4-chlorobenzylcyanide,
α-(benzenesulfonyloxyimino)-2,4-dichlorobenzylcyanide,
α-(benzenesulfonyloxyimino)-2,6-dichlorobenzylcyanide,
α-(benzenesulfonyloxyimino)-4-methoxybenzylcyanide,
α-(2-chlorobenzenesulfonyloxyimino)-4-methoxybenzylcyanide,
α-(benzenesulfonyloxyimino)-thien-2-ylacetonitrile,
α-(4-dodecylbenzenesulfonyloxyimino)-benzylcyanide,
α-[(p-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-4-thienylcyanide,
α-(methylsulfonyloxyimino)-1-cyclopentenylacetonitrile,
α-(methylsulfonyloxylmino)-1-cyclohexenylacetonitrile, α-(methylsulfonyloxyimino)-1-cycloheptenylacetonitrile,
α-(methylsulfonyloxyimino)-1-cyclooctenylacetonitrile,
α-(trifluoromethylsulfonyloxyimino)-1-cyclopentenylacetonitrile,
α-(trifluoromethylsulfonyloxyimino)-cyclohexylacetonitrile,
α-(ethylsulfonyloxyimino)-ethylacietonitrile,
α-(propylsulfonyloxyimino)-propylacetonitrile,
α-(cyclohexylsulfonyloxyimino)-cyclopentylacetonitrile,
α-(cyclohexylsulfonyloxyimino)-cyclohexylacetonitrile,
α-(cyclohexylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile,
α-(n-butylsulfonyloxyimino)-1-cyclohexenylacetonitrile,
α-(methylsulfonyloxyimino)-phenylacetonitrile,
α-(methylsulfonyloxyimino)-p-methoxyphenylacetonitrile,
α-(trifluoromethylsulfonyloxyimino)-phenylacetonitrile,
α-(trifluoromethylsulfonyloxyimino)-p-methoxyphenylacetonitrile,
α-(ethylsulfonyloxyimino)-p-methoxyphenylacetonitrile,
α-(propylsulfonyloxyimino)-p-methylphenylacetonitrile, and
α-(methylsulfonyloxyimino)-p-bromophenylacetonitrile.

Also, oxime sulfonate-based acid generators disclosed in Japanese Unexamined Patent Application, First Publication No. Hei 9-208554 ([Formula 18] and [Formula 19] in paragraphs [0012] to [0014]), and International Publication WO 2004/074242 (Examples 1 to 40 on pages 65 to 85) can preferably be used.

Further, suitable examples thereof include the following.
[Chemical Formula 52]

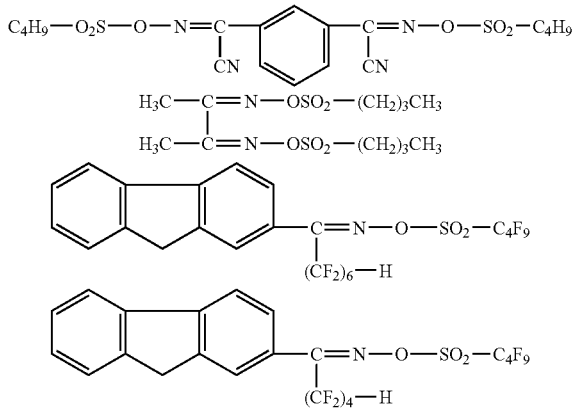

Among the diazomethane-based acid generators, specific examples of bisalkyl- or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Also, diazomethane-based acid generators disclosed in Japanese Unexamined Patent Application, First Publication No. Hei 11-035551, Japanese Unexamined Patent Application, First Publication No. Hei 11-035552, and Japanese Unexamined Patent Application, First Publication No. Hei 11-035573 can preferably be used.

Examples of the poly(bissulfonyl)diazomethanes include 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, which are disclosed in Japanese Unexamined Patent Application, First Publication No. Hei 11-322707.

As the component (B), either a single acid generator may be used alone, or a combination of two or more different acid generators may be used.

In the present invention, of these, onium salt-based acid generators with a fluorinated alkylsulfonate ion as the anion moiety are preferably used as the component (B).

The amount of the component (B) within the positive resist composition of the present invention is preferably 0.5 to 50 parts by weight, and more preferably 1 to 40 parts by weight, relative to 100 parts by weight of the component (A). When the amount is within the range, a pattern can be sufficiently formed. Also, a uniform solution and excellent storage stability can be obtained. Therefore, an amount within the above range is preferable.

<Optional Components>

The positive resist composition of the present invention may include a nitrogen-containing organic compound (D) (hereinafter, referred to as component (D)) as an optional component.

As the component (D), there are no particular limitations as long as it functions as an acid diffusion control agent, i.e., a quencher which traps the acid generated from the component (B) upon exposure. Since a multitude of these components (D) have already been proposed, any of these known compounds can be arbitrarily used. Of these, an aliphatic amine, particularly a secondary aliphatic amine or tertiary aliphatic amine is preferred. Here, the aliphatic amine means an amine containing at least one aliphatic group, and the aliphatic group preferably has 1 to 20 carbon atoms.

Examples of the aliphatic amine include an amine (alkylamine or alkylalcoholamine) wherein at least one of the hydrogen atoms of $NH_3$ is substituted with an alkyl or hydroxyalkyl group having 20 or less carbon atoms; and a cyclic amine.

Specific examples of the alkylamines or alkylalcoholamines include monoalkylamines such as n-hexylamine, n-heptylamine, n-octylamine, n-nonylamine, or n-decylamine; dialkylamines such as diethylamine, di-n-propylamine, di-n-heptylamine, di-n-octylamine, or dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkylalcoholamines such as diethanolamine, triethanolamine, diisopropanolamine, triisopropanolamine, di-n-octanolamine, tri-n-octanolamine, stearyl diethanolamine, or lauryl diethanolamine. Of these, a trialkylamine and/or an alkylalcoholamine is/are preferable.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amines include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of the aromatic amine include aniline, pyridine, 4-dimethylaminopyridine, pyrol, indole, pyrazole, and imidazole, and derivatives thereof; diphenylamine, triphenylamine, and tribenzylamine.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

These may be used either alone, or in combination of two or more different compounds.

The component (D) is typically used in a quantity within the range of 0.01 to 5.0 parts by weight, relative to 100 parts by weight of the component (A). When the quantity is within the above range, the resist pattern shape, the post-exposure stability of the latent image formed by the pattern-wise exposure of the resist layer, and the like are improved.

In the positive resist composition of the present invention, in order to prevent any deterioration in sensitivity, and improve the resist pattern shape and the post-exposure stability of the latent image formed by the pattern-wise exposure of the resist layer, at least one compound (E) (hereinafter, referred to as component (E)) selected from the group consisting of organic carboxylic acids and phosphorus oxo acids or derivatives thereof may also be added as an optional component.

Suitable examples of organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly preferable.

Examples of phosphorus oxo acid derivatives include esters in which a hydrogen atom within the above-mentioned oxo acids is substituted with a hydrocarbon group.

Examples of the hydrocarbon group include an alkyl group of 1 to 5 carbon atoms and an aryl group of 6 to 15 carbon atoms.

Examples of phosphoric acid derivatives include phosphate esters such as di-n-butyl phosphate and diphenyl phosphate.

Examples of phosphoric acid derivatives include phosphonate esters such as dimethyl phosphonate, di-n-butyl phosphonate, phenylphosphonic acid, diphenyl phosphonate and dibenzyl phosphonate.

Examples of phosphinic acid derivatives include phosphinic esters such as phenylphosphinic acid.

As the component (E), one type may be used alone, or two or more types may be used in combination.

The component (E) is used in a quantity within the range of 0.01 to 5.0 parts by weight, relative to 100 parts by weight of the component (A).

In the positive resist composition of the present invention, if desired, additives having miscibility, for example, additive resins for improving performance of a resist film, surfactants for improving coatability, dissolution inhibitors, plasticizers, stabilizers, colorants, antihalation agents, and dyes can be appropriately added.

<<Negative Resist Composition>>

If the resist composition of the present invention is a negative resist composition, the negative resist composition includes an alkali-soluble resin, the component (B) and a cross-linking agent (C).

In the negative resist composition, when an acid is generated from the component (B) upon exposure during resist pattern formation, the action of this acid causes cross-linking between the alkali-soluble resin and the cross-linking agent, and the exposed portion becomes alkali-insoluble.

As the alkali-soluble resin, it is preferable to use a resin having a structural unit derived from at least one of an α-(hydroxyalkyl)acrylic acid and a lower alkyl ester of α-(hydroxyalkyl)acrylic acid, because it enables formation of a satisfactory resist pattern with minimal swelling. Here, the term "α-(hydroxyalkyl)acrylic acid" means one or both of the acrylic acid in which a hydrogen atom is bonded to the carbon atom at the α-position to which the carboxyl group is bonded, and an α-hydroxyalkylacrylic acid in which a hydroxyalkyl group (preferably a hydroxyalkyl group of 1 to 5 carbon atoms) is bonded to the carbon atom at the α-position.

As the cross-linking agent (C), typically, an amino-based cross-linking agent such as a glycoluril having a methylol group or alkoxymethyl group is preferable, as it enables formation of a satisfactory resist pattern with minimal swelling. The amount of the cross-linking agent (C) added is preferably within the range of 1 to 50 parts by weight, relative to 100 parts by weight of the alkali-soluble resin.

<<Organic Solvent>>

The resist composition of the present invention can be prepared by dissolving materials in an organic solvent (hereinafter, sometimes referred to as component (S)).

In the resist composition of the present invention, an organic solvent which includes a cyclic ketone containing a 5 to 7-membered ring, an ether represented by the general formula (S-1) shown below, or a mixture of the cyclic ketone containing a 5 to 7-membered ring and the ether represented by the general formula (S-1) is used as the component (S).

[Chemical Formula 53]

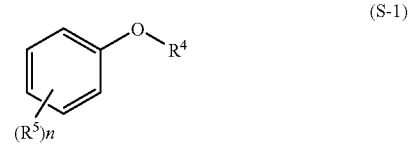

(S-1)

(In the formula, $R^4$ represents an alkyl group of 1 to 5 carbon atoms; $R^5$ represents an alkyl group of 1 to 3 carbon atoms; and n represents an integer of 0 to 2).

The 5 to 7-membered ring may contain a substituent. Also, the 5 to 7-membered ring may contain a unsaturated portion, but is preferably a saturated ring. The use of the above cyclic ketone and/or the above ether enables the polymeric compound (A1) to favorably be dissolved.

Examples of the ketone containing 5-membered ring include cyclopentanone, 2-methyl-2-cyclopentene-1-one, 2-methylcyclopentanone, 3-methylcyclopentanone, 2-ethylcyclopentanone, 3-ethylcyclopentanone, 2,2-dimethylcyclopentanone and 2,4,4-trimethylcyclopentanone.

Examples of the ketone containing 6-membered ring include cyclohexanone, 2-cyclohexene-1-one, 2-methylcyclohexanone, 3-methylcyclohexanone, 4-methylcyclohexanone, 4-ethylcyclohexanone, 2,6-dimethylcyclohexanone, and 2,2-dimethylcyclohexanone.

Examples of the keton containing a 7-membered ring include cycloheptanone and 2-cycloheptane-1-one.

In the present invention, a polycyclic ketone having a norbornane skeleton such as (1S,4R)-bicyclo[2.2.1]heptane-2-one, or a norbornene skeleton can be used as the ketone containing a 7-membered ring.

Of these, in terms of the stable solubility of the resist composition, cyclopentanone, cyclohexanone, or cycloheptanone is preferable, and cyclohexanone is more preferable.

Examples of the ether represented by the general formula (S-1) include anisole (methoxybenzene), ethoxybenzene, butyl phenyl ether, 2-methylanisole, 1-methoxy-4-methylbenzene, 1-methoxy-3-methylbenzene, 2-ethylanisole, 1-methoxy-4-ethylbenzene, 1-methoxy-3-ethylbenzene, 1-isopropyl-2-methoxybenzene, 1-isopropyl-4-methoxybenzene, 4-methoxy-1,2-dimethylbenzene, 1-methoxy-2,3-dimethylbenzene, 1-methoxy-2,4-dimethylbenzene, and 2-methoxy-1,3-dimethylbenzene. Of these, anisole is preferable in terms of the solubility properties of the resist composition.

The component (S) can include one or more organic solvents arbitrarily selected from conventional solvents for a chemically-amplified resist, in addition to the above cyclic ketone and/or the above ether.

Examples thereof include lactones such as γ-butyrolactone; ketones which do not correspond with the above cyclic ketones, such as acetone, methyl ethyl ketone, methyl-n-pentyl ketone, methyl isopentyl ketone, and 2-heptanone; polyhydric alcohols such as ethylene glycol, diethylene glycol, propylene glycol, and dipropylene glycol; derivatives of the polyhydric alcohols, including compounds having ester bonds such as ethylene glycol monoacetate, diethylene glycol monoacetate, propylene glycol monoacetate and dipropylene glycol monoacetate, and compounds having ether bonds such as monoalkyl ethers (for example, monomethyl ether, monoethyl ether, monopropyl ether or monobutyl ether) and monophenyl ether of the above polyhydric alcohols or the above compounds having ester bonds (of these, propylene glycol monomethyl ether acetate (PGMEA) or propylene glycol monomethyl ether (PGME) is preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, ethyl ethoxypropionate; and aromatic organic solvents which do not correspond with solvents represented by the above general formula (S-1), such as diphenyl ether, dibenzyl ether, ethylbenzene, diethylbenzene, pentylbenzene, isopropylbenzene, toluene, xylene, cymene, and mesitylene. Of these, propylene glycol monomethyl ether acetate (PGMEA), propylene glycol monomethyl ether (PGME), γ-butyrolactone or EL is preferable.

The organic solvent which can be used together with the above cyclic ketone and/or ether may be used either alone, or may be used as a mixed solvent of two or more different solvents. For example, a mixture solvent of PGMEA and PGME can be used. In this case, the mass ratio PGMEA: PGME is preferably within the range of 1:9 to 9:1, more preferably 2:8 to 8:2, and still more preferably 3:7 to 7:3. In the present invention, the component (S) preferably includes the above cyclic ketone and/or ether, PGMEA and PGME, because it excels in lithography properties.

The proportion of the above cyclic ketone and/or the ether in the component (S) is not particularly limited, and can arbitrarily be set in accordance with the types of the cyclic ketone and/or the ether. The proportion of the above cyclic ketone and/or the ether in the component (S) may be 100% by weight. The proportion of the above cyclic ketone and/or the ether in the component (S) is preferably 1 to 80% by weight, more preferably 5 to 60% by weight, and still more preferably 10 to 50% by weight, because it can exhibit more excellent lithography properties.

Also, the component (S) preferably includes γ-butyrolactone. The quantity of γ-butyrolactone is preferably 1 to 40 parts by weight, and more preferably 1 to 30 parts by weight, relative to 100 parts by weight of the component (A).

There are no particular restrictions on the quantity of the component (S), and the quantity should be set in accordance with the required coating film thickness within a concentration that enables favorable application of the solution to a substrate or the like. Typically, the quantity is set so that the solid fraction concentration within the resist composition falls within the range of 0.5 to 20% by weight, and preferably 1 to 15% by weight.

The resist composition of the present invention and the component (A1) included in the resist composition are respectively a novel resist composition and a novel compound each of which has not been known conventionally.

According to the resist composition of the present invention, a resist film having excellent adhesion relative to a support such as a substrate can be formed. Moreover, according to the resist composition of the present invention, a resist pattern can be formed with favorable sensitivity and excellent mask reproducibility (for example, mask error factor (MEF)), and the resist pattern shape thus formed (for example, circularity of the holes when a hole pattern is formed), the critical dimension uniformity (CDU), the line edge roughness (LER), the line width roughness (LWR) and the like are also favorable. The LWR is a phenomenon in which the line width of a line pattern becomes uneven (non-uniform) when a resist pattern is formed using a resist composition, and improvement in the level of LWR becomes an important issue as pattern miniaturization progresses.

Although the reason why the above effects can be attained is not clear, it can be thought as a factor that, since the structural unit (a0) includes a cyclic group containing —$SO_2$— as a polar group at the terminal of the relatively long side chain, the component (B) can be dispersed more uniformly, thereby improving lithography properties.

Additionally, it can be thought as another factor that, since the organic solvent (S) includes the cyclic ketone containing a 5 to 7-membered ring, the ether represented by the general formula (S-1), or a mixture thereof, the base component (A) can favorably be dissolved in the organic solvent (S), and the resist composition can stably be dissolved, thereby further improving lithography properties.

Also, the resist composition of the present invention excels in both of exposure margin (EL margin) and depth of focus (DOF), and has a large process window. Therefore, the use of the resist composition causes the improvement of the process margin in the resist pattern formation.

Here, the larger the value of the EL margin, the smaller the variation of the pattern size depending on the change in the exposure dose becomes, and the higher the process margin becomes.

The "DOF" is the range of depth of focus in which a resist pattern can be formed with a size where deviations relative to the target size are kept within the prescribed range when exposure is conducted moving the exposure focus upwardly or downwardly with the same exposure dose, i.e., the range in which a resist pattern faithful to the mask pattern can be obtained. A larger DOF is more preferable.

<<Method of Forming Resist Pattern>>

The method of forming a resist pattern of the present invention includes: forming a resist film on a substrate using the resist composition of the present invention described above, exposing the resist film, and developing the resist film to form a resist pattern.

The method of forming a resist pattern of the present invention can be performed, for example, in the following manner.

Firstly, the resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Following selective exposure of the formed resist film, either by exposure through a mask pattern using an exposure apparatus such as an ArF exposure apparatus, an electron beam lithography apparatus or an EUV exposure apparatus, or by patterning via direct irradiation with an electron beam without using a mask pattern, post-exposure baking (PEB) is conducted under temperature conditions of 80 to 150° C. for 40 to 120 seconds, preferably 60 to 90 seconds. Subsequently, a developing treatment is conducted using an alkali developing solution such as a 0.1 to 10% by mass aqueous solution of tetramethylammonium hydroxide (TMAH), preferably followed by rinsing with pure water, and drying. Also, according to circumstances, a bake treatment (post bake) may be conducted after the above developing treatment. In this manner, a resist pattern that is faithful to the mask pattern can be obtained.

The substrate is not specifically limited and a conventionally known substrate can be used. For example, substrates for electronic components, and such substrates having prescribed wiring patterns formed thereon can be used. Specific examples thereof include a silicon wafer; a substrate made of a metal such as copper, chromium, iron and aluminum; and a substrate made of glass. As materials for the wiring pattern, for example, copper, aluminum, nickel and gold can be used.

Further, as the substrate, any one of the above-mentioned substrates provided with an inorganic and/or organic film on the surface thereof may be used. As the inorganic film, an inorganic anti-reflection film (inorganic BARC) can be used. As the organic film, an organic anti-reflection film (organic BARC) can be used.

There is no particular restriction on the wavelength used for the exposure, and the exposure can be conducted using radiation such as ArF excimer lasers, KrF excimer lasers, $F_2$ excimer lasers, extreme ultraviolet rays (EUV), vacuum ultraviolet rays (VUV), electron beams (EB), X-rays, and soft X-rays. The resist composition is effective for KrF excimer lasers, ArF excimer lasers, EB and EUV, and particularly effective for ArF excimer lasers.

The exposure of the resist film may be a usual exposure (dry exposure) conducted in air or an inactive gas such as nitrogen gas, or may be an immersion exposure (liquid immersion lithography).

Here, the immersion exposure method is a method in which the region between the resist film and the lens at the lowermost point of the exposure apparatus is pre-filled with a solvent (immersion solvent) that has a larger refractive index than the refractive index of air, and then, maintaining such a condition, the exposure (immersion lithography) is conducted.

The immersion solvent is preferably a solvent that has a refractive index larger than the refractive index of air but smaller than the refractive index of the resist film used in the exposure process. There is no restriction on the refractive index of the immersion solvent, as long as the solvent has a refractive index within the above range.

Examples of the solvent which has a refractive index larger than that of air but smaller than that of the resist film include water, a fluorine-based inactive liquid, a silicon-based solvent, and a hydrocarbon-based solvent.

Specific examples of the fluorine-based inactive liquid include a liquid which has a fluorine-based compound as a main component, such as $C_3HCl_2F_5$, $C_4F_9OCH_3$, $C_4F_9OC_2H_5$, and $C_5H_3F_7$. The fluorine-based inactive liquid preferably has a boiling point within the range of 70 to 180° C., and more preferably 80 to 160° C. If the fluorine-based inactive liquid has a boiling point within the above range, the solvent used for the immersion lithography can be removed by a convenient method after exposure, and consequently it is preferable.

The fluorine-based inactive liquid is particularly preferably a perfluoroalkyl compound in which all hydrogen atoms of the alkyl group are substituted with fluorine atoms. Examples of the perfluoroalkyl compounds include perfluoroalkylether compounds and perfluoroalkylamine compounds.

Specific examples of the perfluoroalkylether compounds include a perfluoro(2-butyl-tetrahydrofuran) (boiling point: 102° C.), and specific examples of the perfluoroalkylamine compounds include a perfluorotributylamine (boiling point: 174° C.).

As the immersion solvent, water is preferably used in terms of cost, safety, environmental friendliness, and versatility.

EXAMPLES

Next, the present invention will be described in more detail with reference to examples, but the scope of the present invention is not limited to the following examples.

Monomer Synthesis Example 1

Synthesis of Compound (1)

The compound (1) used in "Polymer Synthesis Example 1" described below was synthesized in the following procedure.

300 ml of a THF solution containing 20 g (105.14 mmol) of the alcohol (1) shown below, 30.23 g (157.71 mmol) of ethyldiisopropylaminocarbodiimide (EDCI) hydrochloride, and 0.6 g (5 mmol) of dimethylaminopyridine (DMAP) were added to 500 ml three-neck flask under a nitrogen atmosphere. 16.67 g (115.66 mmol) of the precursor (1) shown below was added thereto upon cooling in ice (0° C.), and then stirred for 12 hours at room temperature.

After conducting thin-layer chromatography (TLC) to confirm that the raw materials had been consumed, 50 ml of water was added to stop the reaction. Then, the reaction solvent was concentrated under reduced pressure, and extraction was conducted with ethyl acetate three times. The obtained organic phase was washed with water, saturated sodium hydrogencarbonate and 1N-HClaq in this order. Thereafter, the solvent was distilled off under reduced pressure, and the resulting product was dried, thereby obtaining the compound (1).

The results of instrumental analysis of the compound (1) thus obtained are as described below.

$^1$H-NMR (CDCl$_3$, 400 MHz): δ (ppm)=6.22 (s, 1H, H$^a$), 5.70 (s, 1H, H$^b$), 4.71-4.85 (m, 2H, H$^{c,d}$), 4.67 (s, 2H, H$^k$), 3.40-3.60 (m, 2H, H$^{e,f}$), 2.58-2.70 (m, 1H, H$^g$), 2.11-2.21 (m, 2H, H$^h$), 2.00 (s, 3H, H$^i$), 1.76-2.09 (m, 2H, H$^j$).

[Chemical Formula 54]

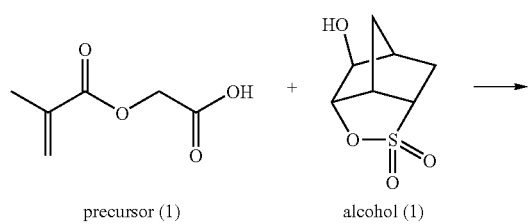

precursor (1)    alcohol (1)

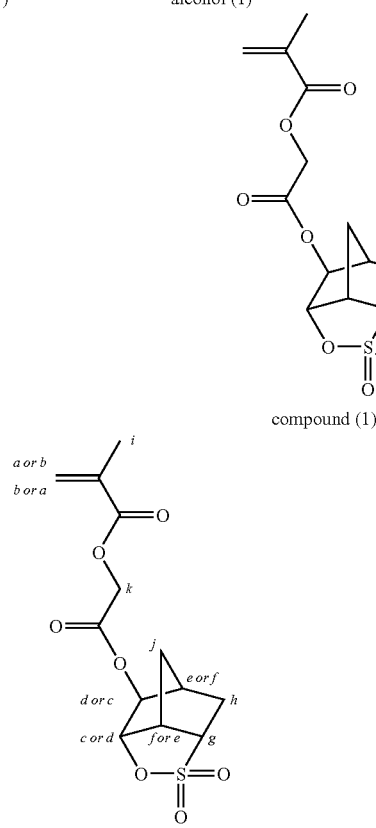

compound (1)

Polymer Synthesis Example 1

9.92 g (58.30 mmol) of the compound (5) shown below, 14.14 g (44.70 mmol) of the compound (1) shown below, 15.30 g (58.30 mmol) of the compound (6) shown below, 3.60 g (21.38 mmol) of the compound (7) shown below, and 2.76 g (11.66 mmol) of the compound (4) shown below were dissolved in 66.71 g of methyl ethyl ketone (MEK) in a three-neck flask equipped with a thermometer and a reflux tube. Then, 17.4 mmol of dimethyl azobis(isobutyrate) (product name: V-601) as a radical polymerization initiator was added and dissolved in the resultant solution. The solution was dropwise added to 37.95 g of MEK heated at 78° C. for 3 hours under a nitrogen atmosphere. After the dropwise adding treatment, the reaction solution was stirred whilst heating for 4 hours, and then cooled down at room temperature. The reaction polymer solution thus obtained was dropwise added to a large amount of a mixed solvent of n-heptane/isopropyl alcohol, thereby precipitating a polymer. The precipitated white powder was separated by filtration, washed with a mixed solvent of n-heptane/isopropyl alcohol and dried, thereby obtaining 25 g of the polymeric compound 1.

With respect to the polymeric compound 1, the weight average molecular weight (Mw) (the polystyrene equivalent value determined by gel permeation chromatography (GPC)) was 7,000, and the dispersity (Mw/Mn) was 1.43. Also, the copolymer composition ratio (proportion (molar ratio) of each structural unit within the polymeric compound) determined by carbon 13 nuclear magnetic resonance spectrum (600 MHz $^{13}$C-NMR) was l/m/n/o/p=36.9/28.0/14.5/13.1/7.7.

[Chemical Formula 55]

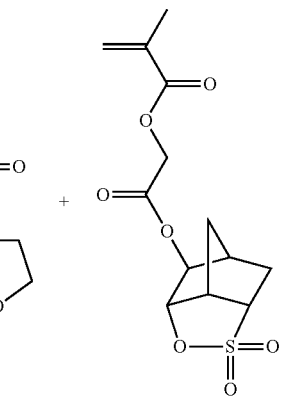

(5)             (1)

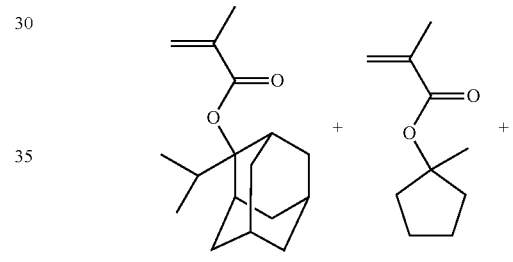

(6)             (7)

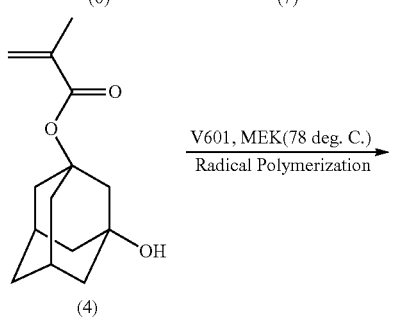

(4)

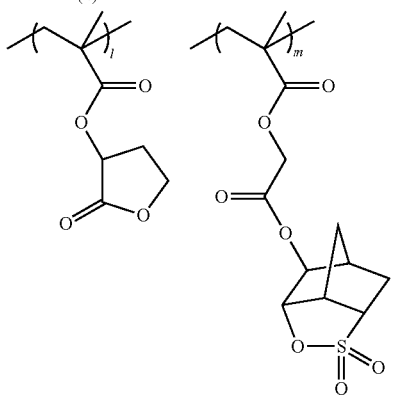

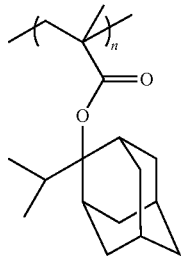

polymeric compound 1

Polymer Synthesis Example 2

The polymeric compound 2 (l/m/n/o/p=35/22/18/13/12) was synthesized in the same manner as the above [Polymer Synthesis Example 1].

With respect to the polymeric compound 2, the weight average molecular weight (Mw) (the polystyrene equivalent value determined by gel permeation chromatography (GPC)) was 7,000, and the dispersity (Mw/Mn) was 1.43.

Polymer Synthesis Example 3

The polymeric compound 3 (l/m/n/o/p=36/22/16/14/12) was synthesized in the same manner as the above [Polymer Synthesis Example 1].

With respect to the polymeric compound 3, the weight average molecular weight (Mw) (the polystyrene equivalent value determined by gel permeation chromatography (GPC)) was 7,000, and the dispersity (Mw/Mn) was 1.43.

Polymer Synthesis Example 4

15.24 g (89.66 mmol) of the compound (5) shown below, 20.00 g (64.29 mmol) of the compound (1) shown below, 17.00 g (68.56 mmol) of the compound (10) shown below, 6.56 g (39.56 mmol) of the compound (7) shown below, and 4.36 g (18.46 mmol) of the compound (4) shown below were dissolved in 94.88 g of methyl ethyl ketone (MEK) in a three-neck flask equipped with a thermometer and a reflux tube. Then, 14.0 mmol of dimethyl azobis(isobutyrate) (product name: V-601) as a radical polymerization initiator was added and dissolved in the resultant solution. The solution was dropwise added to 52.7 g of MEK heated at 78° C. for 3 hours under a nitrogen atmosphere. After the dropwise adding treatment, the reaction solution was stirred on heating for 4 hours, and then cooled down at room temperature. The reaction polymer solution thus obtained was dropwise added to a large amount of n-heptane, thereby precipitating a polymer. The precipitated white powder was separated by filtration, washed with a mixed solvent of n-heptane/isopropyl alcohol and dried, thereby obtaining 50 g of the polymeric compound 4.

With respect to the polymeric compound 4, the weight average molecular weight (Mw) (the polystyrene equivalent value determined by gel permeation chromatography (GPC)) was 7,000, and the dispersity (Mw/Mn) was 1.5. Also, the copolymer composition ratio (proportion (molar ratio) of each structural unit within the polymeric compound) determined by carbon 13 nuclear magnetic resonance spectrum (600 MHz $^{13}$C-NMR) was l/m/n/o/p=35/26/19/13/7.

[Chemical Formula 56]

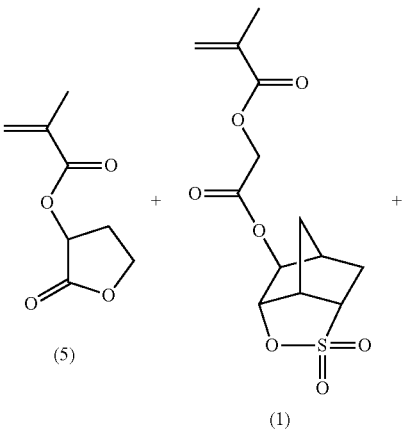

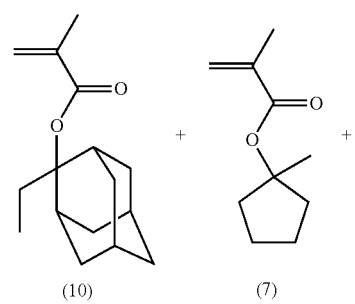

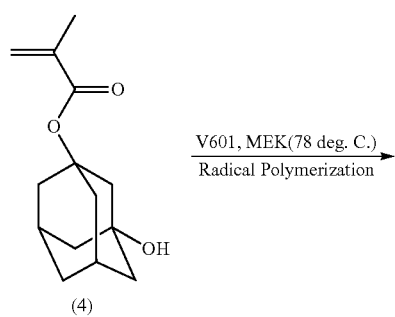

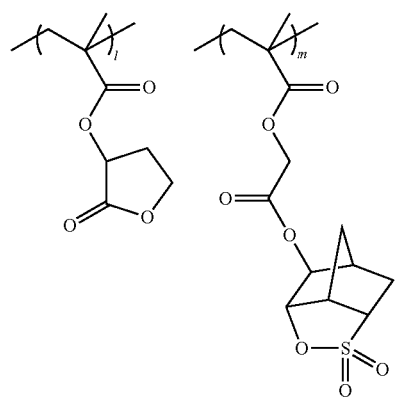

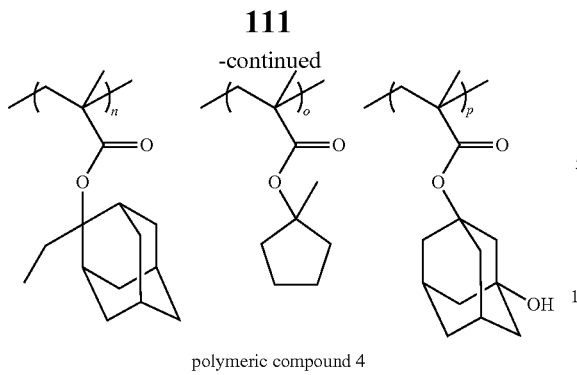

polymeric compound 4

Polymer Synthesis Example 5

The polymeric compound 5 (l/m/n/o/p=36.5/22.5/19.5/13.5/8.0) was synthesized in the same manner as the above [Polymer Synthesis Example 4].

With respect to the polymeric compound 5, the weight average molecular weight (Mw) (the polystyrene equivalent value determined by gel permeation chromatography (GPC)) was 7,400, and the dispersity (Mw/Mn) was 1.64.

Polymer Synthesis Example 6

The polymeric compound 6 (l/m/n/o/p=34.4/20.1/21.8/13.6/10.1) was synthesized in the same manner as the above [Polymer Synthesis Example 4].

With respect to the polymeric compound 6, the weight average molecular weight (Mw) (the polystyrene equivalent value determined by gel permeation chromatography (GPC)) was 8,800, and the dispersity (Mw/Mn) was 1.52.

Compound Synthesis Example 1

Synthesis of Compound (B)-1

4.34 g of the compound (II) (purity: 94.1%), 3.14 g of 2-benzyloxyethanol, and 43.4 g of toluene were prepared, and 0.47 g of p-toluenesulfonic acid monohydrate was added thereto. The resultant solution was then refluxed for 20 hours at 105° C. The reaction solution was filtrated, and 20 g of hexane was added to the residue. Then, the resultant was stirred. The resultant was filtrated once more, and the residue was dried, thereby obtaining 1.41 g of the compound (V) shown below (yield: 43.1%).

[Chemical Formula 57]

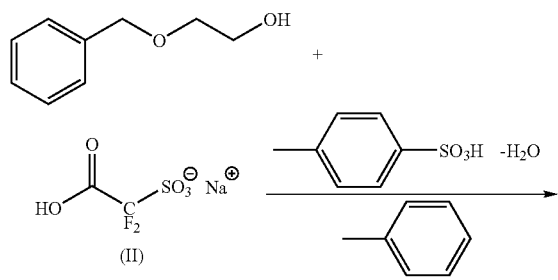

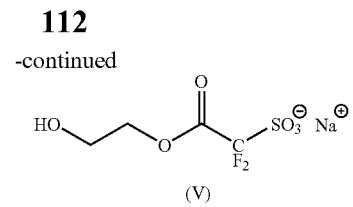

The compound (V) was analyzed using NMR. The results are shown below.

$^1$H-NMR (DMSO-d6, 400 MHz): δ (ppm)=4.74-4.83 (t, 1H, OH), 4.18-4.22 (t, 2H, $H^a$), 3.59-3.64 (q, 2H, $H^b$).

$^{19}$F-NMR (DMSO-d6, 376 MHz): δ (ppm)=−106.6.

From the results described above, it was confirmed that the compound (V) had the structure shown below.

[Chemical Formula 58]

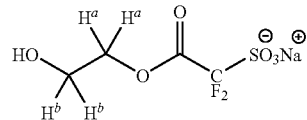

0.82 g of 1-adamantanecarbonyl chloride and 0.397 g of triethylamine were dropwide added to 1.00 g of the compound (V) and 3.00 g of acetonitrile whilst cooling in ice. After the dropwise addition, the solution was stirred for 20 hours at room temperature, and then filtrated. The filtrate was concentrated and dried, then dissolved in 30 g of dichloromethane, and washed with water three times. The organic phase was concentrated and dried, thereby obtaining 0.82 g of the compound (VI) shown below (yield: 41%).

[Chemical Formula 59]

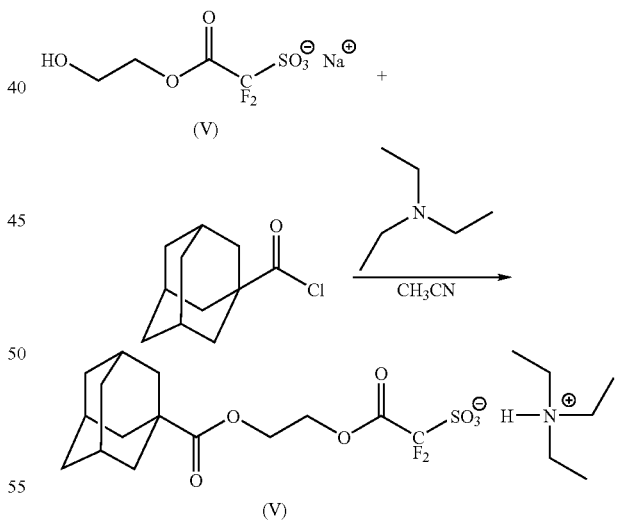

The compound (VI) thus obtained was analyzed using NMR.

$^1$H-NMR (DMSO-d6, 400 MHz): δ (ppm)=8.81 (s, 1H, $H^c$), 4.37-4.44 (t, 2H, $H^d$), 4.17-4.26 (t, 2H, $H^e$), 3.03-3.15 (q, 6H, $H^b$), 1.61-1.98 (m, 15H, adamantane), 1.10-1.24 (t, 9H, $H^a$).

$^{19}$F-NMR (DMSO-d6, 376 MHz): δ (ppm)=−106.61.

From the results described above, it was confirmed that the compound (VI) had the structure shown below.

[Chemical Formula 60]

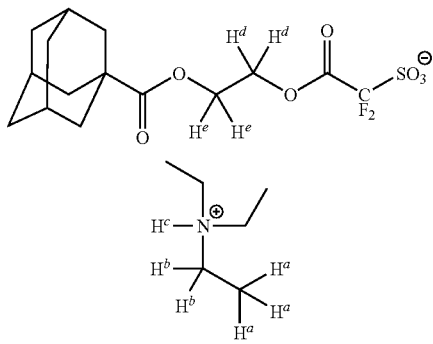

0.384 g of the compound (VII) shown below was dissolved in 3.84 g of dichloromethane and 3.84 g of water, and then 0.40 g of the compound (VI) was added thereto. After the resultant solution was stirred for 1 hour, the organic phase was collected by fractionation, and then washed with 3.84 g of water three times. The organic phase thus obtained was concentrated and dried, thereby obtaining 0.44 g of the compound (VIII) shown below (yield: 81.5%).

[Chemical Formula 61]

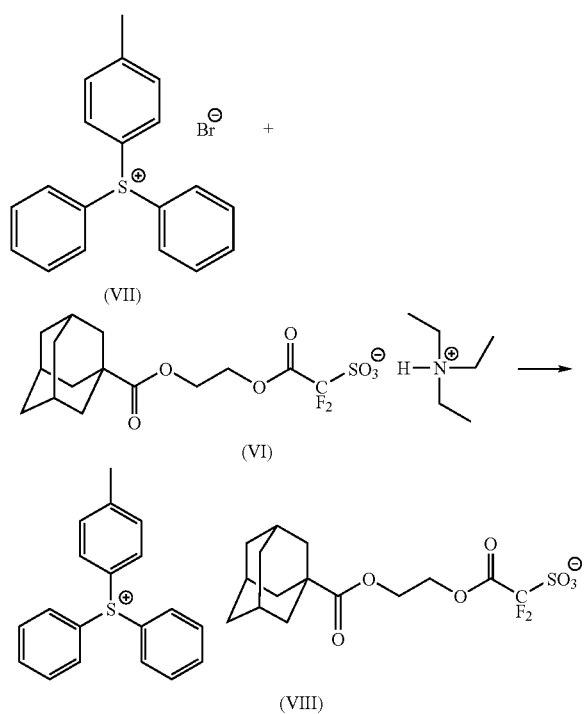

The compound (VIII) thus obtained was analyzed using NMR.

$^1$H-NMR (DMSO-d6, 400 MHz): δ (ppm)=7.57-7.87 (m, 14H, Phenyl), 4.40-4.42 (t, 2H, H$^b$), 4.15-4.22 (t, 2H, H$^a$), 2.43 (s, 3H, H$^e$), 1.60-1.93 (m, 15H, adamantane).

$^{19}$F-NMR (DMSO-d6, 376 MHz): δ (ppm)=−106.7.

From the results described above, it was confirmed that the compound (VIII) had the structure shown below.

[Chemical Formula 62]

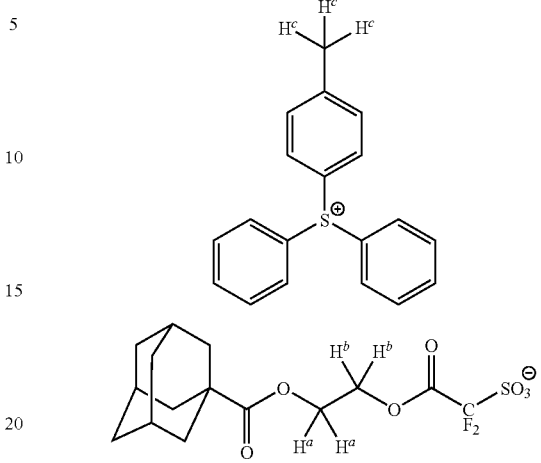

Compound Synthesis Example 2

Synthesis of Compound (B)-3

(i) 5.00 g of the compound (II) shown below, 5.68 g of the sultone-OH (c) shown below and 100 g of toluene were prepared, and 0.43 g of p-toluenesulfonic acid monohydrate was added thereto. The resultant was heated until toluene was refluxed, and while maintaining such conditions, a reaction was conducted for 65 hours. Then, the steps of filtering the resultant, adding 100 g of toluene to the residue, stirring the solution thus obtained at room temperature for 10 minutes, and filtering the solution were conducted twice, thereby obtaining a black powder. The obtained powder was dried under reduced pressure for one night. Then, an extraction treatment was conducted twice using 100 g of acetone, thereby obtaining a filtrate. Acetone was distilled away from the obtained filtrate, and then the resultant was dissolved in 30 g of acetone. The resulting solution was dropwise added slowly to 300 g of TBME and 300 g of methylene chloride. Thereafter, the precipitated solid was collected by filtration and dried, thereby obtaining 6.88 g of the compound (IX) shown below in the form of a white powder (yield: 78.4%).

[Chemical Formula 63]

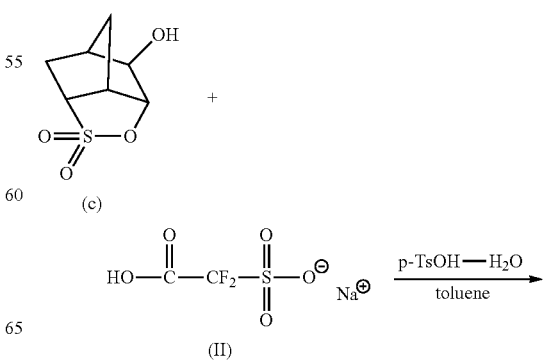

115

-continued

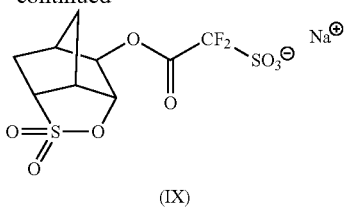

(IX)

The obtained compound (IX) was analyzed using $^1$H-NMR and $^{19}$F-NMR.

$^1$H-NMR (DMSO-d6, 400 MHz): δ (ppm) 1.73-2.49 (m, 4H, Ha, Hb), 2.49 (m, 1H, He), 3.48 (m, 1H, Hd), 3.88 (t, 1H, He), 4.66 (t, 1H, Hf), 4.78 (m, 1H, Hg).

$^{19}$F-NMR (DMSO-d6, 400 MHz): δ (ppm) −107.7 (m, 2F, Fa) (here, the peak of hexafluorobenzene was regarded as −160 ppm).

From the results described above, it was confirmed that the compound (IX) had a structure shown below.

[Chemical Formula 64]

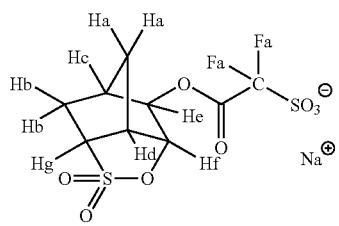

(ii) Subsequently, 3.21 g of the compound (IX) was dissolved in 32.1 g of pure water, 3.72 g of 4-methylphenyldiphenylsulfonium bromide was added thereto, and then 32.1 g of methylene chloride was added thereto. The resultant was stirred for 1 hour at room temperature. Thereafter, the organic phase was collected by fractionation. The organic phase was washed three times with 1% aqueous solution of HCl, and four times with pure water. The resulting organic phase was concentrated, thereby obtaining 4.94 g of the compound (X) shown below in the form of a white solid (yield: 86.8%).

[Chemical Formula 65]

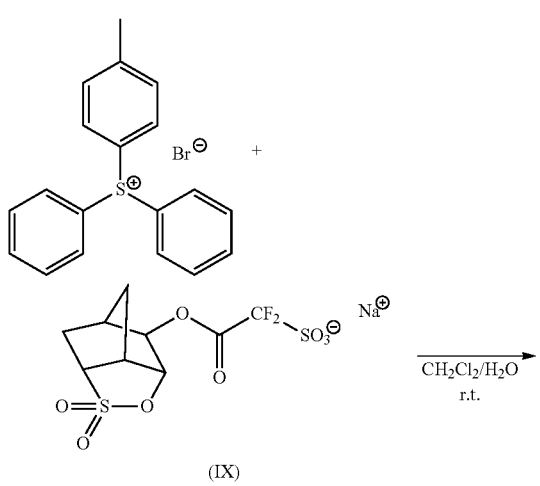

116

-continued

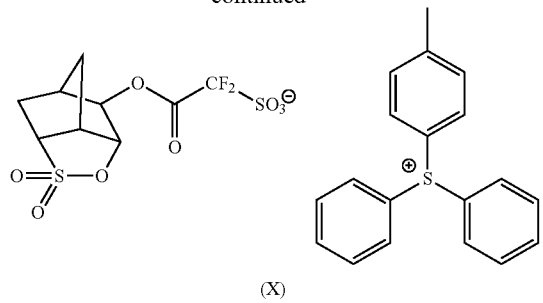

(X)

The obtained compound (X) was analyzed using $^1$H-NMR and $^{19}$F-NMR.

$^1$H-NMR (DMSO-d6, 400 MHz): δ (ppm) 1.74-2.21 (m, 4H, anion), 2.41 (t, 3H, PhCH$_3$), 2.58 (m, 1H, anion), 3.48 (m, 1H, anion), 3.87 (t, 1H, anion), 4.66 (t, 1H, anion), 4.78 (m, 1H, anion), 7.58 (m, 2H, ph), 7.64-7.84 (m, 12H, ph).

$^{19}$F-NMR (DMSO-d6, 400 MHz): δ (ppm)-107.6 (m, 2F, Fa) (here, the peak of hexafluorobenzene was regarded as −160 ppm).

From the results described above, it was confirmed that the compound (X) had the structure represented by the formula (X) shown above.

Compound Synthesis Example 3

Synthesis of Compound (B)-4

(i) 150 g of methyl fluorosulfonyl(difluoro)acetate and 375 g of pure water were maintained at 10° C. or lower in an ice bath, and 343.6 g of a 30% aqueous solution of sodium hydroxide was dropwise added thereto. Then, the resultant was refluxed at 100° C. for 3 hours, followed by cooling and then neutralizing with concentrated hydrochloric acid. The resulting solution was dropwise added to 8,888 g of acetone, and the precipitate was collected by filtration and dried, thereby obtaining 184.5 g of the compound (I) shown below in the form of a white solid (purity: 88.9%, yield: 95.5%).

[Chemical Formula 66]

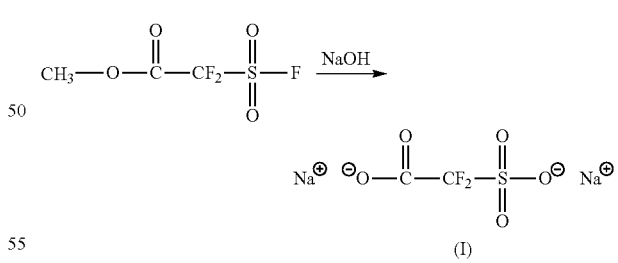

(ii) 56.2 g of the compound (I) and 562.2 g of acetonitrile were prepared, and 77.4 g of p-toluenesulfonic acid monohydrate was added thereto. The resultant was refluxed at 110° C. for 3 hours. Then, the solution was filtered, and the filtrate was concentrated and dried to obtain a solid. 900 g of t-butyl methyl ether was added to the obtained solid and stirred. Thereafter, the resultant was filtered, and the residue was dried, thereby obtaining 22.2 g of a compound (II) shown below in the form of a white solid (purity: 91.0%, yield: 44.9%).

[Chemical Formula 67]

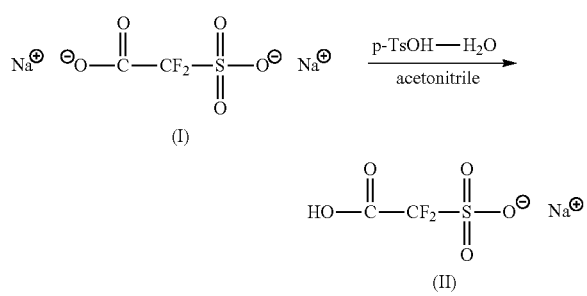

(iii) 17.7 g of the compound (II) (purity: 91.0%) obtained through the above (ii), 13 g of the compound (II') represented by the formula (II') shown below, and 88.3 g of toluene were prepared, and 5.85 g of p-toluenesulfonic acid monohydrate was added thereto. Then, the resultant solution was refluxed for 26 hours at 130° C. Thereafter, the resultant was filtrated, and then 279.9 g of methyl ethyl ketone was added to the residue and stirred. Subsequently, the resultant was filtrated, and then 84.0 g of methanol was added to the residue and stirred. The resultant was filtrated once more, and the residue was dried, thereby obtaining 20.2 g of the compound (III) shown below in the form of a white solid (purity: 99.9%, yield: 72.1%).

[Chemical Formula 68]

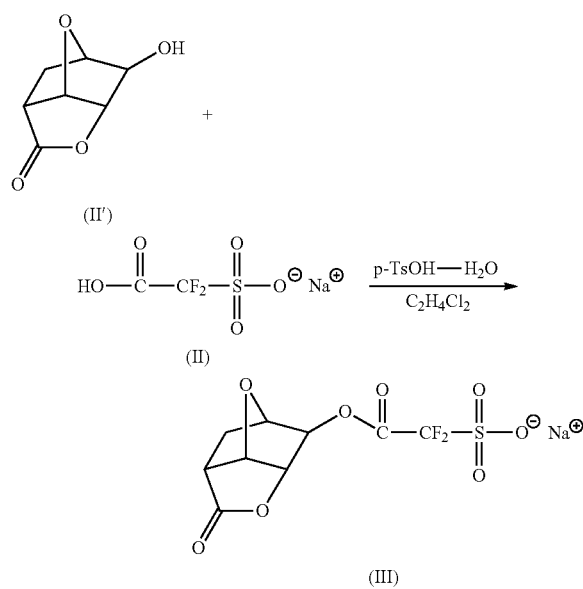

(iv) Subsequently, 15.0 g of the compound (III) (purity: 99.9%) obtained through the above (iii) was dissolved in 66.4 g of pure water. 13.3 g of 4-methyltriphenylsulfonium bromide dissolved in 132.8 g of dichloromethane was added to the above solution, and stirred for 3 hours at room temperature. The organic phase was then collected by fractionation. The organic layer was further washed with 66.4 g of pure water, and then concentrated and dried, thereby obtaining 20.2 g of the compound (IV) in the form of a colorless viscous liquid (yield: 88.1%).

[Chemical Formula 69]

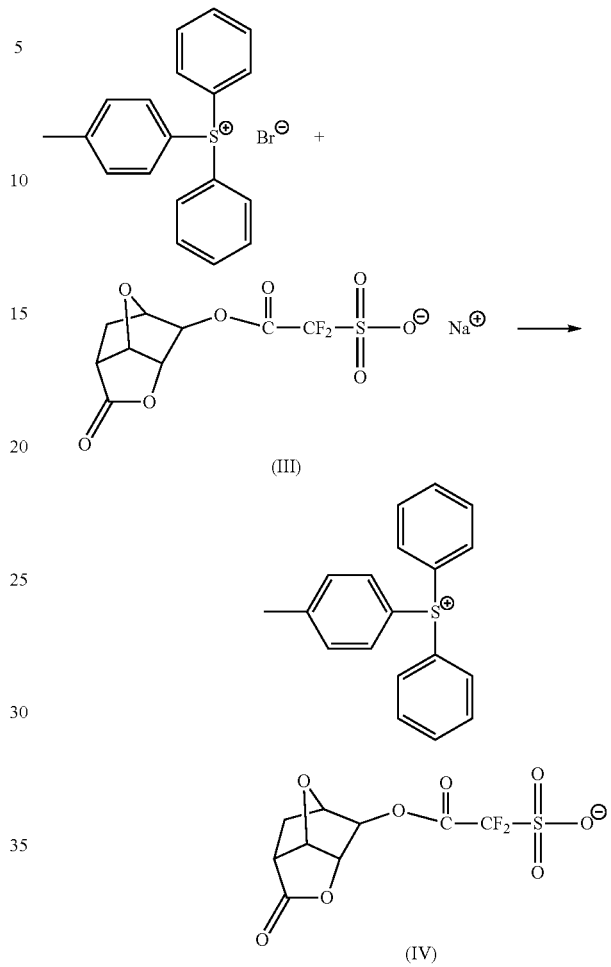

The compound (IV) was analyzed using NMR. The results are shown below.

$^1$H-NMR (DMSO, 400 MHz): δ (ppm)=7.86-7.58 (m, 14H, Ha+Hb), 5.48 (m, 1H, Hd), 4.98 (s, 1H, He), 4.73-4.58 (d, 2H, Hf), 2.71 (m, 1H, Hg), 2.43 (m, 3H, Hc), 2.12 (m, 2H, Hh).

$^{19}$F-NMR (DMSO, 376 MHz): δ (ppm)=−106.9.

From the results described above, it was confirmed that the compound (IV) had the structure shown below.

[Chemical Formula 70]

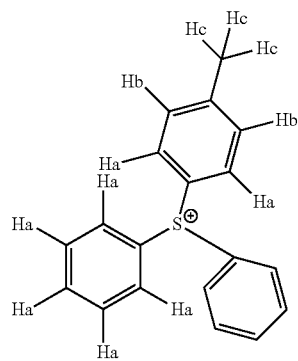

-continued

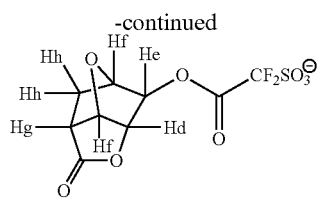

<Solubility of Polymeric Compound>

0.2 g of the polymeric compound 1 (here, l/m/n/o/p=36.9/28.0/14.5/13.1/7.7) was added to 3.8 g of each solvent shown in Table 1 so that the concentration of the polymeric compound 1 was 5%, and then the solution was stirred for 4 days. The degree to which the polymeric compound 1 was dissolved in each solvent was evaluated according to the criteria described below. The results are shown in Table 1. A: the polymeric compound was immediately dissolved. B: the polymeric compound was completely dissolved. C: the polymeric compound was partially dissolved. D: the polymeric compound was not dissolved. Here, in Table 1, CD means that the polymeric compound was partially dissolved in some cases and was not dissolved in the other cases.

TABLE 1

|   | Solvent | After a lapse of 4 days |
|---|---------|-------------------------|
| Reference Example 1 | butoxypropanol | D |
| Reference Example 2 | propylene glycol monomethyl ether | CD |
| Reference Example 3 | methyl-n-amil ketone | CD |
| Reference Example 4 | propylene glycol monomethyl ether acetate | C |
| Reference Example 5 | cyclohexanone | B |
| Reference Example 6 | isobutyl alcohol | D |
| Reference Example 7 | isopropyl alcohol | D |
| Reference Example 8 | anisole | A |

<Evaluation of Remaining Solvent>

The polymeric compound 1 (here, l/m/n/o/p=36.9/28.0/14.5/13.1/7.7) was dissolved in each of the solvents described in Table 2, the obtained solution was applied on a silicon substrate, and a resist film having a film thickness of 110 nm was formed. The proportion of solvent remaining in the resist film was measured. The results are shown in Table 2.

TABLE 2

|   | Propylene glycol monomethyl ether acetate remaining amount | Propylene glycol monomethyl ether remaining amount | cyclohexanone remaining amount | anisole remaining amount |
|---|---|---|---|---|
| propylene glycol monomethyl ether acetate/propylene glycol monomethyl ether/cyclohexanone (30/20/50) | 0.13% | 0.01% | 0.67% | — |
| propylene glycol monomethyl ether acetate/propylene glycol monomethyl ether/cyclohexanone (45/30/25) | 0.28% | 0.02% | 0.39% | — |
| propylene glycol monomethyl ether acetate/propylene glycol monomethyl ether (60/40) | 0.67% | 0.02% | — | — |
| propylene glycol monomethyl ether acetate/propylene glycol monomethyl ether/anisole (30/20/50) | 0.54% | 0.02% | — | not detected |

Resist Composition Preparation-1

Examples 1 to 7 and Comparative Examples 1 to 3

The components shown in Tables 3 to 5 were mixed and dissolved to obtain the positive resist compositions of Examples 1 to 7 and Comparative Examples 1 to 3.

TABLE 3

|   | Component (A) | Component (B) | | Component (D) | Component (E) | Component (S) |
|---|---|---|---|---|---|---|
| Example 1 | (A)-1 [100] | (B)-1 [6.7] | (B)-2 [2.6] | (D)-1 [0.2] | (E)-1 [0.24] | (S)-1 [2900] |
| Example 2 | (A)-1 [100] | (B)-1 [6.7] | (B)-2 [2.6] | (D)-1 [0.2] | (E)-1 [0.24] | (S)-2 [2900] |
| Comparative Example 1 | (A)-1 [100] | (B)-1 [6.7] | (B)-2 [2.6] | (D)-1 [0.2] | (E)-1 [0.24] | (S)-3 [2900] |
| Example 3 | (A)-2 [100] | (B)-1 [6.7] | (B)-2 [2.6] | (D)-1 [0.2] | (E)-1 [0.24] | (S)-1 [2900] |

TABLE 4

| | Component (A) | Component (B) | | Component (D) | Component (E) | Component (S) | |
|---|---|---|---|---|---|---|---|
| Example 4 | (A)-2 [100] | (B)-1 [6.7] | (B)-2 [2.6] | (D)-1 [0.2] | (E)-1 [0.24] | (S)-6 [10] | (S)-5 [2900] |
| Example 5 | (A)-2 [100] | (B)-1 [6.7] | (B)-2 [2.6] | (D)-1 [0.2] | (E)-1 [0.24] | (S)-6 [10] | (S)-4 [2900] |
| Comparative Example 2 | (A)-1 [100] | (B)-1 [6.7] | (B)-2 [2.6] | (D)-1 [0.2] | (E)-1 [0.24] | (S)-6 [10] | (S)-3 [2900] |

TABLE 5

| | Component (A) | Component (B) | | Component (D) | Component (E) | Component (S) |
|---|---|---|---|---|---|---|
| Example 6 | (A)-2 [100] | (B)-1 [6.7] | (B)-2 [2.6] | (D)-1 [0.2] | (E)-1 [0.24] | (S)-4 [2900] |
| Example 7 | (A)-3 [100] | (B)-1 [6.7] | (B)-2 [2.6] | (D)-1 [0.2] | (E)-1 [0.24] | (S)-1 [2900] |
| Comparative Example 3 | (A)-4 [100] | (B)-1 [6.7] | (B)-2 [2.6] | (D)-1 [0.2] | (E)-1 [0.24] | (S)-1 [2900] |

In Tables 3 to 5, each of the abbreviations indicates the following. Also, the values within the brackets [ ] indicate blending amount (parts by weight).

(A)-1: the polymeric compound 2 (here, l/m/n/o/p=36/22/16/14/12).

(A)-2: the polymeric compound 4 (here, l/m/n/o/p=35/26/19/13/7).

(A)-3: the polymeric compound 3 (here, l/m/n/o/p=36/22/16/14/12).

(A)-4: the polymer compound represented by the formula (A)-4 shown below.

[Chemical Formula 71]

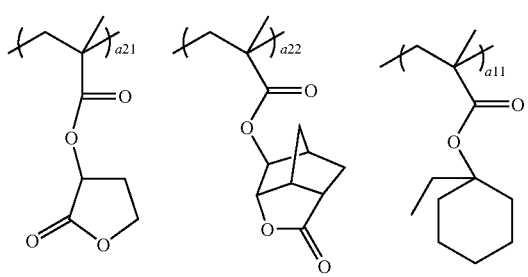

(A)-4

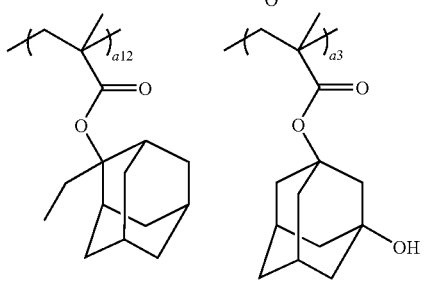

Mw=7,000. Mw/Mn=1.7. In the formula, the symbols attached at the bottom right of the brackets ( ) denote a21/a22/a11/a12/a3=30/25/10/25/10, each of which means the proportion of each structural unit (mol %).

(B)-1: the compound represented by the formula (3)-1 shown below.

[Chemical Formula 72]

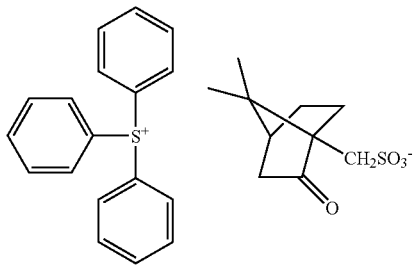

(B)-1

(B)-2: the compound represented by the formula (B)-2 shown below.

[Chemical Formula 73]

(B)-2

(D)-1: tri-n-pentylamine.
(E)-1: salicylic acid.

(S)-1: a mixed solvent of PGMEA/PGME/CH=45/30/25 (mass ratio).

(S)-2: a mixed solvent of PGMEA/PGME/ANI=45/30/25 (mass ratio).

(S)-3: a mixed solvent of PGMEA/PGME=60/40 (mass ratio).

(S)-4: a mixed solvent of PGMEA/PGME/CH=30/20/50 (mass ratio).

(S)-5: a mixed solvent of PGMEA/PGME/ANI=30/20/50 (mass ratio).

(S)-6: γ-butyrolactone.

Here, CH represents cyclohexanone, and ANI represents anisole. PGMEA represents propylene glycol monomethyl ether acetate, and PGME represents propylene glycol monomethyl ether.

<Lithography Properties Evaluation-1>

Resist patterns were formed according to the following procedure using the resist composition thus obtained, and lithography properties were evaluated.

[Resist Pattern Formation-1]

An organic anti-reflection film composition (product name: ARC95, manufactured by Brewer Science Ltd.) was applied onto an 12-inch silicon wafer using a spinner, and the composition was then baked on a hotplate at 205° C. for 60 seconds, thereby forming an organic anti-reflection film having a film thickness of 90 nm. Then, the positive resist composition of each of Examples 1 to 5 and Comparative Examples 1 and 2 was applied onto the anti-reflection film using a spinner, and was then prebaked (PAB) on a hotplate under the conditions shown in Table 6 and dried, thereby forming a resist film having a film thickness of 90 nm.

Subsequently, a coating solution for forming a protection film (product name: TILC-057; manufactured by Tokyo Ohka Kogyo Co., Ltd.) was applied onto the resist film using a spinner, and then heated at 90° C. for 60 seconds, thereby forming a top coat with a film thickness of 35 nm.

Then, the resist film having a top coat formed thereon was selectively irradiated with an ArF excimer laser (193 nm) through a mask pattern, using an ArF immersion exposure apparatus NSR-S609B (manufactured by Nikon Corporation, NA (numerical aperture)=1.07, σ Di-pole 35 (0.78/0.97)).

Then, a post-exposure bake (PEB) treatment was conducted under the conditions shown in Table 6, followed by development for 10 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist film was rinsed for 15 seconds with pure water, followed by drying by shaking.

As a result, in each of the examples, a line and space pattern (hereinafter, referred to as "LS pattern") was formed with a line width of 50 nm and a pitch of 100 nm on the resist film.

The sensitivity for forming a LS pattern with a line width of 50 nm above was set as an optimum exposure "Eop" (mJ/cm$^2$). Eop of each positive resist composition is shown in Table 6.

[Evaluation of EL Margin]

The exposure dose when the LS pattern was formed with a line width within the range of ±5% (that is, 47.5 to 52.5 nm) of the target size (line width: 50 nm) was determined, and then EL margin (unit: %) was determined using the following formula. The results are shown in Table 6. Here, EL margin indicates that, the larger the value of EL margin, the smaller the variation in the pattern size depending on the change in the exposure dose.

EL margin (%)=(|E1−E2|/Eop)×100

E1 represents an exposure dose (mJ/cm$^2$) when a LS pattern with a line width of 47.5 nm was formed, and E2 represents an exposure dose (mJ/cm$^2$) when a LS pattern with a line width of 52.5 nm was formed.

[Evaluation of Depth of Focus (DOF)]

Using the above Eop, the focus was appropriately shifted up and down, and the depth of focus (DOF) (unit: μm) was determined within the range where the above LS pattern could be resolved and formed. The results are shown in Table 6.

TABLE 6

| | Eop (mJ/cm$^2$) | EL margin (%) | DOF (nm) | PAB/PEB |
|---|---|---|---|---|
| Example 1 | 29.9 | 8.0 | 350 | 105° C. 60 seconds/ 95° C. 60 seconds |
| Example 2 | 30.6 | 8.0 | 300 | 105° C. 60 seconds/ 95° C. 60 seconds |
| Example 3 | 29.8 | 8.0 | 350 | 110° C. 60 seconds/ 95° C. 60 seconds |
| Comparative Example 1 | 30.2 | 7.0 | 200 | 105° C. 60 seconds/ 95° C. 60 seconds |
| Example 4 | 22.7 | 10.0 | 250 | 110° C. 60 seconds/ 95° C. 60 seconds |
| Example 5 | 21.3 | 10.0 | 300 | 110° C. 60 seconds/ 95° C. 60 seconds |
| Comparative Example 2 | 19.9 | 9.7 | 200 | 110° C. 60 seconds/ 95° C. 60 seconds |

[Evaluation of LER (Line Edge Roughness)]

With respect to Examples 1 to 3 and Comparative Example 1, size variations per line of LS pattern were evaluated. 16 line pattern sizes were measured using a length measuring SEM (scanning electron microscope; acceleration voltage: 800V; product name: "S-9220"; manufactured by Hitachi, Ltd.). From the results, 3-fold value (3s) of standard deviation (s) was calculated. The smaller the value 3s thus calculated, the lower the level of roughness, indicating that an LS pattern with a uniform width was obtained. The results are shown in Table 7.

TABLE 7

| | LER |
|---|---|
| Example 1 | 3.3 |
| Example 2 | 3.5 |
| Example 3 | 2.7 |
| Comparative Example 1 | 4.0 |

[Critical Resolution]

With respect to Examples 4 and 5 and Comparative Example 2, the critical resolutions of the line portion and space portion in a LS pattern having a fixed pitch of 100 nm were measured while changing exposure dose. The results are shown in Table 8.

TABLE 8

| | Space portion (nm) | Line Portion (nm) |
|---|---|---|
| Example 4 | 35.3 | 40.7 |
| Example 5 | 30.3 | 39.8 |
| Comparative Example 2 | 38.1 | 41.6 |

[Pattern Collapse Resistance]

With respect to each of Examples 4 and 5 and Comparative Example 2, the resistance to the collapse of the LS pattern was observed while changing the DOF at an exposure dose higher than the above Eop (here, the exposure dose was set to an exposure dose higher than the Eop, because higher exposure dose becomes a more forcing condition in the evaluation of the pattern collapse). The resistance was evaluated according to the following criteria. The results are shown in Table 9. Here, the minus side of DOF becomes a more forcing condition in the evaluation of pattern collapse than the plus side of DOF. A: No pattern collapse was observed although there were partially-defective patterns. B: A part of the patterns collapsed and disappeared. C: A part of the patterns collapsed and disappeared, and many patterns were partially defective. D: Many patterns collapsed and disappeared, and there were many defects.

TABLE 9

|  | Plus side of DOF | Minus side of DOF |
|---|---|---|
| Example 4 | A | B |
| Example 5 | A | B |
| Comparative Example 2 | C | D |

TABLE 10

|  | Eop (mJ/cm$^2$) | LER (nm) | DOF (nm) | PAB/PEB |
|---|---|---|---|---|
| Example 6 | 27.4 | 3.58 | 300 | 110° C. 60 seconds/ 95° C. 60 seconds |
| Example 7 | 35.3 | 3.38 | 300 | 105° C. 60 seconds/ 95° C. 60 seconds |
| Comparative Example 3 | 33.6 | 3.84 | 150 | 105° C. 60 seconds/ 95° C. 60 seconds |

Resist Composition Preparation-2

Examples 8 to 15

The components shown in Table 11 were mixed and dissolved to obtain positive resist compositions of Examples 8 to 15.

TABLE 11

|  | Component (A) | Component (B) | | Component (D) | Component (E) | Component (S) | |
|---|---|---|---|---|---|---|---|
| Example 8 | (A)-1 [100] | (B)-3 [8.3] | (B)-2 [2.0] | (D)-1 [0.81] | (E)-1 [1.01] | (S)-6 [10] | (S)-4 [3200] |
| Example 9 | (A)-5 [100] | (B)-1 [6.7] | (B)-2 [2.0] | (D)-1 [0.53] | (E)-1 [0.63] | (S)-6 [10] | (S)-4 [3200] |
| Example 10 | (A)-6 [100] | (B)-3 [8.4] | (B)-2 [2.0] | (D)-1 [0.25] | (E)-1 [0.30] | (S)-6 [10] | (S)-4 [3200] |
| Example 11 | (A)-6 [100] | (B)-3 [6.4] | (B)-2 [2.0] | (D)-1 [0.40] | (E)-1 [0.48] | (S)-6 [10] | (S)-1 [3200] |
| Example 12 | (A)-2 [100] | (B)-1 [6.7] | (B)-2 [2.0] | (D)-1 [0.53] | (E)-1 [0.85] | (S)-6 [10] | (S)-4 [3200] |
| Example 13 | (A)-2 [100] | (B)-3 [6.4] | (B)-2 [2.0] | (D)-1 [0.30] | (E)-1 [0.48] | (S)-6 [10] | (S)-4 [3200] |
| Example 14 | (A)-2 [100] | (B)-3 [8.3] | (B)-2 [2.0] | (D)-1 [0.66] | (E)-1 [1.05] | (S)-6 [10] | (S)-4 [3200] |
| Example 15 | (A)-2 [100] | (B)-4 [7.5] | (B)-2 [2.0] | (D)-1 [0.42] | (E)-1 [0.67] | (S)-6 [10] | (S)-4 [3200] |

[Resist Pattern Formation-2]

Using the resist compositions of Examples 6 and 7 and Comparative Example 3, LS patterns were formed with a line width of 50 nm and a pitch of 100 nm in the same manner as the above [Resist Pattern Formation-1].

The sensitivity for forming a LS pattern with a line width of 50 nm above was set as an optimum exposure "Eop" (mJ/cm$^2$). Eop of each positive resist composition is shown in Table 10.

[Evaluation of Depth of Focus (DOF)]

DOF was evaluated in the same manner as Examples 1 to 5 and Comparative Examples 1 and 2. The results are shown in Table 10.

[Evaluation of LER (Line Edge Roughness)]

In the LS patterns formed using the above Eop, line widths were measured at 10 locations using a length measuring SEM (scanning electron microscope; acceleration voltage: 800V; product name: "S-9220"; manufactured by Hitachi, Ltd.). From the results, 3-fold value (3s) of standard deviation (s) was calculated as an indicator of the LER. The results are shown in Table 10. The smaller this 3s value becomes, the lower the level of roughness in the line width, indicating a LS pattern with a more uniform width.

(A)-5: the polymeric compound 5 (here, l/m/n/o/p=36.5/22.5/19.5/13.5/8.0).

(A)-6: the polymeric compound 6 (here, l/m/n/o/p=34.4/20.1/21.8/13.6/10.1).

(B)-3: the compound (B)-3 represented by the formula (B)-3 shown below.

[Chemical Formula 74]

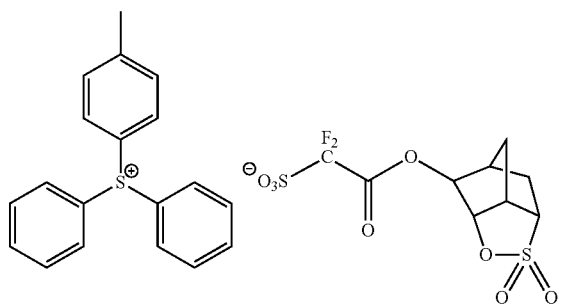

(B)-3

(B)-4: the compound (B)-4 represented by the formula (B)-4 shown below.

[Chemical Formula 75]

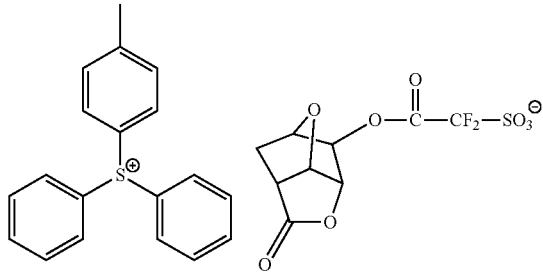

(B)-4

<Lithography Properties Evaluation-2>
[Resist Pattern Formation-3]

An organic anti-reflection film composition (product name: ARC95, manufactured by Brewer Science Ltd.) was applied onto an 12-inch silicon wafer using a spinner, and the composition was then baked on a hotplate at 205° C. for 60 seconds, thereby forming an organic anti-reflection film having a film thickness of 90 nm. Then, the positive resist composition of each of Examples 8 to 15 was applied onto the anti-reflection film using a spinner, and was then prebaked (PAB) on a hotplate at 105° C. for 60 seconds and dried, thereby forming a resist film having a film thickness of 90 nm.

Subsequently, a coating solution for forming a protection film (product name: TILC-057; manufactured by Tokyo Ohka Kogyo Co., Ltd.) was applied onto the resist film using a spinner, and then heated at 90° C. for 60 seconds, thereby forming a top coat with a film thickness of 35 nm.

Then, the resist film having a top coat formed thereon was selectively irradiated with an ArF excimer laser (193 nm) through a mask pattern, using an ArF immersion exposure apparatus NSR-S609B (manufactured by Nikon Corporation, NA (numerical aperture)=1.07, σ Di-pole 35 (0.78/0.97)).

Then, a post-exposure bake (PEB) treatment was conducted at 95° C. for 60 seconds, followed by development for 10 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist film was rinsed for 15 seconds with pure water, followed by drying by shaking.

As a result, in each of the examples, a line and space pattern (hereinafter, referred to as "LS pattern") was formed with a line width of 50 nm and a pitch of 100 nm on the resist film.

The sensitivity for forming a LS pattern with a line width of 50 nm above was set as an optimum exposure "Eop" (mJ/cm$^2$). Eop of each positive resist composition is shown in Table 12.

[Evaluation of LER (Line Edge Roughness)]

3σ for the LS pattern thus obtained was determined in the manner as described above (measure points: 10). As a result, it was confirmed that all of the Examples had satisfactory values.

TABLE 12

| | Eop (mJ/cm$^2$) | LER (nm) |
|---|---|---|
| Example 8 | 35.9 | 3.14 |
| Example 9 | 35.1 | 3.33 |
| Example 10 | 35.7 | 3.20 |
| Example 11 | 36.5 | 3.02 |

TABLE 12-continued

| | Eop (mJ/cm$^2$) | LER (nm) |
|---|---|---|
| Example 12 | 27.0 | 2.77 |
| Example 13 | 29.2 | 3.03 |
| Example 14 | 26.4 | 2.85 |
| Example 15 | 27.1 | 2.53 |

From the results shown in Table 1, it is understood that the base component in the resist composition of the present invention can favorably be dissolved in cyclohexanone and anisole.

From the results shown in Table 2, the amount of the solvent remaining in the resist film can be controlled by adjusting the composition of the organic solvent within the resist composition of the present invention. Also, from the results shown in Table 2, it is understood that the acid diffusion can be controlled by adjusting the composition of the organic solvent, as well as by adjusting the composition of the resist base component and/or the acid generator component.

From the results shown in Table 6, it is understood that the positive resist compositions of Examples 1 to 3 and the positive resist compositions of Examples 4 to 5 of the present invention have a larger value of the 5% EL margin and a larger value of the depth of focus (DOF), when compared with the positive resist composition of Comparative Example 1 and the positive resist composition of Comparative Example 2, respectively. Therefore, it is understood that the positive resist composition of the present invention excels in both of EL margin and DOF.

From the results shown in Table 7, it is understood that, when compared with the positive resist composition of Comparative Example 1, the positive resist compositions of Example 1 to 3 of the present invention have a smaller level of roughness, and thus excel in the uniformity of the target size.

From the results shown in Table 8, it is understood that, when compared with the positive resist composition of Comparative Example 2, the positive resist compositions of Examples 4 and 5 of the present invention have a smaller value of the critical resolution, and thus can form a finer pattern.

From the results shown in Table 9, it is understood that, when compared with the positive resist composition of Comparative Example 2, the positive resist compositions of Examples 4 and 5 of the present invention have a lesser degree of the pattern collapse.

From the results shown in Table 10, it is understood that, when compared with the positive resist composition of Comparative Example 3, the positive resist compositions of Examples 6 and 7 of the present invention can form a LS pattern with a more uniform width. Also, it is understood that, when compared with the positive resist composition of Comparative Example 3, the positive resist compositions of Examples 6 and 7 of the present invention has a larger value of the depth of focus (DOF), and thus excels in DOF.

From the results shown in Table 12, it is understood that the positive resist compositions of Examples 8 to 15 of the present invention have a smaller level of roughness, and thus excel in the uniformity of the target size.

As is clear from these results, the positive resist composition of the present invention excels in the solubility property of the base component, and also has excellent lithography properties such as resolution, EL margin, depth of focus (DOF), a reduced level of line edge roughness (LER), and resistance to pattern collapse.

Resist Composition Preparation-3

Examples 16 to 18 and Comparative Example 4

The components shown in Table 13 were mixed and dissolved to obtain positive resist compositions of Examples 16 to 18 and Comparative Example 4.

TABLE 13

| | Component (A) | Component (B) | | Component (D) | Component (E) | Component (S) |
|---|---|---|---|---|---|---|
| Comparative Example 4 | (A)-10 [100] | (B)-1 [6.7] | (B)-2 [2.6] | (D)-1 [0.15] | (E)-1 [0.24] | (S)-1 [2900] |
| Example 16 | (A)-9 [100] | (B)-1 [6.7] | (B)-2 [2.6] | (D)-1 [0.15] | (E)-1 [0.24] | (S)-1 [2900] |
| Example 17 | (A)-8 [100] | (B)-1 [6.7] | (B)-2 [2.6] | (D)-1 [0.15] | (E)-1 [0.24] | (S)-1 [2900] |
| Example 18 | (A)-7 [100] | (B)-1 [6.7] | (B)-2 [2.6] | (D)-1 [0.15] | (E)-1 [0.24] | (S)-1 [2900] |

In Table 13, each of the abbreviations indicates the following. Also, the values within the brackets [ ] indicate blending amount (parts by weight).

(A)-7: the polymeric compound 7 synthesized in the same manner as the above [Polymer Synthesis Example 4] (here, l/m/n/o/p=35/25/20/12.5/7.5 (molar ratio)).

With respect to the polymeric compound 7, the weight average molecular weight (Mw) (the polystyrene equivalent value determined by gel permeation chromatography (GPC)) was 7,000, and the dispersity (Mw/Mn) was 1.8.

(A)-8: the polymeric compound 8 synthesized in the same manner as the above [Polymer Synthesis Example 1] (here, l/m/n/o/p=36/21/18/13/12 (molar ratio)).

With respect to the polymeric compound 8, the weight average molecular weight (Mw) (the polystyrene equivalent value determined by gel permeation chromatography (GPC)) was 7,000, and the dispersity (Mw/Mn) was 1.8.

(A)-9: the polymeric compound 9 (here, l/m/n/o/p=30/25/25/10/10 (molar ratio)) synthesized in the same manner as the above [Polymer Synthesis Example 4], except that 1-ethyl-1-cyclohexylmethacrylate of the above molar ratio was used instead of the compound (7). The structure of the polymeric compound 9 is shown below.

With respect to the polymeric compound 9, the weight average molecular weight (Mw) (the polystyrene equivalent value determined by gel permeation chromatography (GPC)) was 8,000, and the dispersity (Mw/Mn) was 1.8.

[Chemical Formula 76]

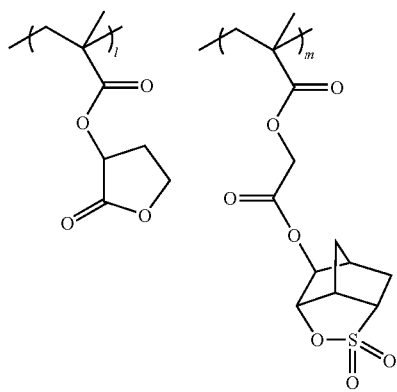

-continued

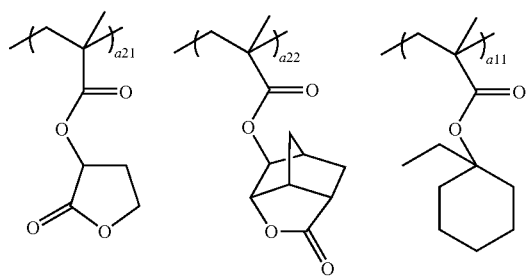

(A)-10: the polymer compound 10 represented by the formula shown below. Mw=8,000. Mw/Mn=1.8. In the formula, the values attached at the bottom right of the brackets ( ) denote a21/a22/a11/a12/a3=30/25/25/10/10, each of which means the proportion of each structural unit (mol %).

[Chemical Formula 77]

(B)-1: the compound (B)-1 represented by the formula (B)-1 shown below.

(B)-2: the compound (B)-2 represented by the formula (B)-2 shown below.

[Chemical Formula 78]

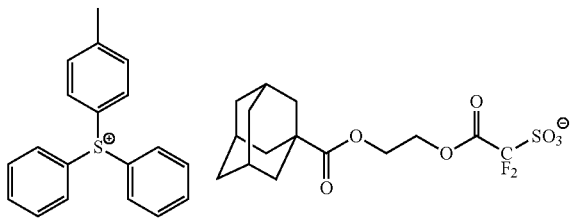

(B)-1

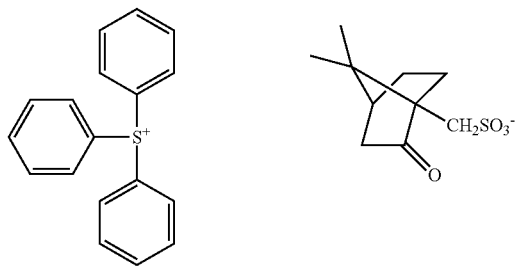

(B)-2

(D)-1: tri-n-pentylamine.
(E)-1: salicylic acid.
(S)-1: a mixed solvent of PGMEA/PGME/CH=45/30/25 (mass ratio).

<Lithography Properties Evaluation-3>

Resist patterns were formed according to the following procedure using the resist composition thus obtained, and lithography properties were evaluated.

[Resist Pattern Formation-4]

An organic anti-reflection film composition (product name: ARC95, manufactured by Brewer Science Ltd.) was applied onto an 12-inch silicon wafer using a spinner, and the composition was then baked on a hotplate at 205° C. for 60 seconds, thereby forming an organic anti-reflection film having a film thickness of 90 nm.

Then, each of the positive resist compositions of Examples 16 to 18 and Comparative Example 4 obtained above was applied onto the organic anti-reflection film using a spinner, and was then prebaked (PAB) on a hotplate at 110° C. for 60 seconds and dried, thereby forming a resist film having a film thickness of 90 nm.

Subsequently, a coating solution for forming a protection film (product name: TILC-057; manufactured by Tokyo Ohka Kogyo Co., Ltd.) was applied onto the resist film using a spinner, and then heated at 90° C. for 60 seconds, thereby forming a top coat with a film thickness of 35 nm.

Then, the resist film having a top coat fanned thereon was selectively irradiated with an ArF excimer laser (193 nm) through a mask pattern, using an ArF immersion exposure apparatus NSR-S609B (manufactured by Nikon Corporation, NA (numerical aperture)=1.07, σ0.97).

Thereafter, a post-exposure baking (PEB) treatment was conducted at 95° C. for 60 seconds, followed by a developing treatment for 30 seconds at 23° C. in a 2.38% by weight aqueous solution of tetramethylammonium hydroxide (TMAH) (product name: "NMD-3", manufactured by Tokyo Ohka Kogyo Co., Ltd.). Then, the resist film was rinsed with pure water for 25 seconds, and dried by shaking.

As a result, in each of the examples, a line and space pattern (hereinafter, referred to as "LS pattern") was formed with a line width of 50 nm and a pitch of 100 nm on the resist film.

Here, an optimum exposure "Eop" (mJ/cm$^2$; sensitivity) for forming the LS pattern was determined. The results are shown in Table 14.

[Evaluation of Exposure Margin (EL Margin)]

The exposure dose when the LS pattern was formed with a line width within the range of ±5% (that is, 47.5 to 52.5 nm) of the target size (line width: 50 nm) was determined, and then EL margin (unit: %) was determined according to the following formula. The results are shown in Table 14.

EL margin (%)=(|E1−E2|/Eop)×100

(wherein, E1 represents an exposure dose (mJ/cm$^2$) when a LS pattern with a line width of 47.5 nm was formed, and E2 represents an exposure dose (mJ/cm$^2$) when a LS pattern with a line width of 52.5 nm was formed.)

Here, EL margin indicates that, the larger the value of EL margin, the smaller the variation in the pattern size depending on the change in the exposure dose.

[Evaluation of Line Width Roughness (LWR)]

In the LS pattern with a line width of 50 nm and a pitch of 100 nm formed by using the above Eop, the line width was measured at 5 locations along the line direction using a measuring SEM (scanning electron microscope, product name: S-9220, manufactured by Hitachi, Ltd.), and the results of these measurements were used to calculate a value (namely, 3s) of 3 times the standard deviation (s), which was used as an indicator of the LWR. The results are shown in Table 14.

The smaller this 3s value becomes, the lower the level of roughness in the line width, indicating a LS pattern with a more uniform width.

[Evaluation of Depth of Focus (DOF)]

Using the above Eop, the focus was appropriately shifted up and down, and the depth of focus (DOF) (unit: nm) at which the above LS pattern can be formed within the range where the variation in the target size (50 nm) was ±10% (i.e., 45 to 55 nm) was determined. The results are shown in Table 14.

TABLE 14

| LS | Eop (mJ/cm$^2$) | EL margin (%) | LWR (nm) | DOF (nm) |
|---|---|---|---|---|
| Comparative Example 4 | 30.1 | 8.0 | 5.7 | 250 |
| Example 16 | 32.0 | 8.3 | 5.4 | 300 |
| Example 17 | 27.4 | 8.3 | 5.3 | 300 |
| Example 18 | 25.4 | 8.1 | 5.5 | 300 |

From the results shown in Table 14, it was confirmed that the positive resist compositions of Examples 16 to 18 had EL margin equal to or larger than the positive resist composition of Comparative Example 4, and excelled in the levels of LWR and DOF as compared with the positive resist composition of Comparative Example 4.

[Pattern Collapse Resistance]

With respect to the positive resist composition of each example, the resistance to LS pattern collapse was observed while changing the DOF at an exposure dose higher than the above Eop. The resistance was evaluated according to the following criteria. The results are shown in Table 15.

Evaluation Criteria:
A: No pattern collapse was observed although there were partially-defective patterns.
B: A part of the patterns collapsed and disappeared.
C: A part of the patterns collapsed and disappeared, and many patterns were partially defective.

Here, the higher the exposure dose, the more the exposure dose becomes a forcing condition in the evaluation of pattern collapse.

Also, the minus side of DOF becomes a more forcing condition in the evaluation of pattern collapse than the plus side of DOF.

TABLE 15

|  | Plus side of DOF | Minus side of DOF |
|---|---|---|
| Comparative Example 4 | C | C |
| Example 16 | A | B |
| Example 17 | A | B |
| Example 18 | B | B |

From the results shown in Table 15, it was confirmed that the pattern collapse is less likely caused in the positive resist compositions of Examples 16 to 18 as compared with the positive resist composition of Comparative Example 4, and thus the positive resist compositions of Examples 16 to 18 excelled in the resistance to pattern collapse.

Resist Composition Preparation-4

Example 19 and Comparative Example 5

The components shown in Table 16 were mixed and dissolved to obtain positive resist compositions of Example 19 and Comparative Example 5.

TABLE 16

|  | Component (A) | Component (B) |  | Component (E) | Component (S) | Eop (mJ/cm$^2$) |
|---|---|---|---|---|---|---|
| Example 19 | (A)-11 [100] | (B)-5 [10] | (B)-2 [0.65] | (E)-1 [0.2] | (S)-7 [2900] | 30.1 |
| Comparative Example 5 | (A)-11 [100] | (B)-5 [10] | (B)-2 [0.65] | (E)-1 [0.2] | (S)-3 [2900] | 31.1 |

In Table 16, each of the abbreviations indicates the following. Also, the values within the brackets [ ] indicate blending amount (parts by weight).

(A)-11: the polymeric compound 11 (l/m/n/o=45/40/5/10 (molar ratio)) synthesized in the same manner as the above Polymer Synthesis Examples 1 to 6, except that the monomer which correspond with each of the structural units and the molar ratio were changed. The structure of the polymeric compound 11 is shown below With respect to the polymeric compound 11, the weight average molecular weight (Mw) (the polystyrene equivalent value determined by gel permeation chromatography (GPC)) was 8,000, and the dispersity (Mw/Mn) was 1.75.

[Chemical Formula 79]

polymeric compund 11

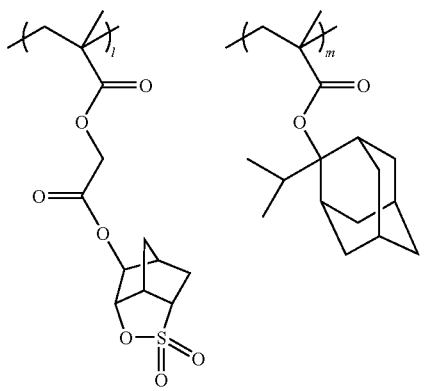
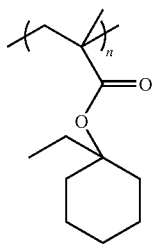
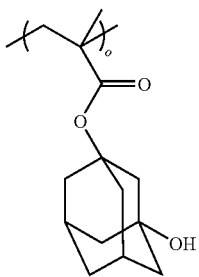

(B)-2: the compound (B)-2 represented by the formula (B)-2 shown below.

(B)-5: the compound (B)-5 represented by the formula (B)-5 shown below. Here, (B)-5 is a compound synthesized according to [Compound Synthesis Example 4] described below.

[Chemical Formula 80]

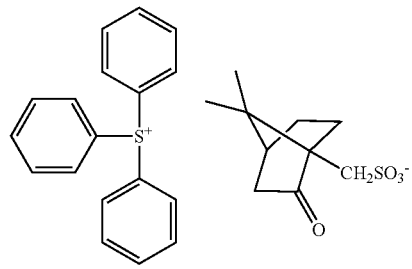

(B)-2

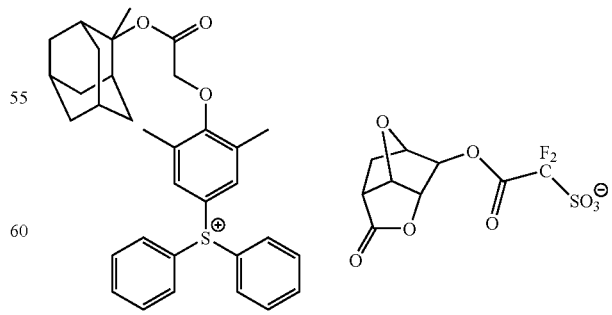

(B)-5

(E)-1: salicylic acid.
(S)-3: a mixed solvent of PGMEA/PGME=60/40 (mass ratio).

(S)-7: a mixed solvent of PGMEA/CH=90/10 (mass ratio).
<Lithography Properties Evaluation-4>

Using the resist composition obtained above, the resist pattern was formed in the following procedure. Then, the following evaluations were conducted.
[Resist Pattern Formation-5]

An organic anti-reflection film composition (product name: ARC29A, manufactured by Brewer Science Ltd.) was applied onto an 12-inch silicon wafer using a spinner, and the composition was then baked at 205° C. for 60 seconds and dried, thereby forming an organic anti-reflection film having a film thickness of 89 nm.

Then, each of the positive resist compositions of Example 19 and Comparative Example 5 was applied onto the anti-reflection film using a spinner, and was then prebaked (PAB) on a hotplate at 90° C. for 60 seconds and dried, thereby forming a resist film having a film thickness of 100 nm.

Subsequently, a coating solution for forming a protection film (product name: TILC-075; manufactured by Tokyo Ohka Kogyo Co., Ltd.) was applied onto the resist film using a spinner, and then heated at 90° C. for 60 seconds, thereby forming a top coat with a film thickness of 35 nm.

Then, the resist film having a top coat formed thereon was selectively irradiated with an ArF excimer laser (193 nm) through a hole pattern mask, using an ArF immersion exposure apparatus NSR-S609B (manufactured by Nikon Corporation, NA (numerical aperture)=1.07, σ0.97).

Thereafter, a post-exposure baking (PEB) treatment was conducted at 85° C. for 60 seconds, followed by a developing treatment for 30 seconds at 23° C. in a 2.38% by weight aqueous solution of tetramethylammonium hydroxide (TMAH) (product name: "NMD-3", manufactured by Tokyo Ohka Kogyo Co., Ltd.). Then, the resist film was rinsed with pure water for 25 seconds, and dried by shaking.

As a result, in each of the examples, a contact hole pattern (hereinafter, referred to as "CH pattern") in which holes having a hole diameter of 80 nm were equally spaced (pitch: 140 nm) was formed on the resist film.
[Sensitivity]

Here, an optimum exposure "Eop" (mJ/cm$^2$; sensitivity) for forming the CH pattern was determined. The results are shown in Table 16.
[Evaluation of DOF and EL Margin (Evaluation of Process Window)]

The depth of focus (DOF) of each resist composition was determined while changing the exposure dose at regular intervals. Specifically, the steps of forming a pattern with an exposed dose while changing depth of focus at regular intervals, and then determining the depth of focus at which a pattern could be formed within a definite range of sizes were conducted using each of various exposure doses (accordingly, a matrix data of "x-direction: exposure dose/y-direction: depth of focus/cell: pattern size formed" can be obtained).

Then, based on the obtained matrix data, a graph with the EL margin (unit: %) on the longitudinal axis and the DOF (unit: μm) on the abscissa axis was created by a process window analysis method using PropATA software (manufactured by FINLE Technologies, Inc.). This method makes it possible to standardize the DOF (or the EL margin) when a specific EL margin (or DOF) is obtained, thereby enabling the clear assessment of the comparison of properties between resist samples.

The graph which shows the relationship between the EL margin and the DOF in the CH pattern is shown in FIG. 1.

As a result, it was confirmed that the resist composition of Example 19 had a larger value of EL margin relative to DOF (that is, the area under the curve on the graph is larger), when compared with the resist composition of Comparative Example 5, and thus the process window of the resist composition of Example 19 was large and excellent.

Compound Synthesis Example 4

Synthesis of Compound (B)-5

(i) Phosphorus oxide (8.53 g), 2,6-dimethylphenol (8.81 g) and diphenylsulfoxide (12.2 g) were added to methanesulfonic acid (60.75 g) controlled to 20° C. or lower in small amounts. While the temperature was controlled at 15° C. to 20° C., the resulting solution was matured for 30 minutes. Then, the temperature was raised up to 40° C., and the solution was matured for 2 hours. Thereafter, the reaction solution was dropwise added to 109.35 g of pure water cooled at 15° C. or lower. After the dropwise addition, 54.68 g of dichloromethane was added to the solution. Then, the resulting solution was stirred, and the dichloromethane phase was collected. 386.86 g of hexane at 20° C. to 25° C. was prepared in another container, and the dichloromethane phase collected above was dropwise added thereto. After the dropwise addition, the solution was matured for 30 minutes at 20 to 25° C., and then filtration was conducted, thereby obtaining the compound (16) shown below (yield: 70.9%).
[Chemical Formula 81]

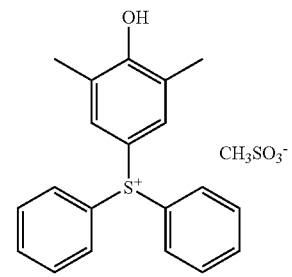

(16)

(ii) Subsequently, 4 g of the compound (16) shown above was dissolved in 79.8 g of dichloromethane. After the compound (16) was dissolved, 6.87 g of potassium carbonate was added thereto, and then 3.42 g of 2-methyl-2-adamantyl bromoacetate was added thereto. The resultant was reacted for 24 hours while refluxing. Subsequently, the resultant was filtrated and washed with water, and then crystallized with hexane. The powder thus obtained was dried under diminished pressure, thereby obtaining 3.98 g of the compound (17) shown below (yield: 66%).
[Chemical Formula 82]

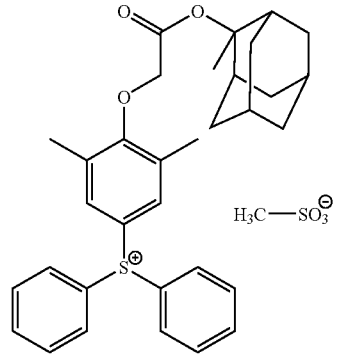

(17)

(iii) 1.79 g of the compound (17) was dissolved in a mixed solution of 15.81 g of water and 31.62 g of dichloromethane. Then, 1.33 g of the compound (III) was added thereto in small amounts, and stirred for 1 hour at 25° C. After the reaction was finished, the above dichloromethane solution was washed with water, and then concentrated to dryness. The powder thus obtained was dispersively washed with hexane, and then it was dried under reduced pressure, thereby obtaining 2.35 g of the compound (B)-5 (yield: 83.3%).

[Chemical Formula 83]

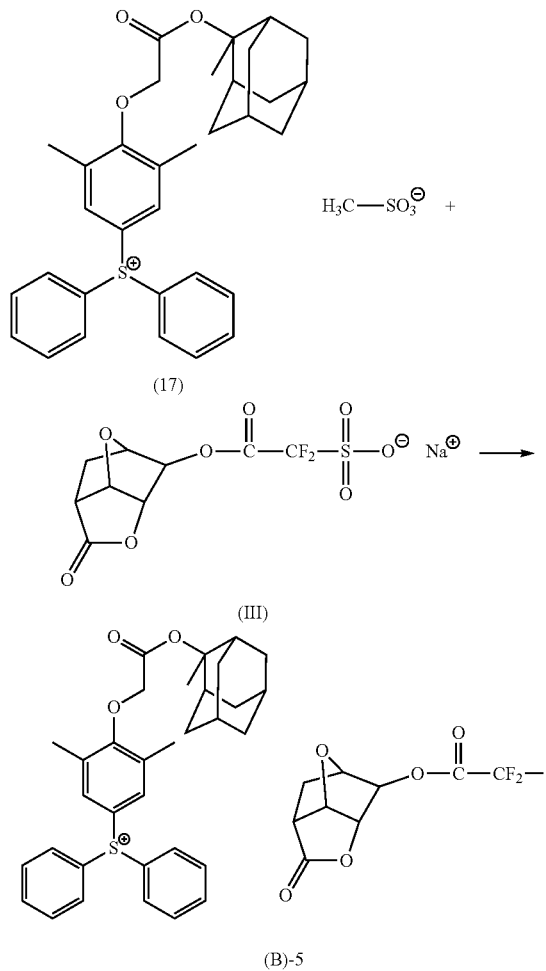

The invention claimed is:

1. A resist composition comprising: a base component (A) which exhibits changed solubility in an alkali developing solution under action of an acid; an acid generator component (B) which generates an acid upon exposure; and an organic solvent (S), wherein
the base component (A) comprises a polymeric compound (A1) which contains a structural unit (a0) represented by the general formula (a0-1) shown below:
[Chemical Formula 1]

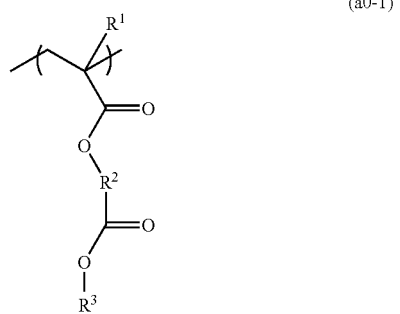

(in the formula, $R^1$ represents a hydrogen atom, an alkyl group of 1 to 5 carbon atoms, or a halogenated alkyl group of 1 to 5 carbon atoms; $R^2$ represents a bivalent linking group; and $R^3$ represents a cyclic group which has —$SO_2$— within the ring skeleton), and
the organic solvent (S) comprises a cyclic ketone having a 5 to 7-membered ring, an ether represented by the general formula (S-1) shown below, or a mixture of the cyclic ketone having 5 to 7-membered ring and the ether represented by the general formula (S-1):
[Chemical Formula 2]

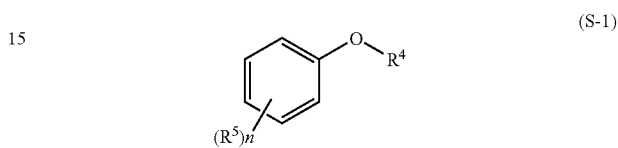

(in the formula, $R^4$ represents an alkyl group of 1 to 5 carbon atoms; $R^5$ represents an alkyl group of 1 to 3 carbon atoms; and n represents an integer of 0 to 2).

2. The resist composition according to claim 1, wherein the 5 to 7-membered ring is a saturated ring.

3. The resist composition according to claim 1, wherein the proportion of said cyclic ketone, said ether, or the mixture of said cyclic ketone and said ether in the organic solvent (S) is 1 to 80% by weight.

4. The resist composition according to claim 1, wherein $R^3$ is a cyclic group containing —O—$SO_2$— within the ring skeleton.

5. The resist composition according to claim 4, wherein said $R^3$ is a cyclic group represented by the general formula (3-1) shown below:
[Chemical Formula 3]

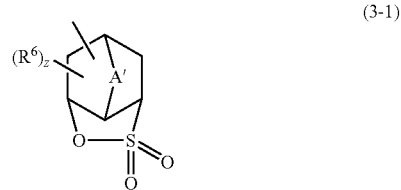

(in the formula, A' represents an oxygen atom, a sulfur atom, or an alkylene group of 1 to 5 carbon atoms which may contain an oxygen atom or a sulfur atom; z represents an integer of 0 to 2; $R^6$ represents an alkyl group, an alkoxy group, a halogenated alkyl group, a hydroxyl group, —COOR", —OC(=O)R", a hydroxyalkyl group or a cyano group; and R" represents a hydrogen atom or an alkyl group).

6. The resist composition according to claim 1, wherein the base component (A) is a base component which exhibits increased solubility in an alkali developing solution under action of an acid, and the polymeric compound (A1) further comprises a structural unit (a1) derived from an acrylate ester which has an acid dissociable, dissolution inhibiting group.

7. The resist composition according to claim 6, wherein the polymeric compound (A1) comprises at least two kinds of the structural units as the structural unit (a1).

8. The resist composition according to claim 6, wherein the polymeric compound (A1) comprises, as the structural unit (a1), at least one kind selected from the group consisting of structural units represented by the general formulae (a1-0-11), (a1-0-12) and (a1-0-2) shown below:

[Chemical Formula 4]

(a1-0-11)
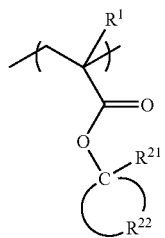

(a1-0-12)
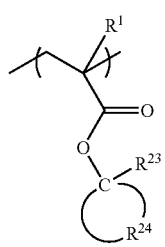

(a1-0-2)
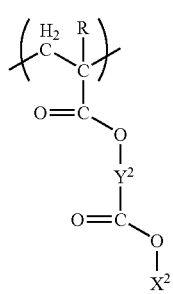

(in the above formulae, R represents a hydrogen atom, a alkyl group of 1 to 5 carbon atoms, or a halogenated alkyl group of 1 to 5 carbon atoms; $R^{21}$ represents an alkyl group; $R^{22}$ represents a group which forms an aliphatic monocyclic group together with the carbon atom to which $R^{22}$ is bonded; $R^{23}$ represents a branched alkyl group; $R^{24}$ represents a group which forms an aliphatic polycyclic group together with the carbon atom to which $R^{24}$ is bonded; $Y^2$ represents a bivalent linking group; and $X^2$ represents an acid dissociable, dissolution inhibiting group).

9. The resist composition according to claim 6, wherein the polymeric compound (A1) further comprises a structural unit (a2) derived from an acrylate ester which has a lactone-containing cyclic group.

10. The resist composition according to claim 6 or 9, wherein the polymeric compound (A1) further comprises a structural unit (a3) derived from an acrylate ester which has a polar group-containing aliphatic hydrocarbon group.

11. The resist composition according to claim 1, further comprising a nitrogen-containing organic compound (D).

12. A method of forming a resist pattern, comprising: forming a resist film on a substrate using the resist composition of claim 1; exposing the resist film; and alkali-developing the resist film to form a resist pattern.

* * * * *

UNITED STATES PATENT AND TRADEMARK OFFICE
CERTIFICATE OF CORRECTION

PATENT NO. : 8,257,904 B2
APPLICATION NO. : 12/615924
DATED : September 4, 2012
INVENTOR(S) : Naoto Motoike et al.

It is certified that error appears in the above-identified patent and that said Letters Patent is hereby corrected as shown below:

In Column 8, Line 10, After "-C(=O)-," insert -- -O-C(=O)-O-,--.

In Column 17, Line 41, Change "atom" to --atom (=O).--.

In Column 21, Line 62, Change "adamantine," to --adamantane--.

In Column 24, Lines 30-39,

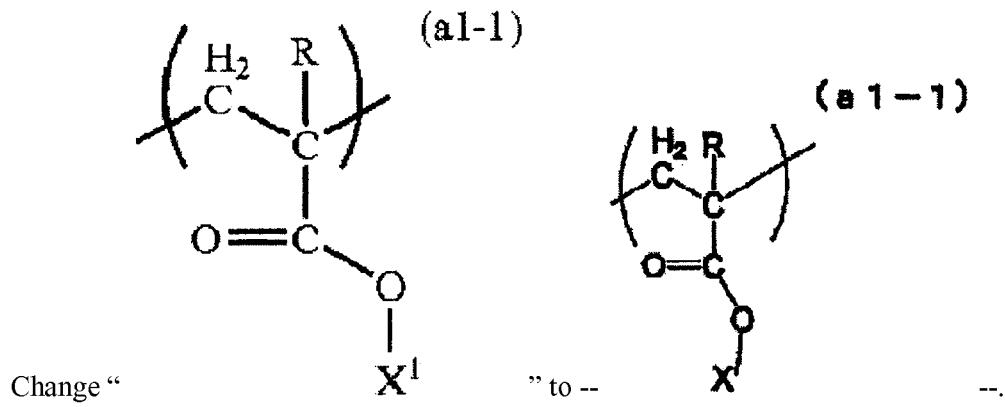

Change " " to -- --.

In Column 59, Line 41 (Approx.), After "group;" insert --R'--.

In Column 76, Line 48 (Approx.), Change "norbonyl" to --norbornyl--.

In Column 76, Line 48 (Approx.), Change "norbonyl" to --norbornyl--.

In Column 86, Line 63, Change "include" to --include:--.

In Column 88, Line 43, Change "substitutent" to --substituent--.

In Column 89, Line 36, Change "monocycle" to --monocyclic--.

Signed and Sealed this
Nineteenth Day of February, 2013

Teresa Stanek Rea
*Acting Director of the United States Patent and Trademark Office*

CERTIFICATE OF CORRECTION (continued)
U.S. Pat. No. 8,257,904 B2

In Column 91, Line 9, Change "substitutents." to --substituents.--.

In Column 91, Line 20, Change "substitutents" to --substituents--.

In Column 91, Line 23, Change "substitutent." to --substituent.--.

In Column 93, Line 29 (Approx.), Change "camphar" to --camphor--.

In Column 98, Line 67, Change "(methylsulfonyloxylmino)" to --(methylsulfonyloxyimino)--.

In Column 99, Line 7, Change "ethylacietonitrile," to --ethylacetonitrile,--.

In Column 101, Line 51, Change "phosphoric" to --phosphonic--.

In Column 102, Line 20, Change "α-hydroxyalkylacrylic," to --α-(hydroxyalkyl)acrylic,--.

In Column 103, Line 15, After "1-isopropyl-2-methoxybenzene," insert --1-isopropyl-3-methoxybenzene,--.

In Column 106, Line 65, Change "$H^{rc,d}$)," to --$H^{c,d}$),--.

In Column 112, Line 26, Change "dropwide" to --dropwise--.

In Column 113, Line 63, Change "$H^e$)," to --$H^c$),--.

In Column 115, Line 15, Change "Ha, Hb)," to --$H^a$, $H^b$),--.

In Column 115, Line 15, Change "He)," to --$H^c$),--.

In Column 115, Line 15, Change "Hd)," to --$H^d$),--.

In Column 115, Line 16, Change "He)," to --$H^e$),--.

In Column 115, Line 16, Change "Hf)," to --$H^f$),--.

In Column 115, Line 16, Change "Hg)." to --$H^g$).--.

In Column 118, Line 45, Change "Ha+Hb)," to --$H^a$+$H^b$),--.

In Column 118, Line 45, Change "Hd)," to --$H^d$),--.

In Column 118, Line 45, Change "He)," to --$H^e$),--.

In Column 118, Line 46, Change "Hf)," to --$H^f$),--.

CERTIFICATE OF CORRECTION (continued)
U.S. Pat. No. 8,257,904 B2

In Column 118, Line 46, Change "Hg)," to --$H^g$),--.

In Column 118, Line 46, Change "Hc)," to --$H^c$),--.

In Column 118, Line 47, Change "Hh)." to --$H^h$).--.

In Column 120, Line 9, Change "amil" to --amile--.

In Column 131, Line 53, Change "fanned" to --formed--.

In Column 133, Line 46, Change "below" to --below.--.

In Column 135, Line 57, Change "PropATA" to --ProDATA--.